(12) United States Patent
Snaith et al.

(10) Patent No.: US 11,258,024 B2
(45) Date of Patent: Feb. 22, 2022

(54) OPTOELECTRONIC DEVICES WITH ORGANOMETAL PEROVSKITES WITH MIXED ANIONS

(71) Applicant: OXFORD UNIVERSITY INNOVATION LIMITED, Oxford (GB)

(72) Inventors: Henry Snaith, Oxfordshire (GB); Michael Lee, Oxfordshire (GB); Takuro Murakami, Yokohama (JP)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 0 days.

(21) Appl. No.: 15/824,089

(22) Filed: Nov. 28, 2017

(65) Prior Publication Data

US 2018/0083213 A1 Mar. 22, 2018

Related U.S. Application Data

(63) Continuation of application No. 14/401,423, filed as application No. PCT/GB2013/051306 on May 20, 2013, now Pat. No. 11,038,132.

(30) Foreign Application Priority Data

May 18, 2012 (GB) .................................... 1208793

(51) Int. Cl.
*H01L 51/42* (2006.01)
*H01L 51/00* (2006.01)
(Continued)

(52) U.S. Cl.
CPC ........ *H01L 51/4213* (2013.01); *C07F 7/2284* (2013.01); *C07F 7/24* (2013.01);
(Continued)

(58) Field of Classification Search
CPC ... H01L 51/4213; H01L 51/4253; H01G 9/20; H01G 9/2027; H01G 9/2031; Y02E 10/549
See application file for complete search history.

(56) References Cited

U.S. PATENT DOCUMENTS

| 5,550,391 A | 8/1996 | Yamaguchi |
| 5,721,634 A | 2/1998 | Rosker |

(Continued)

FOREIGN PATENT DOCUMENTS

| CN | 1280394 | 1/2001 |
| CN | 101635203 | 9/2011 |

(Continued)

OTHER PUBLICATIONS

Lee et al., "Pressure-induced phase transitions and templating effect in three-dimensional organic-inorganic hybrid perovskites", 2003, Physical Review B 68, All Pages. (Year: 2003).*
(Continued)

*Primary Examiner* — Daniel P Malley, Jr.
(74) *Attorney, Agent, or Firm* — King & Spalding LLP

(57) ABSTRACT

The invention provides an optoelectronic device comprising a mixed-anion perovskite, wherein the mixed-anion perovskite comprises two or more different anions selected from halide anions and chalcogenide anions. The invention further provides a mixed-halide perovskite of the formula (I) [A][B][X]$_3$ wherein: [A] is at least one organic cation; [B] is at least one divalent metal cation; and [X] is said two or more different halide anions. In another aspect, the invention provides the use of a mixed-anion perovskite as a sensitizer in an optoelectronic device, wherein the mixed-anion perovskite comprises two or more different anions selected from halide anions and chalcogenide anions. The invention also provides a photosensitizing material for an optoelectronic device comprising a mixed-anion perovskite wherein
(Continued)

the mixed-anion perovskite comprises two or more different anions selected from halide anions and chalcogenide anions.

14 Claims, 16 Drawing Sheets

(51) Int. Cl.
   *C07F 7/22* (2006.01)
   *C07F 7/24* (2006.01)
   *H01G 9/20* (2006.01)

(52) U.S. Cl.
   CPC ...... *H01L 51/0032* (2013.01); *H01L 51/0077* (2013.01); *H01L 51/4226* (2013.01); *H01G 9/2027* (2013.01); *H01G 9/2031* (2013.01); *H01L 51/0036* (2013.01); *H01L 2251/306* (2013.01); *Y02E 10/549* (2013.01); *Y02P 70/50* (2015.11)

(56) References Cited

U.S. PATENT DOCUMENTS

| | | | |
|---|---|---|---|
| 5,871,579 | A | 2/1999 | Liang et al. |
| 5,882,548 | A | 3/1999 | Liang |
| 6,097,040 | A | 8/2000 | Morimoto et al. |
| 6,150,536 | A | 11/2000 | Chondroudis et al. |
| 6,180,956 | B1 | 1/2001 | Chondroudis et al. |
| 6,281,429 | B1 | 8/2001 | Takada et al. |
| 6,384,321 | B1 | 5/2002 | Mikoshiba et al. |
| 6,429,318 | B1 | 8/2002 | Mitzi |
| 7,045,205 | B1 | 5/2006 | Sager |
| 7,511,298 | B2 | 3/2009 | Kawa et al. |
| 8,193,704 | B2 | 6/2012 | Takashima et al. |
| 9,059,418 | B2 | 6/2015 | Seok et al. |
| 10,079,320 | B2 | 9/2018 | Snaith et al. |
| 2003/0010971 | A1 | 1/2003 | Zhang |
| 2004/0178325 | A1 | 9/2004 | Forrest et al. |
| 2005/0236033 | A1 | 10/2005 | Lawandy |
| 2005/0263182 | A1 | 12/2005 | Morooka et al. |
| 2006/0032529 | A1 | 2/2006 | Rand et al. |
| 2006/0162767 | A1 | 7/2006 | Mascarenhas et al. |
| 2007/0007538 | A1 | 1/2007 | Ono et al. |
| 2007/0082227 | A1 | 4/2007 | Kobayashi et al. |
| 2007/0194311 | A1 | 8/2007 | Kojima et al. |
| 2008/0185037 | A1 | 8/2008 | Kim et al. |
| 2008/0202583 | A1 | 8/2008 | Lee |
| 2009/0032097 | A1 | 2/2009 | Bigioni et al. |
| 2009/0160320 | A1 | 6/2009 | Borner et al. |
| 2009/0242027 | A1 | 10/2009 | Inoue et al. |
| 2010/0200051 | A1 | 8/2010 | Triani et al. |
| 2010/0213440 | A1 | 8/2010 | Shieh et al. |
| 2010/0294350 | A1 | 11/2010 | Ko et al. |
| 2011/0011456 | A1 | 1/2011 | Han et al. |
| 2011/0089402 | A1 | 4/2011 | Qi |
| 2011/0226325 | A1 | 9/2011 | Morooka et al. |
| 2011/0277818 | A1 | 11/2011 | Shimura |
| 2011/0287939 | A1 | 11/2011 | Goyal |
| 2012/0017976 | A1 | 1/2012 | Nechache et al. |
| 2012/0048329 | A1 | 3/2012 | Manchanda |
| 2012/0091445 | A1 | 4/2012 | Jung et al. |
| 2013/0104969 | A1 | 5/2013 | Rappe et al. |
| 2013/0233377 | A1* | 9/2013 | Kanatzidis ......... G01N 21/6402 136/252 |
| 2013/0320836 | A1* | 12/2013 | Kanatzidis ........... C09K 11/661 313/483 |
| 2015/0034150 | A1 | 2/2015 | Snaith et al. |
| 2015/0200377 | A1 | 7/2015 | Etgar et al. |
| 2015/0228415 | A1 | 8/2015 | Seok et al. |

FOREIGN PATENT DOCUMENTS

| | | |
|---|---|---|
| CN | 102459506 | 5/2012 |
| CN | 102468413 | 5/2012 |
| EP | 1207556 | 5/2002 |
| EP | 1 724 838 | 11/2006 |
| EP | 2 898 553 | 11/2018 |
| GB | 2012/16605 | 9/2012 |
| GB | 2013/09409 | 5/2013 |
| JP | H07147428 | 6/1995 |
| JP | H10316685 | 12/1998 |
| JP | 1140854 | 2/1999 |
| JP | 2001055568 | 2/2001 |
| JP | 2002198551 | 7/2002 |
| JP | 2003149345 | 5/2003 |
| JP | 2004 134581 | 4/2004 |
| JP | 3 542 077 | 7/2004 |
| JP | 2005093485 | 4/2005 |
| JP | 2007 031178 | 2/2007 |
| JP | 2008-189947 | 8/2008 |
| JP | 2009-006548 | 1/2009 |
| JP | 2010 009786 | 1/2010 |
| JP | 2011 076791 | 4/2011 |
| JP | 2017193576 | 10/2017 |
| KR | 10-2003-0020854 | 3/2003 |
| KR | 10-2011-0076046 | 7/2011 |
| KR | 10-1172374 | 8/2012 |
| WO | WO 99/65085 | 12/1999 |
| WO | WO 02/082864 | 10/2002 |
| WO | WO 2006/034561 | 4/2006 |
| WO | WO 2009/066848 | 5/2009 |
| WO | WO 2010/118321 | 10/2010 |
| WO | WO 2011/030117 | 3/2011 |
| WO | 2011/071738 | 6/2011 |
| WO | WO 2011/064601 | 6/2011 |
| WO | WO 2011/110869 | 9/2011 |
| WO | WO 2012/073010 | 6/2012 |
| WO | WO 2013/126537 | 8/2013 |
| WO | WO 2013/171518 | 11/2013 |
| WO | WO 2013/171520 | 11/2013 |

OTHER PUBLICATIONS

Kitazawa et al., "Optical properties of Ch3Nh3PbX3 (X=halogen) and their mixed-halide crystals", 2002, Journal of Materials Science, 37, 2002, All Pages. (Year: 2002).*

Kojima et al., "Organometal Halide Perovskites as Visible-Light Sensitizers for Photovoltaic Cells", 2009, Journal of American Chemical Society, 131, All Pages. (Year: 2009).*

Borriello et al., "Ab initio investigation of hybrid organic-inorganic perovskites based on tin halides", 2008, Physical Review B, 77, 2008, All Pages. (Year: 2008).*

Yamada et al. "Tunable Perovskite Semiconductor CH3NH3SnX3 (X=Cl, Br, or I) Characterized by X-ray and DTA", Chemical Society of Japan, 84, All Pages. (Year: 2011).*

Kojima et al., "Organometal Halide Perovskites as Visible-Light Sensitizers for Photovoltaic Devices", Journal of the American Chemical Society, pp. 6050-6051, 2009. (Year: 2009).*

Hong et al., "Viability of Lead-Free Perovskites with Mixed Chalcogen and Halogen Anions for Photovoltaic Applications," The Journal of Physical Chemistry, 120, pp. 6435-6441, 2016.

Saparov et al., "Organic-Inorganic Perovskites: Structural Versatility for Functional Materials Design," Chemical Reviews, 116, pp. 4558-4596, 2016.

Oxford University Innovation Limited, Communication pursuant to Article 94(3) EPC for European Patent Application No. 15198085.1, dated Mar. 14, 2018, 6 pages.

Li et al., "New Organic-Inorganic Perovskite Materials With Different Optical Properties Modulated by Different Inorganic Sheets," Crystal Growth & Design, vol. 8, No. 6, 1990-1996, 2008.

Oxford University Innovation Limited, Extended European Search Report for European Patent Application No. 18155003.9, dated Mar. 27, 2018, 9 pages.

Aaron et al., "Device Characteristics of a 10.1% hydrazine-processed $Cu_2ZnSn(Se,S)_4$ Solar Cell," Progress in Photovoltaics: Research and Applications, 20, pp. 6-11, 2012.

Abrusci et al., "Facile Infiltration of Semiconducting Polymer into Mesoporous Electrodes for Hybrid Solar Cells," Energy Environ. Sci. 4, pp. 3051-3058, 2011.

(56) References Cited

OTHER PUBLICATIONS

Antila et al., "ALD Grown Aluminum Oxide Submonolayers in Dye-Sensitized Solar Cells: The Effect on Interfacial Electron Transfer and Performance," J. Phys. Chem. C, 115, pp. 16720-16729, 2011.
Bach et al., "Solid-State Dye-Sensitized Mesoporous $TiO_2$ Solar Cells with High Photon-to-Electron Conversion Efficiencies," Nature 395, pp. 583-585, 1998.
Bogush, et al., "Preparation of Monodisperse Silica Particles: Control of Size and Mass Fraction," Journal of Non-Crystalline Solids, 104, pp. 95-106, 1988.
Bordello et al., "Ab initio Investigation of Hybrid Organic-Inorganic Perovskites based on Tin Halides," Physical Review B, 77, pp. 235214-1 through 235214-9, 2008.
Brown et al., "Surface Energy Relay Between Cosensitized Molecules in Solid-State Dye-Sensitized Solar Cells," J. Phys. Chem. C, 115, pp. 23204-23208, 2011.
Burschka et al., "Tris(2-(1H-pyrazol-1-yl)pyridine)cobalt(III) as p-Type Dopant for Organic Semiconductors and Its Application in Highly Efficient Solid-State Dye-Sensitized Solar Cells," J. Am. Chem. Soc., 133 (45), pp. 18042-18045, 2011.
Chang et al., "Panchromatic Photon-Harvesting by Hole-Conducting Materials in Inorganic-Organic Heterojunction Sensitized-Solar Cell Through the Formation of Nanostructured Electron Channels," Nano Lett. 12, pp. 1863-1867 2012.
Cheng et al., "Layered Organic-Inorganic Hybrid Perovskites-:Structure, Optical Properties, Film Preparation, Patterning and Templating Engineering," CrystEngComm. 12: 2646-2662, 2010.
Choi et al., "Structure of Methylammonium Lead Iodide Within Mesoporous Titanium Dioxide: Active Material in High-Performance Perovskite Solar Cells," Nano. Lett. 14, pp. 127-133, 2014.
Chondroudis et al., "Electroluminescence from an Organic-Inroganic Perovskite Incorporating a Quaterthiophene Dye Within Lead Halide Perovskite Layers," Chem. Mater., 11, pp. 3028-3030, 1999.
Chung et al., "All-Solid-State Dye-Sensitized Solar Cells with High Efficiency," Nature, vol. 485, pp. 486-489, 2012.
Dennler, et al., "Polymer-Fullerene Bulk-Heterojunction Solar Cells," Advanced Materials 21, pp. 1323-1338, 2009.
Ding et al., "Pore-Filling of Spiro-OMeTAD in Solid-State Dye Sensitized Solar Cells: Quantification, Mechanism, and Consequences for Device Performance," Adv. Funct. Mater. 19, pp. 2431-2436, 2009.
Edri et al., "High Open-Circuit Voltage Solar Cells Based on Organic-Inorganic Lead Bromide Perovskite," J. Phys. Chem. Lett.,4, pp. 897-902, 2013.
Era et al., "Organicinorganic Heterostructure Electroluminescent Device Using a Layered Perovskite Semiconductor," Appl. Phys. Lett., 65, pp. 676-678, 1994.
Era et al., "Polarized Electroluminescence from Oriented p-sexiphenyl Vacuum-deposited Film," Appl. Phys. Lett. 67(17), pp. 2436-2438, 1995.
Era et al., "Enhanced Phosphorescence from Naphthalene-Chromophore Incorporated into Lead Bromide-Based Layered Perovskite Having Organic-Inorganic Superlattice Structure," Chem. Phys. Lett. 296, pp. 417-420, 1998.
Era et al., "PbBr-Based Layer Perovskite Organic-Inorganic Superlattice Having Hole-Transporting Carbazole Chromophore in Organic Layer," Curr. Appl. Phys., 5, pp. 67-70, 2005.
Green et al., "Solar Cell Efficiency Tables (Version 38)," Prog. Photovolt: Res. Appl., 19, pp. 565-572, 2011.
Green, et al., "Solar Cell Efficiency Tables (version 39)," Progress in Photovoltaics: Research and Applications, 20, pp. 12-20, 2012.
Hagfeldt et al., "Light-Induced Redox Reactions in Nanocrystalline Systems," Chem. Rev., 95, pp. 49-68, 1995.
Halls, et al., "Efficient Photodiodes from Interpenetrating Polymer Networks," Nature, 376, pp. 498-500, 1995.
Hashmi et al., "Air Processed Inkjet Infiltrated Carbon Based Printed Perovskite Solar Cells with High Stability and Reproducibility," Adv. Mater. Technol. 1600183, pp. 1-6, 2016.
Hashmi et al., "Air Processed Inkjet Infiltrated Carbon Based Printed Perovskite Solar Cells with High Stability and Reproducibility," Adv. Mater. Technol. 1600183, 2016, Supporting information.
Hines, et al., "Colloidal PbS Nanocrystals with Size-Tunable Near-Infrared Emission: Observation of Post-Synthesis Self-Narrowing of the Particle Size Distribution," Adv. Mater., 15(21), pp. 1844-1849, 2003.
Im, et al., "6.5% Efficient Perovskite Quantum-dot-Sensitized Solar Cell," Nanoscale 3, pp. 4088-4093, 2011.
Ishihara, "Optical Properties of PbI-based Perovskite Structures," Journal of Luminescence, 60&61, pp. 269-274, 1994.
Isis Innovation Limited, Notice of Non-Final Rejection for Korean Patent Application No. 10-2014-7035536, with English translation, dated Sep. 22, 2016, 9 pages.
Itzhaik, et al., "$Sb_2S_3$-Sensitized Nanoporous $TiO_2$ Solar Cells," J. Phys. Chem. C, 113, pp. 4254-4256, 2009.
Jeon et al., "Solvent engineering for high-performance inorganic-organic hybrid perovskite solar cells", Nature Materials, 13, pp. 897-903, 2014.
Kagan, et al., "Organic-Inorganic Hybrid Materials as Semiconducting Channels in Thin-Film Field-Effect Transistors," Science 286, pp. 945-947, 1999.
Kashiwamura et al., "Thin Films of Microcrystalline (CH3NH3)(C6H5C2H4NH3)2Pb2Br7 and Related Compounds: Fabrication and Optical Properties," Synthetic Metals. 96(2): 133-136, 1998.
Kavan, et al., "Highly Efficient Semiconducting $TiO_2$ Photoelectrodes Prepared by Aerosol Pyrolysis," Electrochim. Acta, 40, pp. 643-652, 1995.
Kay et al., "Artificial Photosynthesis. 2. Investigations on the Mechanism of Photsensitization of Nanocrystalline $TiO_2$ Solar Cells by Chlorophyll Derivatives," J. Phys. Chem., 98, pp. 952-959, 1994.
Kim et al., "Lead Iodide Perovskite Sensitized All-Solid-State Submicron Thin Film Mesoscopic Solar Cell with Efficiency Exceeding 9%", Scientific Reports, 2:591, pp. 1-7, PMC. Web. May 8, 2017.
Kim, "Syntheses, Crystal Structures, and Dielectric Property of Oxynitride Perovskites," Dissertation, The Ohio State University, pp. 1-188, 2005.
Kitazawa et al., "Optical Properties of $CH_3NH_3PbX_3$ (X=halogen) and Their Mixed-Halide Cystals," J. Mat Sci., 37, pp. 3585-3587, 2002.
Kitazawa, "Stability of (C6H5C2H4NH3)2Pb(Brxl4-x) Mixed Crystals," Jpn. J. Appl. Phys. 36: 6876-6879, 1997.
Knop et al., "Alkylammonium Lead Halides. Part 2. $CH_3NH_3PbX_3$ (X=Cl, Br, I) Perovskites: Cuboctahedral Halide Cages with Isotropic Cation Reorientation," Can. J. Chem., 68, pp. 412-422, 1990.
Knutson et al., "Tuning the Band Gap in Hybrid Tin Iodide Perovskite Semiconductors Using Structural Templating," Inorg. Chem., 44, pp. 4699-4705, 2005.
Kojima et al., "Organometal Halide Perovskites as Visible-Light Sensitizers for Photovoltaic Cells," J. Am. Chem. Soc. 131, pp. 6050-6051, 2009.
Kojima et al., "Novel Photoelectrochemical Cell with Mesoscopic Electrodes Sensitized by Lead-Halide Compounds," 214th ECS Meeting, Abstract #27, downloaded on Nov. 30, 2015.
Koops et al., "Transient Emission Studies of Electron Injection in Dye Sensitised Solar Cells," Inorganica Chimica Acta, 361, pp. 663-670, 2008.
Koops et al., "Parameters Influencing the Efficiency of Electron Injection in Dye-Sensitized Solar Cells," JACS, 131 (13), pp. 4808-4818, 2009.
Lee et al., "Efficient Hybrid Solar Cells Based on Meso-Superstructured Organometal Halide Perovskites", Science, vol. 338, pp. 643-647, 2012.
Lee et al., "Quantum-Dot-Sensitized Solar Cell With Uprecedentedly High Photocurrent," Scientific Reports, 3(1050), pp. 1-8, 2013.
Leijtens et al., "Hole Transport Materials with Low Glass Transition Temperatures and High Solubility for Application in Solid-State Dye-Sensitized Solar Cells," ACS Nano, 6(2), pp. 1455-1462, 2012.

(56) References Cited

OTHER PUBLICATIONS

Leventis et al., "Transient Optical Studies of Interfacial Charge Transfer at Nanostructured Metal Oxide/PbS Quantum Dot/Organic Hole Conductor Heterojunctions," JACS, 132, pp. 2743-2750, 2010.
Li et al., "Formability of $ABX_3$ (X=F, Cl, Br, I) Halide Perovskites," Acta Cryst., B64, pp. 702-707, 2008.
Lin et al., "Enhanced Performance of Dye-Sensitized Solar Cells by an $Al_2O_3$ Charge-Recombination Barrier Formed by Low-Temperature Atomic Layer Deposition," J. Mater. Chem., 19, pp. 2999-3003, 2009.
Liu et al., "Critical Parameters in $TiO_2/ZrO_2$/Carbon-Based Mesoscopic Perovskite Solar Cell," Journal of Power Sources. 293: 533-538, 2015.
Liu et al., "Efficient planar heterojunction perovskite solar cells by vapour deposition", Nature, 501, pp. 395-398, 2013.
Martinson et al., "Radial Electron Collection in Dye-Sensitized Solar Cells," Nano Lett., vol. 8, No. 9, pp. 2862-2866, 2008.
Megaw, "Compounds of the Structural Type of Calcium Titanate," Nature 155, pp. 484-485, 1945.
Mei et al., "A hole-conductor-free, fully printable mesoscopic perovskite solar cell with high stability", Science, 345, pp. 295-298, 2014.
Melas-Kyriazi et al., "The Effect of Hole Transport Material Pore Filling on Photovoltaic Performance in Solid-State Dye-Sensitized Solar Cells," Adv. Energy. Mater. 1, pp. 407-414, 2011.
Mitzi, "Synthesis, Structure, and Properties of Organic-Inorganic Perovskites and Related Materials," Prog. Inorg. Chem., 48, pp. 1-121, 1999.
Mitzi et al., "Design, Structure, and Optical Properties of Organic-Inorganic Perovskites Containing an Oligothiophene Chromophore," Inorg. Chem., 38, pp. 6246-6256, 1999.
Mitzi et al., "Conducting Tin Halides with a Layered Organic-Based Perovskite Structure," Nature., 369, pp. 467-469, 1994.
Mitzi et al., "Conducting Layered Organic-Inorganic Halides Containing <110>—Oriented Perovskite Sheets," Science., 267 (5203), pp. 1473-1476, 1995.
Mitzi et al., "High-Mobility Ultrathin Semiconducting Films Prepared by Spin Coating," Nature, 428, pp. 299-303, 2004.
Mitzi, "Solution-Processed Inorganic Semiconductors," J. Mater. Chem. 14: 2355-2365, 2004.
Miyasaka et al., "Lead Halide Perovskites as Quantum dot Sensitizers for Mesoscopic TiO2 Photovoltaic Cells," The Electrochemical Society Meeting Abstracts, 216th ECS Meeting Abstract No. 742, 2009.
Nirmala et al., "Synthesis and Characterization of Barium Titanate, Calcium Titanate and Strontium Titanate Thin Films," International Journal of Scientific & Engineering Research, 5(7), pp. 587-594, 2014, http://www.ijser.org/researchpaper%5CSynthesis-and-Characterization-of-Barium-Titanate-Calcium.pdf.
Noh et al., "Chemical Management for Colorful, Efficient, and Stable Inorganic-Organic Hybrid Nanostructured Solar Cells", Nano Lett., pp. A-F, 2013.
O'Regan et al., "A Low-Cost, High-Efficiency Solar-Cell Based On Dye-Sensitized Colloidal TiO2 Films," Nature 353, pp. 737-740, 1991.
O'Regan et al., "A Solid State Dye-Sensitized Solar Cell Fabricated with Pressure-Treated P25-TiO2 and CuSCN: Analysis of Pore Filling and IV Characteristics," Chem. Mater., 14, pp. 5023-5029, 2002.
Oxford University Innovation Limited, Communication Pursuant to Article 94(3) EPC for EP 13766635.0, 6 pages, dated Sep. 28, 2017.
Palomares et al., "Slow Charge Recombination in Dye-Sensitised Solar Cells (DSSC) using $Al_2O_3$ Coated Nanoporous $TiO_2$ Films," Chemical Communications, pp. 1464-1465, 2002.
Papavassiliou, "Synthetic Three—and Lower-Dimensional Semiconductors Based on Inorganic Units," Molecular crystals and liquid crystals science and technology. Section A. Molecular crystals and liquid crystals. 286(1): 231-238, 1996.
Peacock et al., "Band Offsets and Schottky Barrier Heights of High Dielectric Constant Oxides," J. Appl. Phys., vol. 92, No. 8, pp. 4712-4721, 2002.
Pernik et al., "Tracking the Adsorption and Electron Injection Rates of CdSe Quantum Dots on $TiO_2$: Linked Versus Direct Attachment," J. Phys. Chem. C, 115(27), p. 13511-13519, 2011.
Poglitsch et al., "Dynamic Disorder in Methylammoniumtrihalogenoplumbates (II) Observed by Millimeter-Wave Spectroscopy," J. Chem. Phys., 87(11), pp. 6373-6378, 1987.
Roelofs et al., "Effect of $Al_2O_3$ Recombination Barrier Layers Deposited by Atomic Layer Deposition in Solid State CdS Quantum Dot-Sensitized Solar Cells," J. Phys. Chem. C, 117, pp. 5584-5592, 2013.
Saliba et al., "Cesium-containing triple cation perovskite solar cells: improved stability, reproducibility and high efficiency", Energy Environ. Sci., 9, pp. 1989-1997, 2016.
Shockley et al., "Detailed Balance Limit of Efficiency of p—n Junction Solar Cells", Journal of Applied Physics 32(3), pp. 510-519, 1961.
Smestad, "Testing of Dye Sensitized $TiO_2$ Solar Cells II: Theoretical Voltage Output and Photoluminescence Efficiencies," Solar Energy Materials and Solar Cells, 32, pp. 273-288, 1994.
Smestad et al., "Testing of Dye Sensitized $TiO_2$ Solar Cells I: Experimental Photocurrent Output and Conversion Efficiencies," Solar Energy Materials and Solar Cells, 32, pp. 259-272, 1994.
Smestad, "Absorptivity as a Predictor of the Photoluminescence Spectra of Silicon Solar Cells and Photosynthesis," Solar Energy Materials and Solar Cells, 38, pp. 57-71, 1995.
Snaith et al., "The Role of a "Schottky Barrier" at an Electron-Collection Electrode in Solid-State Dye-Sensitized Solar Cells," Adv. Mater. 18, pp. 1910-1914, 2006.
Snaith et al., "Advances in Liquid-Electrolyte and Solid-State Dye-Sensitized Solar Cells," Advanced Materials, 19, pp. 3187-3200, 2007.
Snaith et al., "Charge Collection and Pore Filling in Solid-State Dye-Sensitized Solar Cells," Nanotechnology 19, pp. 424003-424015, 2008.
Snaith et al., "Charge Generation and Photovoltaic Operation of Solid-State Dye-Sensitized Solar Cells Incorporating a High Extinction Coefficient Indolene-Based Sensitizer," Adv. Func. Mater., 19, pp. 1-9, 2009.
Snaith, "Estimating the Maximum Attainable Efficiency in Dye-Sensitized Solar Cells," Adv. Funct. Mater., 20, pp. 13-19, 2010.
Sourisseau et al., "Hybrid Perovskite Resulting from the Solid-State Reaction between the Organic Cations and Perovskite Layers of $\alpha 1-(Br-(CH_2)_2-NH_3)_2PbI_4$," Inorg. Chem., 46, pp. 6148-6154, 2007.
Tamboli, Sikander, "Studies on Mechanical and Optical Properties of Magnesium Oxide, Aluminum Oxide and their co-deposited Mixed Thin Films—Chapter 4—Experimental Results of Aluminium Oxide (Al2O3) Thin Films," Kolhapur, pp. 145-169, 2012, http://shodhganga.inflibnet.ac.in/bitstream/10603/4037/10/10_chapter%204.pdf.
Tang et al., "Colloidal-Quantum-dot Photovoltaics Using Atomic-Ligand Passivation," Nature Materials 10, pp. 765-771, 2011.
Todorov et al., "Efficiency Solar Cell with Earth-Abundant Liquid-Processed Absorber," Adv. Mater., 22, pp. E156-E159, 2010.
Tokito et al., "Structures and Optical Properties of Organic/Inorganic Superlattices," Appl. Phys. Lett. 64, pp. 1353-1355, 1994.
Vincent et al., "Alkylammonium Lead Halides. Part 1. Isolated $PbI_6^{4-}$ Ions in $(CH_3NH_3)_4PbI_6$ $2H_2O$)," Can. J. Chem., 65, pp. 1042-1046, 1987.
Weber, "$CH_3NH_3PbX_3$, a Pb(II)-System with Cubic Perovskite Structure," Z. Naturforsch. 33b: 1443-1445, 1978, English Abstract only.
Wojciechowski et al., "Sub-150 ° C processed meso-superstructured perovskite solar cells with enhanced efficiency", Energy Environ. Sci., 7, pp. 1-9, 2013.
Yamada et al., "Tunable Perovskite Semiconductor $CH_3NH_3SnX_3$ (X: Cl, Br, or I) Characterized by X-ray and DTA," Bull. Chem. Soc. Jpn., 84(9), pp. 926-932, 2011.
Yan et al., "A High-Mobility Electron-Transporting Polymer for Printed Transistors," Nature, vol. 457, pp. 679-687, Feb. 2009.

(56) References Cited

OTHER PUBLICATIONS

Yella, et al., "Porphyrin-Sensitized Solar Cells with Cobalt (II/III)-Based Redox Electrolyte Exceed 12 Percent Efficiency," Science 334, pp. 629-634, 2011.
Yu, et al., "Polymer Photovoltaic Cells: Enhanced Efficiencies via a Network of Internal Donor-Acceptor Heterojunctions," Science 270, pp. 1789-1791, 1995.
Zhang et al,. "Dye-sensitized Solar Cells Made from BaTiO$_3$-coated TiO$_2$ Nanoporous Electrodes," Journal of Photochemistry and Photobiology A: Chemistry 197, pp. 260-265, 2008.
Zhou et al., "Interface engineering of highly efficient perovskite solar cells", Science, 345, pp. 542-546, 2014.
Experimental Annex "A", pp. 1-6, Filed with the European Patent Office on Sep. 1, 2014 in Response to the Written Opinion of the International Preliminary Examining Authority of PCT Application No. PCT/GB2013/051310 dated May 30, 2014.
The Notice of Opposition filed in European Patent Application No. 13723943.0 by Oxford University Innovation Limited, pp. 1-32, dated Dec. 7, 2016.
Japanese Office Action issued in Application No. 2017-140959, dated Jul. 30, 2018 5 pages with 5 pages of translation.
Lee et al., Pressure-induced phase transitions and templating effect in three-dimensional organic-inorganic hybrid perovskites, Physical Review B: Condensed Matter and Materials Physics, 2003, 68(2), pp. 020103/1-020103/4.
Worhatch et al., Study of Local Structure in Selected Organic-Inorganic Perovskites in the Pm3m Phase, Chemistry of Materials, 2008, 20(4), pp. 1272-1277.
Extended European Search Report issued in EP Application I No. 18185861.4 , dated Oct. 4, 2018, 6 pages.
Zhong et al., "Charge recombination reduction in dye-sensitized solar cells by depositing ultrapure TiO2 nanoparticles on inert BaTiO3 films", Materials Science and Engineering B, vol. 176, Jun. 29, 2011 (Jun. 29, 2011), pp. 1115-1122, DOI: 10.1016/j.mseb.2011.05.052.
Oxford University Innovation Limited, First Office Action from the State Intellectual Property Office of China for CN 201610597085.5, 11 pages, dated Apr. 13, 2018.
European Patent Office Communication of Notice of Opposition filed against EP patent No. EP 2898553, dated Aug. 22, 2019, pp. 1-22.
European patent application No. EP13766635.0 as filed (as International application No. PCT/GB2013/052425) from which EP2898553 was granted, 140 pages.
Yang et al. entitled "A Heterojunction Based on Well-ordered Organic-Inorganic Hybrid Perovskite and Its Photovoltaic Performance", Acta Chimica Sinica, vol. 69(6), 2011, pp. 627-632.
Machine translation of article Yang et al. entitled "A Heterojunction Based on Well-ordered Organic-Inorganic Hybrid Perovskite and Its Photovoltaic Performance", Acta Chimica Sinica, pp. 1-8.
Machine translation of WO 02/082,864 A1, pp. 1-5.
Zheng et al. entitled Preparation and characterization of a layered perovskite-type organic-inorganic hybrid compound (C8NH6—CH2CH2NH3)2CuCl4, Thin Solid Films, vol. 514, 2006, pp. 127-131.
Xiao et al. entitled "Preparation and characterization of organic-inorganic hybrid perovskite (C4H9NH3)2CuCl4", Material Science & Engineering B, vol. 117, 2005, pp. 313-316.
Wu et al. entitled "Preparation and characterization of a layered perovskite-type organic-inorganic hybrid compound based on (C6H4)2N(CH2)6NH3Cl", Synthetic Metals, vol. 159, 2009, pp. 2425-2429.
Kojima et al. entitled "Organometal Halide Perovskites as Visible-Light Sensitizers for Photovoltaic Cells", Journal of the American Chemical Society, vol. 131, Nr. 17, 2009, pp. 6050-6051.
Kitazawa et al. entitled "Optical Properties of CH3NH3PbX3 (X=halogen) and their mixed-halide crystals", Journal of Materials Science, vol. 37, 2002, pp. 3585-3587.
Rand et al. entitled "Organic Double-Heterostructure Photovoltaic Cells Employing Thick Tris (acetylacetonato) ruthenium (III) Exciton-Blocking-Layers", Advanced Materials, vol. 17, 2005, pp. 2714-2718.
Bernede. entitled "Organic Photovoltaic Cells: History, Principles and Techniques", J. Chil. Chem. Soc., vol. 53, No. 3, 2008, pp. 1549-1564.
J. Nelson entitled "The Physics of Solar Cells", first published 2003 by Imperial College Press, ISBN-13 978-1-86094-340-9, pp. v-xvii, 242-245 and 296-303.
Australian Examination Report issued in Application No. 2017268594, dated Oct. 11, 2019, pp. 1-5.
Mitzi et al., Synthesis, Resistivity, and Thermal Properties of Cubic Perovskite NH$_2$ CH=NH$_2$ SnI$_3$ and Related Systems, Journal of Solid State Chemistry, 1997, 376-381, vol. 134, Issue 2, 1997, pp. 376-381.
Electroluminescence; PVeducation.org; https://www.pveducation.org/pvcdrom/characterisation/electroluminescence: accessed Jun. 2020 (Year: 2020).
Toshinori Matsushima et al.; Electroluminescence Enhancement in Dry-Processed Organic-Inorganic Layered Perovskite Films; Jpn. J. Appl. Phys. vol. 44, No. 3, 2005, pp. 1457-1461 (Year:2005).
Akihiro Kojima et al.; Highly Luminescent Lead Bromide Perovskite Nanoparticles Synthesized with Porous Alumina Media; Chem. Lett. 2012, 41, 397-399 (Year: 2012).
Rui Sheng et al.; Methylammonium Lead Bromide Perovskite-Based Solar Cells by Vapor-Assisted Deposition; J. Phys. Chem. C 2015, 119, 7, 3545-3549 (Year: 2015).
Office Action issued in Chinese Patent Application No. 201810158929.5 dated Dec. 30, 2020, 12 pages, translation of office action 7 pages.
Kenjiro Tejima, "Photoelectrochemical cell with using organic and inorganic perovskite compound as sensitizer", Feb. 2009, Proceedings of the 12th thin film substrate scientific society at Shizuoka University, 4 pages.
C.W. Tang "Two-layer organic photovoltaic cell"; Appl. Phys. Lett., 48(2), 13, pp. 183-185, Jan. 13, 1986.
J.F. Geisz et al. "Lattice-Matched GaNPAs-on-Silicon Tandem Solar Cells", 31st IEEE Photovoltaics Specialists Conference and Exhibition, Jan. 3-7, 2005, Conference Paper, 7 pages.
Z. Chen et al., "Shottky solar cells based on CsSnI3 thin-films", Appl. Phys. Lett. 101, 093901 (2012), Aug. 27, 2012, American Institute of Physics, pp. 1-4.
In Chung et al., "All-solid-state dye-sensitized solar cells with high efficiency", Nature, vol. 485, May 24, 2012, Macmillan Publishers Limited, pp. 486-490.
J. Rouquerol et al. "Recommendations for the Characterization of Porous Solids", Pure & Appl. Chem., vol. 66, No. 8, pp. 1739-1758, 1994.
Office Action issued Japanese Application No. 2020-020952, dated Mar. 29, 2021, dated Apr. 6, 2021, 6 pages, translation 8 pages.
Office Action issued Japanese Application No. 2019-078604 , dated Apr. 15, 2021, dated Apr. 22, 2021, 5 pages, translation 8 pages.
Japanese Office Action issued in Application No. 2017-240862, dated Nov. 16, 2018, 4 pages with English translation 4 pages.
Machine translation of JP2002198551, 9 pages.
Machine translation of JP2005093485, 8 pages.
Notification of Submission of Opposition Proceedings against European patent No. EP 2898553 (EP application No. 13766635.0), dated May 3, 2021, 20 pages, European Patent Office, Munich, Gemany.
Mitzi et al., "Organic-inorganic electronics", IBM Journal of Research and Development, vol. 45, No. 1, Jan. 2001 pp. 29-45.
Yang et al., "Lead-Free Cu Based Hybrid Perovskite Solar Cell", J Chin Ceram Soc, 2018, 46(4): pp. 455-460, with English translation consisting of 3 pages.

* cited by examiner

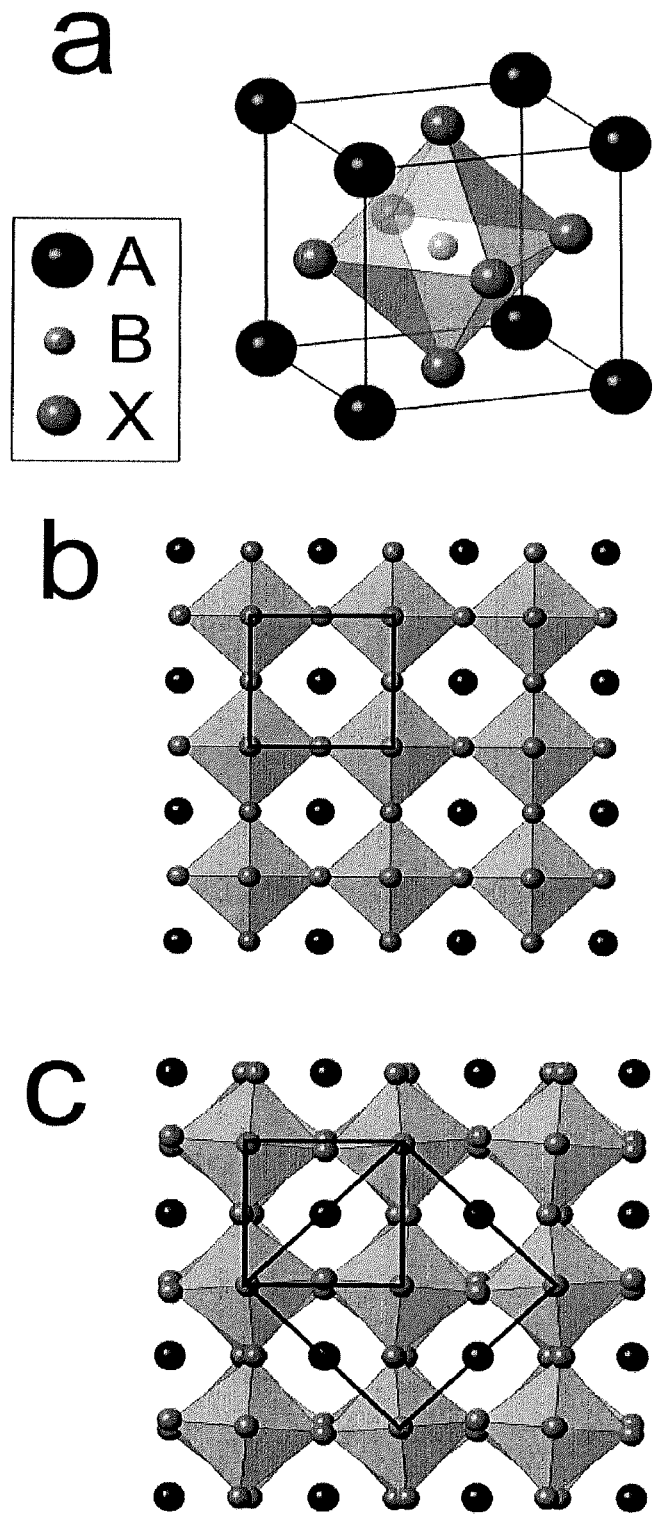
Figure 18 (a-c)

OPTOELECTRONIC DEVICES WITH ORGANOMETAL PEROVSKITES WITH MIXED ANIONS

FIELD OF THE INVENTION

The present invention relates to optoelectronic devices, including photovoltaic devices such as solar cells, and light-emitting devices.

BACKGROUND TO THE INVENTION

The present increases in the global population coupled with the advance of developing countries towards more industrialised economies is creating increasing demand for secure, sustainable energy supplies. There is therefore a pressing need to create new optoelectronic devices that will sate global demand for low-carbon emission.

Solar energy is seen as a clean solution providing high efficiency. However, the high cost of manufacturing devices that harness solar energy, including high material costs, has historically hindered its use.

The production of low-cost optoelectronic devices, such as photovoltaics, that consist of abundant materials, can be manufactured rapidly using reel-to-reel manufacturing methods and simple wet chemistry processes is therefore a burgeoning field of research. In recent years, the power conversion efficiencies of optoelectronic devices have been steadily increasing. However, using traditional photovoltaics it appears unlikely that further significant increases in power conversion efficiencies can be realised. There is, therefore, a real need for new solar cells technologies with a focus on low cost.

Dye-sensitised solar cells are composed of dye-sensitized mesoporous $TiO_2$ infiltrated with a redox active electrolyte [O'Regan et al., Nature, 353, 737-740, 1991]. They are a real contender to be able to generate power on the largest scale. However, despite the most efficient devices being verified at 11.4% and with recent reports of up to 12.3% [Yella et al., Science, 334 (6056), 629-634, 2011] widespread commercialization is yet to be achieved. One of the overriding reasons for the lack of commercial uptake is the liquid nature of the redox couple used in the electrolyte cell, it is highly volatile and corrosive resulting in major limitations on both processing and long term stability, especially at elevated temperatures. A good contender to be able to also generate such efficiencies and be more compatible with large scale processing and long term stability is the solid-state dye-sensitized solar cell, where the redox active electrolyte is substituted with a solid-state hole-conductor. [Snaith et al., Advanced Materials, 19, 3187-3200, 2007] However, at present the most efficient solid-state DSCs are only just over 7%. [Burschka et al., J. Am. Chem. Soc., 133 (45), 18042-18045, 2011] The main reason for this lower performance is that the maximum thickness of the solid-state DSC is limited to around 2 m due to a combination of faster charge recombination and limited ability to infiltrate thick mesoporous photoanodes [Snaith et al., Advanced Materials, 19, 3187-3200, 2007]. At 2 μm thickness, the sensitizers do not absorb enough light over a broad enough spectrum to generate sufficient photocurrent, and short-circuit photocurrents are generally limited to around 10 $mAcm^{-2}$ as opposed to over 20 $mAcm^{-2}$ for the best electrolyte cells.

Recently there has been renewed interest in "extremely thin absorber" (ETA) solar cells, which are equivalent to a solid-state DSC, however the dye is replaced with an extremely thin layer of an inorganic semiconductor coated at the interface between the mesoporous $TiO_2$ and the hole-conductor. Using antimony sulphide $Sb_2S_3$ as the absorber, efficiencies of close to 6% have been reported (Chang et al., Nano Lett., 12 (4), 1863-1867, 2012), but for this material, although high photocurrents can be generated the open-circuit voltages are low limiting the overall performance.

As an alternative absorber material, organometal halide perovskites could be a good candidate and have extremely high extinction coefficients in thin films. They can be easily processed from precursor solutions and have a proven excellence in other applications, such as excellent candidates as transistors [Kagan et al., Science, 286, 945, 1999] and light-emitting diodes (Era et al., Appl. Phys. Lett., 65, 676, 1994). Recently, they have also been reported as sensitizers in liquid electrolyte based photo-electrochemical cells, and delivered solar power conversion efficiencies of between 3.5 to 6.5%. (Kojima et al, J. Am. Chem. Soc., 131, 6050, 2009; Im et al, Nanoscale, 3, 4088, 2011.) However, in this previously reported electrolyte system, the perovskite absorbers decayed rapidly, and the solar cells dropped in performance after only ten minutes.

SUMMARY OF THE INVENTION

The present inventors have found that optoelectronic devices comprising a mixed-anion perovskite are surprisingly stable and exhibit unexpectedly high power conversion efficiencies and photocurrents. The optoelectronic devices are also relatively inexpensive to make and could be produced on a large scale with relative ease.

An important requirement for any optoelectronic device is stability over the intended lifetime of that device. The inventors have found that devices according to the present invention are far less susceptible to vapour-induced chromism than devices comprising a single-halide perovskite.

An additional advantage of devices of the present invention is the comparatively high power conversion efficiencies and photocurrents they deliver. Photo-conversion efficiencies at 1 sun (AM 1.5G 100 $mWcm^{-2}$) of 11.5% have been observed. These efficiencies surpass the efficiencies displayed by devices comprising a single-halide perovskite. Further, the performance of the devices of the invention is unprecedented for solid-state sensitized solar cells and competes directly with the very best performing electrolyte cells. Photocurrents of 21 $mAcm^{-2}$ have observed for optoelectronic devices on the invention. This exceeds the photocurrents observed for the most efficient solid-state DSCs currently available.

Further, the mixed-anion perovskite provides a very flexible framework which may be manipulated by adjusting the individual components in the material, and thus allows exceptional control at the molecular level. The properties of the mixed-anion perovskite may, therefore, be easily tuned to enhance the performance of the optoelectronic device in which they are utilised.

All of these advantages would be overshadowed if the optoelectronic devices were expensive to produce or required complex manufacturing methods that ruled out large scale production. However, this is not the case for the optoelectronic devices of the present invention. The materials used in the devices are both relatively abundant and inexpensive. Further, the devices may be produced via processes that would allow large-scale production methods.

Accordingly, in a first aspect, the invention provides an optoelectronic device comprising a mixed-anion perovskite, wherein the mixed-anion perovskite comprises two or more different anions selected from halide anions and chalcogenide anions.

In a second aspect, the invention provides a mixed-halide perovskite of formula (I)

[A][B][X]$_3$      (I)

wherein:
[A] is at least one organic cation of the formula $(R_1R_2R_3R_4N)^+$, wherein:
(i) $R_1$ is hydrogen, unsubstituted or substituted $C_1$-$C_{20}$ alkyl, or unsubstituted or substituted aryl;
(ii) $R_2$ is hydrogen, unsubstituted or substituted $C_1$-$C_{20}$ alkyl, or unsubstituted or substituted aryl;
(iii) $R_3$ is hydrogen, unsubstituted or substituted $C_1$-$C_{20}$ alkyl, or unsubstituted or substituted aryl; and
(iv) $R_4$ is hydrogen, unsubstituted or substituted $C_1$-$C_{20}$ alkyl, or unsubstituted or substituted aryl;
[B] is at least one divalent metal cation; and
[X] is said two or more different halide anions.

Typically, in the second aspect of the invention:
(i) when A is an organic cation which is $(CH_3NH_3)^+$ and B is a divalent metal cation which is $Sn^{2+}$, the mixed-halide perovskite does not comprise: (a) a chloride ion and a bromide ion, or (b) a bromide ion and an iodide ion; and
(ii) when A is an organic cation which is $(CH_3NH_3)^+$ and B is a divalent metal cation which is $Pb^{2+}$, the mixed-halide perovskite does not comprise a chloride ion and a bromide ion.

In a third aspect, the invention provides a mixed-halide perovskite of the formula (I)

[A][B][X]$_3$      (I)

wherein:
[A] is at least one organic cation of the formula $(R_5R_6N=CH-NR_7R_8)^+$, wherein:
(i) $R_5$ is hydrogen, unsubstituted or substituted $C_1$-$C_{20}$ alkyl, or unsubstituted or substituted aryl;
(ii) $R_6$ is hydrogen, unsubstituted or substituted $C_1$-$C_{20}$ alkyl, or unsubstituted or substituted aryl;
(iii) $R_7$ is hydrogen, unsubstituted or substituted $C_1$-$C_{20}$ alkyl, or unsubstituted or substituted aryl; and
(iv) $R_8$ is hydrogen, unsubstituted or substituted $C_1$-$C_{20}$ alkyl, or unsubstituted or substituted aryl;
[B] is at least one divalent metal cation; and
[X] is two or more different halide anions.

In another aspect, the invention provides the use of a mixed-anion perovskite as a sensitizer in an optoelectronic device, wherein the mixed-anion perovskite comprises two or more different anions selected from halide anions and chalcogenide anions.

The invention also provides a photosensitizing material for an optoelectronic device comprising a mixed-anion perovskite wherein the mixed-anion perovskite comprises two or more different anions selected from halide anions and chalcogenide anions.

BRIEF DESCRIPTION OF THE FIGURES

FIG. 18(a-c) provides schematic diagrams of: (a) the general perovskite $ABX_3$ unit cell; (b) the cubic perovskite lattice structure (the unit cell is shown as an overlaid square); and (c) the tetragonal perovskite lattice structure arising from a distortion of the $BX_6$ octahedra (the unit cell is shown as the larger overlaid square, and the pseudocubic unit cell that it can be described by is shown as the smaller overlaid square).

DETAILED DESCRIPTION OF THE INVENTION

Figure 1:
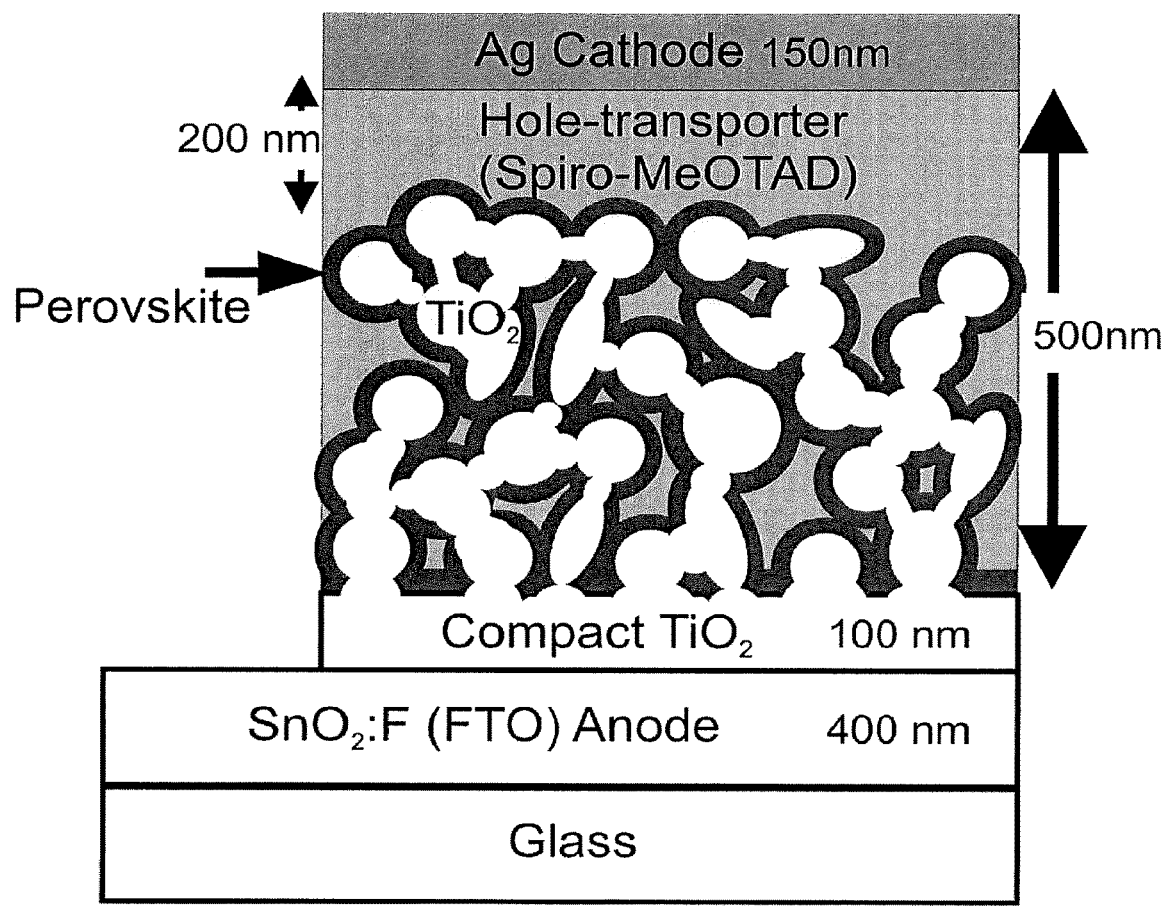
FIG. 1 is a schematic diagram of a photovoltaic device comprising a mixed-anion perovskite.

The invention provides an optoelectronic device comprising a mixed-anion perovskite, wherein the mixed-anion perovskite comprises two or more different anions selected from halide anions and chalcogenide anions.

An optoelectronic device is any device that is capable of converting optical energy into electrical energy or converting electrical energy into optical energy.

The term "perovskite", as used herein, refers to a material with a three-dimensional crystal structure related to that of $CaTiO_3$ or a material comprising a layer of material, wherein the layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well know. For instance, the structure of materials adopting the $K_2NiF_4$-type structure comprises a layer of perovskite material. The skilled person will also appreciate a perovskite material could be represented by the formula [A] [B] [X]$_3$, wherein A is at least one cation, B is at least one cation and X is at least one anion. When the perovskite comprise more than one A cation, the different A cations may distributed over the A sites in an ordered or disordered way. When the perovskite comprise more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will be lower than that of $CaTiO_3$.

The term "mixed-anion", as used herein, refers to a compound comprising at least two different anions.

The term "halide" refers to an anion of a group 7 element, i.e., of a halogen. Typically, halide refers to a fluoride anion, a chloride anion, a bromide anion, an iodide anion or an astatide anion.

The term "chalcogenide anion", as used herein refers to an anion of group 6 element, i.e. of a chalcogen. Typically, chalcogenide refers to an oxide anion, a sulphide anion, a selenide anion or a telluride anion.

In the optoelectronic device of the invention the mixed-anion perovskite may comprise a first cation, a second cation, and said two or more different anions.

As the skilled person will appreciate, the mixed-anion perovskite may comprise further cations or further anions. For example, the mixed-anion perovskite may comprise two, three or four different cations, or two, three of four different anions.

In one embodiment, the perovskite comprises two different anions selected from halide anions and chalcogenide anions. The two different anions may be a halide anion and a chalcogenide anion, two different halide anions or two different chalcogenide anions.

Typically, in the optoelectronic device of the invention, the second cation in the mixed-anion perovskite is a metal cation. More typically, the second cation is a divalent metal cation. For instance, the second cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, the second cation is selected from $Sn^{2+}$ and $Pb^{2+}$.

In the optoelectronic device of the invention, the first cation in the mixed-anion perovskite is usually an organic cation.

The term "organic cation" refers to a cation comprising carbon. The cation may comprise further elements, for example, the cation may comprise hydrogen, nitrogen or oxygen.

Changes to the organic cation (or organic cations) in the perovskite will usually have an impact on the structural and/or physical properties of the perovskite. By controlling the organic cation used, the electronic properties and the optical properties of the material may be controlled. This flexible control over the properties displayed by the perovskites is particularly useful for tuning the properties of the optoelectronic device comprising said perovskite. For example, by changing the organic cation, the conductivity of the material may increase or decrease. Further, changing in organic cation may alter the band structure of the material thus, for example, allowing control of the band gap for a semiconducting material.

Usually, in the optoelectronic device of the invention, the organic cation has the formula $(R_1R_2R_3R_4N)^+$, wherein: $R_1$ is hydrogen, unsubstituted or substituted $C_1$-$C_{20}$ alkyl, or unsubstituted or substituted aryl; $R_2$ is hydrogen, unsubstituted or substituted $C_1$-$C_{20}$ alkyl, or unsubstituted or substituted aryl; $R_3$ is hydrogen, unsubstituted or substituted $C_1$-$C_{20}$ alkyl, or unsubstituted or substituted aryl; and $R_4$ is hydrogen, unsubstituted or substituted $C_1$-$C_{20}$ alkyl, or unsubstituted or substituted aryl.

As used herein, an alkyl group can be a substituted or unsubstituted, linear or branched chain saturated radical, it is often a substituted or an unsubstituted linear chain saturated radical, more often an unsubstituted linear chain saturated radical. A $C_1$-$C_{20}$ alkyl group is an unsubstituted or substituted, straight or branched chain saturated hydrocarbon radical, having from 1 to 20 carbon atoms. Typically it is $C_1$-$C_{10}$ alkyl, for example methyl, ethyl, propyl, butyl, pentyl, hexyl, heptyl, octyl, nonyl or decyl, or $C_1$-$C_6$ alkyl, for example methyl, ethyl, propyl, butyl, pentyl or hexyl, or $C_1$-$C_4$ alkyl, for example methyl, ethyl, i-propyl, n-propyl, t-butyl, s-butyl or n-butyl.

When an alkyl group is substituted it typically bears one or more substituents selected from substituted or unsubstituted $C_1$-$C_{20}$ alkyl, substituted or unsubstituted aryl (as defined herein), cyano, amino, $C_1$-$C_{10}$ alkylamino, di($C_{1-10}$) alkylamino, arylamino, diarylamino, arylalkylamino, amido, acylamido, hydroxy, oxo, halo, carboxy, ester, acyl, acyloxy, $C_1$-$C_{20}$ alkoxy, aryloxy, haloalkyl, sulfonic acid, sulfhydryl (i.e. thiol, —SH), $C_1$-$C_{10}$ alkylthio, arylthio, sulfonyl, phosphoric acid, phosphate ester, phosphonic acid and phosphonate ester. Examples of substituted alkyl groups include haloalkyl, hydroxyalkyl, aminoalkyl, alkoxyalkyl and alkaryl groups. The term alkaryl, as used herein, pertains to a $C_1$-$C_{20}$ alkyl group in which at least one hydrogen atom has been replaced with an aryl group. Examples of such groups include, but are not limited to, benzyl (phenylmethyl, PhCH$_2$—), benzhydryl (Ph$_2$CH—), trityl (triphenylmethyl, Ph$_3$C—), phenethyl (phenylethyl, Ph-CH$_2$CH$_2$—), styryl (Ph-CH=CH—), cinnamyl (Ph-CH=CH—CH$_2$—).

Typically a substituted alkyl group carries 1, 2 or 3 substituents, for instance 1 or 2.

An aryl group is a substituted or unsubstituted, monocyclic or bicyclic aromatic group which typically contains from 6 to 14 carbon atoms, preferably from 6 to 10 carbon atoms in the ring portion. Examples include phenyl, naphthyl, indenyl and indanyl groups. An aryl group is unsubstituted or substituted. When an aryl group as defined above is substituted it typically bears one or more substituents selected from $C_1$-$C_6$ alkyl which is unsubstituted (to form an aralkyl group), aryl which is unsubstituted, cyano, amino, $C_1$-$C_{10}$ alkylamino, di($C_1$-$C_{10}$)alkylamino, arylamino, diarylamino, arylalkylamino, amido, acylamido, hydroxy, halo, carboxy, ester, acyl, acyloxy, $C_1$-$C_{20}$ alkoxy, aryloxy, haloalkyl, sulfhydryl (i.e. thiol, —SH), $C_{1-10}$ alkylthio, arylthio, sulfonic acid, phosphoric acid, phosphate ester, phosphonic acid and phosphonate ester and sulfonyl. Typically it carries 0, 1, 2 or 3 substituents. A substituted aryl group may be substituted in two positions with a single $C_1$-$C_6$ alkylene group, or with a bidentate group represented by the formula —X—($C_1$-$C_6$)alkylene, or —X—($C_1$-$C_6$)alkylene-X—, wherein X is selected from O, S and NR, and wherein R is H, aryl or $C_1$-$C_6$ alkyl. Thus a substituted aryl group may be an aryl group fused with a cycloalkyl group or with a heterocyclyl group. The ring atoms of an aryl group may include one or more heteroatoms (as in a heteroaryl group). Such an aryl group (a heteroaryl group) is a substituted or unsubstituted mono- or bicyclic heteroaromatic group which typically contains from 6 to 10 atoms in the ring portion including one or more heteroatoms. It is generally a 5- or 6-membered ring, containing at least one heteroatom selected from O, S, N, P, Se and Si. It may contain, for example, 1, 2 or 3 heteroatoms. Examples of heteroaryl groups include thiophenyl, pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl. A heteroaryl group may be unsubstituted or substituted, for instance, as specified above for aryl. Typically it carries 0, 1, 2 or 3 substituents.

Mainly, in the optoelectronic device of the invention, $R_1$ in the organic cation is hydrogen, methyl or ethyl, $R_2$ is hydrogen, methyl or ethyl, $R_3$ is hydrogen, methyl or ethyl, and $R_4$ is hydrogen, methyl or ethyl. For instance $R_1$ may be hydrogen or methyl, $R_2$ may be hydrogen or methyl, $R_3$ may be hydrogen or methyl, and $R_4$ may be hydrogen or methyl.

Alternatively, the organic cation may have the formula $(R_5NH_3)^+$, wherein: $R_5$ is hydrogen, or unsubstituted or substituted $C_1$-$C_{20}$ alkyl. For instance, $R_5$ may be methyl or ethyl. Typically, $R_5$ is methyl.

In some embodiments, the organic cation has the formula $(R_5R_6N=CH-NR_7R_8)^+$, wherein:

$R_5$ is hydrogen, unsubstituted or substituted $C_1$-$C_{20}$ alkyl, or unsubstituted or substituted aryl;

$R_6$ is hydrogen, unsubstituted or substituted $C_1$-$C_{20}$ alkyl, or unsubstituted or substituted aryl;

$R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl.

Typically, $R_5$ in the organic cation is hydrogen, methyl or ethyl, $R_6$ is hydrogen, methyl or ethyl, $R_7$ is hydrogen, methyl or ethyl, and $R_8$ is hydrogen, methyl or ethyl. For instance $R_5$ may be hydrogen or methyl, $R_6$ may be hydrogen or methyl, $R_7$ may be hydrogen or methyl, and $R_8$ may be hydrogen or methyl.

The organic cation may, for example, have the formula $(H_2N=CH-NH_2)^+$.

In the optoelectronic device of the invention, the perovskite is usually a mixed-halide perovskite, wherein said two or more different anions are two or more different halide anions. Typically, they are two or three halide anions, more typically, two different halide anions. Usually the halide anions are selected from fluoride, chloride, bromide and iodide, for instance chloride, bromide and iodide.

Typically, in the optoelectronic device of the invention, the perovskite is a perovskite compound of the formula (I):

$$[A][B][X]_3 \qquad (I)$$

wherein:

[A] is at least one organic cation;

[B] is at least one metal cation; and

[X] is said two or more different anions.

For instance, the perovskite of the formula (I) may comprise one, two, three or four different metal cations, typically one or two different metal cations. The perovskite of the formula (I), may, for instance, comprise one, two, three or four different organic cations, typically one or two different organic cations. The perovskite of the formula (I), may, for instance, comprise two, three or four different anions, typically two or three different anions.

Often, in the optoelectronic device of the invention, [X] is a halide anion and a chalcogenide anion, two different halide anions or two different chalcogenide anions.

Typically, in the optoelectronic device of the invention, [B] in the mixed-anion perovskite is at least one metal cation. More typically, [B] is at least one divalent metal cation. For instance, [B] is at least one divalent metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, [B] is at least one divalent metal cation is selected from $Sn^{2+}$ and $Pb^{2+}$.

Usually, in the optoelectronic device of the invention, [A] is at least one organic cation which has the formula $(R_1R_2R_3R_4N)^+$, wherein:

$R_1$ is hydrogen, unsubstituted or substituted $C_1$-$C_{20}$ alkyl, or unsubstituted or substituted aryl;

$R_2$ is hydrogen, unsubstituted or substituted $C_1$-$C_{20}$ alkyl, or unsubstituted or substituted aryl;

$R_3$ is hydrogen, unsubstituted or substituted $C_1$-$C_{20}$ alkyl, or unsubstituted or substituted aryl; and $R_4$ is hydrogen, unsubstituted or substituted $C_1$-$C_{20}$ alkyl, or unsubstituted or substituted aryl.

[A] may however be at least one organic cation which has the formula $(R_5R_6N=CH-NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl.

In one embodiment, the perovskite is a perovskite compound of the formula (IA):

$$AB[X]_3 \qquad (IA)$$

wherein:
A is an organic cation;
B is a metal cation; and
[X] is said two or more different anions.

Usually, [X] is two or more different halide anions. Preferably, [X] is two or three different halide anions. More preferably, [X] is two different halide anions. In another embodiment [X] is three different halide anions.

Often, in the optoelectronic device of the invention, [X] is a halide anion and a chalcogenide anion, two different halide anions or two different chalcogenide anions.

Typically, in the optoelectronic device of the invention, B is a divalent metal cation.

For instance, B is a divalent metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, B is a divalent metal cation is selected from $Sn^{2+}$ and $Pb^{2+}$.

Usually, in the optoelectronic device of the invention, A is an organic cation which has the formula $(R_1R_2R_3R_4N)^+$, wherein:

$R_1$ is hydrogen, unsubstituted or substituted $C_1$-$C_{20}$ alkyl, or unsubstituted or substituted aryl;

$R_2$ is hydrogen, unsubstituted or substituted $C_1$-$C_{20}$ alkyl, or unsubstituted or substituted aryl;

$R_3$ is hydrogen, unsubstituted or substituted $C_1$-$C_{20}$ alkyl, or unsubstituted or substituted aryl; and $R_4$ is hydrogen, unsubstituted or substituted $C_1$-$C_{20}$ alkyl, or unsubstituted or substituted aryl.

A may however be at least one organic cation which has the formula $(R_5R_6N=CH-NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl.

Typically, in the optoelectronic device of the invention, the perovskite is a perovskite compound of formula (II):

$$ABX_{3-y}X'_y \qquad (II)$$

wherein:
A is an organic cation;
B is a metal cation;
X is a first halide anion;
X' is a second halide anion which is different from the first halide anion; and
y is from 0.05 to 2.95.

Usually, y is from 0.5 to 2.5, for instance from 0.75 to 2.25. Typically, y is from 1 to 2.

Often, in the optoelectronic device of the invention, X is a halide anion and X' is a chalcogenide anion, or X and X' are two different halide anions or two different chalcogenide anions.

Typically, in the optoelectronic device of the invention, B may be a divalent metal cation. For instance, B is a divalent metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{21}$. Usually, B is a divalent metal cation selected from $Sn^{2+}$ and $Pb^{2+}$.

Usually, in the optoelectronic device of the invention, A is an organic cation which has the formula $(R_1R_2R_3R_4N)^+$, wherein:

$R_1$ is hydrogen, unsubstituted or substituted $C_1$-$C_{20}$ alkyl, or unsubstituted or substituted aryl;

$R_2$ is hydrogen, unsubstituted or substituted $C_1$-$C_{20}$ alkyl, or unsubstituted or substituted aryl;

$R_3$ is hydrogen, unsubstituted or substituted $C_1$-$C_{20}$ alkyl, or unsubstituted or substituted aryl; and $R_4$ is hydrogen, unsubstituted or substituted $C_1$-$C_{20}$ alkyl, or unsubstituted or substituted aryl.

In some embodiments of the optoelectronic device of the invention, when [B] is a single metal cation which is $Pb^{2+}$, one of said two or more different halide anions is iodide or fluoride; and when [B] is a single metal cation which is $Sn^{2+}$ one of said two or more different halide anions is fluoride. Usually, in some embodiments of the optoelectronic device of the invention, one of said two or more different halide anions is iodide or fluoride. Typically, in some embodiments of the optoelectronic device of the invention, one of said two or more different halide anions is iodide and another of said two or more different halide anions is fluoride or chloride. Often, in some embodiments of the optoelectronic device of the invention, one of said two or more different halide anions is fluoride. Typically, in some embodiments of the optoelectronic device of the invention, either: (a) one of said two or more different anions is fluoride and another of said said two or more different anions is chloride, bromide or iodide; or (b) one of said two or more different anions is iodide and another of said two or more different anions is fluoride or chloride.

Usually, in the optoelectronic device of the invention, [X] is two different halide anions X and X'.

Often, in the optoelectronic device of the invention, said divalent metal cation is $Sn^{2+}$. Alternatively, in some embodiments of the optoelectronic device of the invention, said divalent metal cation may be $Pb^{2+}$.

In some embodiments, in the optoelectronic device of the invention, the perovskite is a perovskite compound of formula (IIa):

$$ABX_{3z}X'_{3(1-z)} \qquad (IIa)$$

wherein:

A is an organic cation of the formula $(R_5R_6N=CH-NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl;

B is a metal cation;

X is a first halide anion;

X' is a second halide anion which is different from the first halide anion; and z is greater than 0 and less than 1.

Usually, z is from 0.05 to 0.95.

Preferably, z is from 0.1 to 0.9. z may, for instance, be 0.1, 0.2, 0.3, 0.4, 0.5, 0.6, 0.7, 0.8 or 0.9, or z may be a range of from any one of these values, to any other of these values (for instance from 0.2 to 0.7, or from 0.1 to 0.8).

Typically, X is a halide anion and X' is a chalcogenide anion, or X and X' are two different halide anions or two different chalcogenide anions. Usually, X and X' are two different halide anions. For instance, one of said two or more different halide anions may be iodide and another of said two or more different halide anions may be bromide.

Usually, B is a divalent metal cation. For instance, B may be a divalent metal cation, selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. Usually, B is a divalent metal cation selected from $Sn^{2+}$ and $Pb^{2+}$. For instance, B may be $Pb^{2+}$.

The organic cation may, for instance, be $(R_5R_6N=CH-NR_7R_8)^+$, wherein: $R_5$, $R_6$, $R_7$ and $R_8$ are independently selected from hydrogen and unsubstituted or substituted $C_1$-$C_6$ alkyl. For instance, the organic cation may be $(H_2N=CH-NH_2)$.

In the optoelectronic device of the invention, the perovskites is typically selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2C$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$. Typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnICl_2$, $CH_3NH_3SnF_2I$, $CH_3NH_3SnI_2Cl$ and $CH_3NH_3SnF_2Cl$. More typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnF_2I$ and $CH_3NH_3SnF_2Cl$. Usually, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3SnF_2Br$, and $CH_3NH_3SnF_2I$.

In some embodiments, the perovskite may be a perovskite of formula $(H_2N=CH-NH_2)PbI_{3z}Br_{3(1-z)}$, wherein z is greater than 0 and less than 1. z may be as further defined hereinbefore.

The optoelectronic device of the invention may comprise said perovskite and a single-anion perovskite, wherein said single anion perovskite comprises a first cation, a second cation and an anion selected from halide anions and chalcogenide anions; wherein the first and second cations are as herein defined for said mixed-anion perovskite. For instance, the optoelectronic device may comprise: $CH_3NH_3PbICl_2$ and $CH_3NH_3PbI_3$; $CH_3NH_3PbICl_2$ and $CH_3NH_3PbBr_3$; $CH_3NH_3PbBrCl_2$ and $CH_3NH_3PbI_3$; or $CH_3NH_3PbBrCl_2$ and $CH_3NH_3PbBr_3$.

The optoelectronic device may comprise a perovskite of formula $(H_2N=CH-NH_2)PbI_{3z}Br_{3(1-z)}$, wherein z is as defined herein, and a single-anion perovskite such as $(H_2N=CH-NH_2)PbI_3$ or $(H_2N=CH-NH_2)PbBr_3$.

Alternatively, the optoelectronic device of the invention may comprise more than one perovskite, wherein each perovskite is a mixed-anion perovskite, and wherein said mixed-anion perovskite is as herein defined. For instance, the optoelectronic device may comprise two or three said perovskites. The optoelectronic device of the invention may, for instance, comprise two perovskites wherein both perovskites are mixed-anion perovskites. For instance, the optoelectronic device may comprise: $CH_3NH_3PbICl_2$ and $CH_3NH_3PbIBr_2$; $CH_3NH_3PbICl_2$ and $CH_3NH_3PbBrI_2$; $CH_3NH_3PbBrCl_2$ and $CH_3NH_3PbIBr_2$; or $CH_3NH_3PbBrCl_2$ and $CH_3NH_3PbIBr_2$.

The optoelectronic device may comprise two different perovskites, wherein each perovskite is a perovskite of formula $(H_2N=CH-NH_2)PbI_{3z}Br_{3(1-z)}$, wherein z is as defined herein.

The optoelectronic device of the invention is typically an optoelectronic device selected from: a photovoltaic device; a photodiode; a phototransistor; a photomultiplier; a photo resistor; a photo detector; a light-sensitive detector; solid-state triode; a battery electrode; a light-emitting device; a light-emitting diode; a transistor; a solar cell; a laser; and a diode injection laser.

Usually, the optoelectronic device of the invention is a photovoltaic device. More usually, the device is a solar cell.

Alternatively, the optoelectronic device of the invention may be a light-emitting device, for instance, a light-emitting diode.

In one embodiment, the optoelectronic device of the invention, is an optoelectronic device comprising:

a first electrode;

a second electrode; and, disposed between the first and second electrodes:

(a) said perovskite.

The first and second electrodes are an anode and a cathode, one or both of which is transparent to allow the ingress of light. The choice of the first and second electrodes of the optoelectronic devices of the present invention may depend on the structure type. Typically, the n-type layer is deposited onto a tin oxide, more typically onto a fluorine-doped tin oxide (FTO) anode, which is usually a transparent or semi-transparent material. Thus, the first electrode is usually transparent or semi-transparent and typically comprises FTO. Usually, the thickness of the first electrode is from 200 nm to 600 nm, more usually, from 300 to 500 nm. For instance the thickness may be 400 nm. Typically, FTO is coated onto a glass sheet. Usually, the second electrode comprises a high work function metal, for instance gold, silver, nickel, palladium or platinum, and typically silver. Usually, the thickness of the second electrode is from 50 nm to 250 nm, more usually from 100 nm to 200 nm. For instance, the thickness of the second electrode may be 150 nm.

As used herein, the term "thickness" refers to the average thickness of a component of an optoelectronic device.

Typically, the optoelectronic device of the invention is an optoelectronic device comprising:

a first electrode;

a second electrode; and, disposed between the first and second electrodes:

(a) a thin film comprising said perovskite.

In one embodiment, the optoelectronic device of the invention is an optoelectronic device comprising:
a first electrode;
a second electrode; and, disposed between the first and second electrodes:
(a) a layer of a semiconductor; and
(b) said perovskite.

The term "semiconductor" as used herein refers to a material with electrical conductivity intermediate in magnitude between that of a conductor and an insulator. The semiconductor may be an intrinsic semiconductor, an n-type semiconductor or a p-type semiconductor. Examples of semiconductors include perovskites; oxides of titanium, niobium, tin, zinc, cadmium, copper or lead; chalcogenides of antimony, copper, zinc, iron, or bismuth (e.g. copper sulphide and iron sulphide); copper zinc tin chalcogenides, for example, copper zinc tin sulphides such a $Cu_2ZnSnS_4$ (CZTS) and copper zinc tin sulphur-selenides such as $Cu_2ZnSn(S_{1-x}Se_x)_4$ (CZTSSe); copper indium chalcogenides such as copper indium selenide (CIS); copper indium gallium chalcogenides such as copper indium gallium selenides ($CuIn_{1-x}Ga_xSe_2$) (CIGS); and copper indium gallium diselenide. Further examples are group IV compound semiconductors (e.g. silicon carbide); group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide); ternary or quaternary semiconductors (eg. Copper Indium Selenide, Copper indium gallium di-selenide, copper zinc tin sulphide, or copper zinc tin sulphide selenide (CZTSSe).

Usually, the optoelectronic device of the invention, is an optoelectronic device comprising: a first electrode; a second electrode; and, disposed between the first and second electrodes: (a) an n-type layer; and (b) said perovskite.

As used herein, the term "n-type layer", refers to a layer comprising an n-type, or electron transporting material.

Alternatively, the optoelectronic device of the invention, is an optoelectronic device comprising: a first electrode; a second electrode; and, disposed between the first and second electrodes: (a) a p-type layer; and (b) said perovskite.

The term "p-type layer", as used herein, refers to a layer comprising a p-type, or hole transporting material.

In one embodiment, the optoelectronic device of the invention, is an optoelectronic device comprising:
a first electrode;
a second electrode; and, disposed between the first and second electrodes:
(a) an n-type layer;
(b) said perovskite; and
(c) a p-type layer.

The optoelectronic device of this embodiment may be any of those listed above, for instance a photovoltaic device. The perovskite is typically a sensitizer material.

The term "sensitizer", as used herein, refers to a material which is capable of performing photoinduced charge generation, photoemission or electroemission.

Often, the sensitizer is also capable of transporting charge (holes or electrons). For instance, when the sensitizer is said perovskite, the sensitizer is also capable of transporting charge.

Usually, the n-type layer comprises a metal oxide semiconductor and the p-type layer comprises a hole transporting material. The metal oxide semiconductor and the hole transporting material are as herein defined.

Alternatively, the p-type layer comprises a metal oxide semiconductor and the n-type layer comprises an electron transporting material. For instance, the metal oxide semiconductor may comprise an oxide of nickel, molybdenum, copper or vanadium, or a mixture thereof. Often, the electron transporting material comprises a fullerene or perylene, or derivatives thereof, poly {[N,N0-bis(2-octyldodecyl)-naphthalene-1,4,5,8-bis(dicarboximide)-2,6-diyl]-alt-5,50-(2,20-bithiophene)} (P(NDI2OD-T2)), or an electrolyte.

In one embodiment, the optoelectronic device may be a thin film device. Usually, the n-type layer will comprise a metal oxide, metal sulphide, metal selenide or metal telluride. Often, the metal oxide will be an oxide an oxide of titanium, tin, zinc, niobium, tantalum, tungsten, indium, gallium, neodinium, palladium or cadmium, or a mixture thereof. For instance, the n-type layer may comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$. Often, the metal oxide is $TiO_2$. Typically, the sulphide will be a sulphide of cadmium, tin, copper, zinc or a mixture thereof. For instance, the sulphide may be $FeS_2$, $CdS$ or $Cu_2ZnSnS_4$. Usually, the selenide will be a selenide of cadmium, zinc, indium or gallium or a mixture thereof. For instance, the selenide may be $Cu(In, Ga)Se_2$.

Typically, the tellenide is a tellenide of cadmium, zinc, cadmium or tin. For instance, the tellenide may be CdTe.

The optoelectronic device may comprise a tunnel junction. For instance, the optoelectronic device may be a multi-junction solar cell or tandem cell.

In one embodiment, the optoelectronic device of the invention is an optoelectronic device comprising:
a first electrode;
a second electrode; and, disposed between the first and second electrodes:
(a) a porous layer of a semiconductor; and
(b) a sensitizer material comprising said perovskite.

Typically, the optoelectronic device of the invention is an optoelectronic device comprising: a first electrode; a second electrode; and, disposed between the first and second electrodes: (a) a porous layer of a semiconductor; (b) a sensitizer material comprising said perovskite; and (c) a charge transporting material.

The optoelectronic device of the invention may, for instance, be an optoelectronic device comprising:
a first electrode;
a second electrode; and, disposed between the first and second electrodes:
(a) a porous layer of a semiconductor, which is a porous layer of a p-type semiconductor;
(b) a sensitizer material comprising said perovskite; and
(c) a charge transporting material, which is an electron transporting material.

Usually, when the porous layer of a semiconductor is a porous layer of a p-type semiconductor, the porous layer comprises an oxide of nickel, vanadium, copper or molybdenum. For instance, the porous layer may comprise NiO, $V_2O_5$, $MoO_3$ or CuO.

Typically, the porous layer of a p-type semiconductor is in contact with a compact layer of a p-type semiconductor. For instance, the compact layer of a p-type semiconductor may comprise oxide of nickel, vanadium, copper or molybdenum. Usually, compact layer of a p-type semiconductor comprises NiO, $V_2O_5$, $MoO_3$ or CuO.

Often, when the charge transporting material is an electron transporting material, the charge transporting material comprises a fullerene or perylene, or derivatives thereof, or P(NDI2OD-T2)). For instance, the charge transporting material may be P(NDI2OD-T2).

Alternatively, the optoelectronic device of the invention may be a photovoltaic device comprising:
a first electrode;
a second electrode; and, disposed between the first and second electrodes:
(a) a porous layer of a semiconductor, which is a porous layer of an n-type semiconductor;
(b) a sensitizer material comprising said perovskite; and
(c) a charge transporting material, which is a hole transporting material.

Typically, when the porous layer of a semiconductor is a porous layer of an n-type semiconductor, the porous layer of an n-type semiconductor comprises: an oxide of titanium, tin, zinc, niobium, tantalum, tungsten, indium, gallium, neodinium, palladium or cadmium, or a mixture thereof. For instance, the porous layer of a semiconductor may comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$. Often, the porous layer of an n-type semiconductor comprises a mesoporous oxide of titanium, tin, zinc, niobium, tantalum, tungsten, indium, gallium, neodinium, palladium or cadmium or a mixture thereof.

The term "mesoporous", as used herein means that the pores in the porous layer are microscopic and have a size which is usefully measured in nanometres (nm). The mean pore size of the pores within a "mesoporous" structure may for instance be anywhere in the range of from 1 nm to 100 nm, or for instance from 2 nm to 50 nm. Individual pores may be different sizes and may be any shape. The term "pore size", as used herein, defines the size of the pores. For spherical pores, the pore size is equal to the diameter of the sphere. For pores that are not spherical, the pore size is equal to the diameter of a sphere, the volume of said sphere being equal to the volume of the non-spherical pore. This definition of pore size applies to the pores within said mesoporous single crystal and the pores within said porous template.

Usually, when the porous layer of a semiconductor is a porous layer of an n-type semiconductor the porous layer of a semiconductor comprises $TiO_2$. More usually, the porous layer comprises mesoporous $TiO_2$.

Often, the porous layer of an n-type semiconductor is in contact with a compact layer of an n-type semiconductor. Usually, the compact layer of an n-type semiconductor comprises oxide of titanium, tin, zinc, niobium, tantalum, tungsten, indium, gallium, neodinium, palladium or cadmium, or a mixture thereof. Typically, the compact layer of an n-type semiconductor comprises $TiO_2$. Usually, the compact layer of an n-type semiconductor has a thickness of from 50 nm to 200 nm, typically a thickness of about 100 nm.

When the charge transporting material is an hole transporting material, the hole transporting material in the optoelectronic device of the invention may be any suitable p-type or hole-transporting, semiconducting material. Typically, the hole transporting material is a small molecular or polymer-based hole conductor.

Typically, when the charge transporting material is an hole transporting material, the charge transporting material is a solid state hole transporting material or a liquid electrolyte.

Often, when the charge transporting material is an hole transporting material, the charge transporting material is a polymeric or molecular hole transporter. Typically, the hole transporting material comprises spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide) or tBP (tert-butylpyridine). Usually, the hole transporting material is selected from spiro-OMeTAD, P3HT, PCPDTBT and PVK. Preferable, the hole transporting material is spiro-OMeTAD.

When the charge transporting material is an hole transporting material, the charge transporting material may, for instance, be a molecular hole transporter, or a polymer or copolymers. Often, the charge transporting material is a molecular hole transporting material, a polymer or copolymer comprises one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl.

Alternatively, when the charge transporting material is an hole transporting material, the charge transporting material may be an inorganic hole transporter, for instance, CuI, CuBr, CuSCN, $Cu_2O$, CuO or CIS.

In one embodiment, in the optoelectronic device of the invention, the porous layer of a semiconductor has a thickness of from 50 nm to 3 μm, for instance the thickness may be from 100 nm to 2 μm. Often, the porous layer of an n-type semiconductor has a thickness of 0.6 μm.

Typically, in the optoelectronic device of the invention, the distance between the second electrode and the porous layer of an n-type semiconductor is from 50 nm to 400 nm, more typically from 150 nm to 250 nm. Often, the distance between the second electrode and the porous layer of an n-type semiconductor is around 200 nm.

Often, the optoelectronic device of the invention is a photovoltaic device, wherein the AM1.5G 100 mWcm$^{-2}$ power conversion efficiency of the device is equal to or greater than 7.3%. Typically, the AM1.5G 100 mWcm$^{-2}$ power conversion efficiency of the device is equal to or greater than 11.5%.

Typically, the optoelectronic device of the invention is a photovoltaic device, wherein the photocurrent is equal to or greater than 15 mAcm$^{-2}$. More typically, the optoelectronic device of the invention is a photovoltaic device, wherein the photocurrent is equal to or greater than 20 mAcm$^{-2}$.

Usually, in the optoelectronic device of the invention the perovskite does not decompose when exposed to oxygen or moisture for a period of time equal to or greater than 10 minutes. Typically, the perovskite does not decompose when exposed to oxygen or moisture for a period of time equal to or greater than 24 hours.

The invention further provides a mixed-halide perovskite of the formula (I)

$$[A][B][X]_3 \tag{I}$$

wherein:
[A] is at least one organic cation of the formula $(R_1R_2R_3R_4N)^+$, wherein:
(i) $R_1$ is hydrogen, unsubstituted or substituted $C_1$-$C_{20}$ alkyl, or unsubstituted or substituted aryl;
(ii) $R_2$ is hydrogen, unsubstituted or substituted $C_1$-$C_{20}$ alkyl, or unsubstituted or substituted aryl;
(iii) $R_3$ is hydrogen, unsubstituted or substituted $C_1$-$C_{20}$ alkyl, or unsubstituted or substituted aryl; and (iv) $R_4$ is hydrogen, unsubstituted or substituted $C_1$-$C_{20}$ alkyl, or unsubstituted or substituted aryl;

[B] is at least one divalent metal cation; and

[X] is said two or more different halide anions.

Usually, the following proviso apply:

(i) when A is an organic cation which is $(CH_3NH_3)^+$ and B is a divalent metal cation which is $Sn^{2+}$, the mixed-halide perovskite does not comprise: (a) a chloride ion and a bromide ion, or (b) a bromide ion and an iodide ion; and (ii) when A is an organic cation which is $(CH_3NH_3)^+$ and B is a divalent metal cation which is $Pb^{2+}$, the mixed-halide perovskite does not comprise a chloride ion and a bromide ion.

Often, the mixed-halide perovskite is a mixed-halide perovskite of the formula (I)

[A][B][X]$_3$ (I)

wherein:

[A] is at least one organic cation of the formula $(R_1R_2R_3R_4N)^+$, wherein:
(i) $R_1$ is hydrogen, unsubstituted or substituted $C_1$-$C_{20}$ alkyl, or unsubstituted or substituted aryl;
(ii) $R_2$ is hydrogen, unsubstituted or substituted $C_1$-$C_{20}$ alkyl, or unsubstituted or substituted aryl;
(iii) $R_3$ is hydrogen, unsubstituted or substituted $C_1$-$C_{20}$ alkyl, or unsubstituted or substituted aryl; and
(iv) $R_4$ is hydrogen, unsubstituted or substituted $C_1$-$C_{20}$ alkyl, or unsubstituted or substituted aryl;

[B] is at least one divalent metal cation; and

[X] is said two or more different halide anions.

Usually, the following proviso apply:

(i) when A is an organic cation which is $(CH_3NH_3)^+$ and B is a divalent metal cation which is $Sn^{2+}$, the mixed-halide perovskite does not comprise: (a) a chloride ion and a bromide ion, (b) a bromide ion and an iodide ion; or (c) a chloride ion and an iodide ion; and (ii) when A is an organic cation which is $(CH_3NH_3)^+$ and B is a divalent metal cation which is $Pb^{2+}$, the mixed-halide perovskite does not comprise a chloride ion and a bromide ion.

Often, the mixed-halide perovskite is a mixed-halide perovskite of the formula (I)

[A][B][X]$_3$ (I)

wherein:

[A] is at least one organic cation of the formula $(R_1R_2R_3R_4N)^+$, wherein:
(i) $R_1$ is hydrogen, unsubstituted or substituted $C_1$-$C_{20}$ alkyl, or unsubstituted or substituted aryl;
(ii) $R_2$ is hydrogen, unsubstituted or substituted $C_1$-$C_{20}$ alkyl, or unsubstituted or substituted aryl;
(iii) $R_3$ is hydrogen, unsubstituted or substituted $C_1$-$C_{20}$ alkyl, or unsubstituted or substituted aryl; and
(iv) $R_4$ is hydrogen, unsubstituted or substituted $C_1$-$C_{20}$ alkyl, or unsubstituted or substituted aryl;

[B] is at least one divalent metal cation; and

[X] is said two or more different halide anions.

provided that (i) when [A] is a single organic cation which is $(CH_3NH_3)^+$ and [B] is a single metal cation which is $Sn^{2+}$, the mixed-halide perovskite does not comprise: (a) a chloride ion and a bromide ion, or (b) a bromide ion and an iodide ion; and (ii) when [A] is a single organic cation which is $(CH_3NH_3)^+$ and [B] is a single metal cation which is $Pb^{2+}$, the mixed-halide perovskite does not comprise a chloride ion and a bromide ion.

The perovskite of the formula (I) may comprise one, two three, or four different divalent metal cations, typically one or two different divalent metal cations. The perovskite of the formula (I), may, for instance, comprise one, two, three or four different organic cations of the formula $(R_1R_2R_3R_4N)^+$, typically one or two different organic cations of the formula $(R_1R_2R_3R_4N)^+$. The perovskite of the formula (I) may, for instance, comprise two, three or four different halide anions, typically two or three different halide anions.

Often, in the mixed-halide perovskite of the invention, when [B] is a single metal cation which is $Pb^{2+}$, one of said two or more different halide anions is iodide or fluoride; and when [B] is a single metal cation which is $Sn^{2+}$ one of said two or more different halide anions is fluoride.

Typically, in the mixed-halide perovskite of the invention, one of said two or more different halide anions is iodide or fluoride.

Usually, in the mixed-halide perovskite of the invention, one of said two or more different halide anions is fluoride.

Typically, in the mixed-halide perovskite of the invention [X] is two different halide anions X and X'. Typically, they are two or three halide anions, more typically, two different halide anions. Usually the halide anions are selected from fluoride, chloride, bromide and iodide, for instance chloride, bromide and iodide. Alternatively, [X] may be three different halide ions.

Usually, in the mixed-halide perovskite of the invention [B] is at least one divalent metal cation selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$, and $Eu^{2+}$. More usually, [B] is at least one divalent metal cation selected from $Sn^{2+}$ and $Pb^{2+}$.

Typically, [B] is a single divalent metal cation. The single divalent metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$, and $Eu^{2+}$. More usually, [B] is a single divalent metal cation which is $Sn^{2+}$ or $Pb^{2+}$.

Mainly, in the mixed-halide perovskite of the invention $R_1$ in the organic cation is hydrogen, methyl or ethyl, $R_2$ is hydrogen, methyl or ethyl, $R_3$ is hydrogen, methyl or ethyl, and $R_4$ is hydrogen, methyl or ethyl. For instance $R_1$ may be hydrogen or methyl, $R_2$ may be hydrogen or methyl, $R_3$ may be hydrogen or methyl, and $R_4$ may be hydrogen or methyl.

Typically, in the mixed-halide perovskite of the invention the organic cation of the formula $(R_5NH_3)^+$, wherein $R_5$ is hydrogen, or unsubstituted or substituted $C_1$-$C_{20}$ alkyl. $R_5$ may, for instance, be methyl or ethyl. Typically, $R_5$ is methyl.

In one embodiment, the mixed-halide perovskite of the invention is a perovskite compound of formula (II):

$$ABX_{3-y}X'_y \qquad (II)$$

wherein:

A is an organic cation;

B is a divalent metal cation;

X is a first halide anion;

X' is a second halide anion which is different from the first halide anion; and y is from 0.05 to 2.95.

provided that:

(i) when A is an organic cation which is $(CH_3NH_3)^+$ and B is a divalent metal cation which is $Sn^{2+}$, the mixed-halide perovskite does not comprise: (a) a chloride ion and a bromide ion, or (b) a bromide ion and an iodide ion; and (ii) when A is an organic cation which is $(CH_3NH_3)^+$ and B is a divalent metal cation which is $Pb^{2+}$, the mixed-halide perovskite does not comprise a chloride ion and a bromide ion.

Usually, y is from 0.5 to 2.5, for instance from 0.75 to 2.25. Typically, y is from 1 to 2.

Typically, X is iodide and X' is fluoride or chloride, or X is fluoride and X' is chloride, bromide or iodide.

Often X or X' is iodide.

Typically, B is other than $Sn^{2+}$.

Usually, in the mixed-halide perovskite of the invention, X is iodide and X' is fluoride or chloride.

More usually, X or X' is fluoride.

Typically, in the mixed-halide perovskite of the invention, B is $Sn^{2+}$.

Alternatively, in the mixed-halide perovskite of the invention, B is $Pb^{2+}$.

The mixed-halide perovskite of the invention is often selected from $CH_3NH_3PbBrI_2$, $CH_3NH_3PbIBr_2$, $CH_3NH_3PbICl_2$, $CH_3NH_3PbI_2Cl$, $CH_3NH_3SnF_2Br$, $CH_3NH_3SnICl_2$, $CH_3NH_3SnF_2I$, $CH_3NH_3SnI_2Cl$ and $CH_3NH_3SnF_2Cl$. More often, the mixed-halide perovskite of the invention is often selected from $CH_3NH_3PbBrI_2$, $CH_3NH_3PbIBr_2$, $CH_3NH_3PbICl_2$, $CH_3NH_3PbI_2Cl$, $CH_3NH_3SnF_2Br$, $CH_3NH_3SnF_2I$ and $CH_3NH_3SnF_2Cl$. Usually, the perovskite is selected from $CH_3NH_3PbBrI_2$, $CH_3NH_3PbIBr_2$, $CH_3NH_3PbICl_2$, $CH_3NH_3SnF_2Br$, and $CH_3NH_3SnF_2I$.

Usually, the mixed-halide perovskite of the invention does not decompose when exposed to oxygen or moisture for a period of time equal to or greater than 10 minutes. Typically, the perovskite does not decompose when exposed to oxygen or moisture for a period of time equal to or greater than 24 hours.

The invention further provides mixed-halide perovskite of the formula (I)

$$[A][B][X]_3 \qquad (I)$$

wherein:

[A] is at least one organic cation of the formula $(R_5R_6N=CH-NR_7R_8)^+$, wherein:

(i) $R_5$ is hydrogen, unsubstituted or substituted $C_1$-$C_{20}$ alkyl, or unsubstituted or substituted aryl;

(ii) $R_6$ is hydrogen, unsubstituted or substituted $C_1$-$C_{20}$ alkyl, or unsubstituted or substituted aryl;

(iii) $R_7$ is hydrogen, unsubstituted or substituted $C_1$-$C_{20}$ alkyl, or unsubstituted or substituted aryl; and (iv) $R_8$ is hydrogen, unsubstituted or substituted $C_1$-$C_{20}$ alkyl, or unsubstituted or substituted aryl;

[B] is at least one divalent metal cation; and

[X] is two or more different halide anions.

The perovskite of the formula (I) may comprise one, two three, or four different divalent metal cations, typically one or two different divalent metal cations. The perovskite of the formula (I), may, for instance, comprise one, two, three or four different organic cations of the formula $(R_5R_6N=CH-NR_7R_8)^+$, typically one or two different organic cations of the formula $(R_5R_6N=CH-NR_7R_8)^+$. The perovskite of the formula (I) may, for instance, comprise two, three or four different halide anions, typically two or three different halide anions.

Typically, [X] is two different halide anions X and X'. Typically, they are two or three halide anions, more typically, two different halide anions. Usually the halide anions are selected from fluoride, chloride, bromide and iodide, for instance chloride, bromide and iodide. The halide anions may, for instance, be iodine and bromine. Alternatively, [X] may be three different halide ions.

Usually, [B] is at least one divalent metal cation selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$, and $Eu^{2+}$. More usually, [B] is at least one divalent metal cation selected from $Sn^{2+}$ and $Pb^{2+}$, for instance, $Pb^{2+}$.

Typically, [B] is a single divalent metal cation. The single divalent metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$, and $Eu^{2+}$. More usually, [B] is a single divalent metal cation which is $Sn^{2+}$ or $Pb^{2+}$, for instance, $Pb^{2+}$.

Mainly, in the mixed-halide perovskite of the invention $R_5$ in the organic cation is hydrogen, methyl or ethyl, $R_6$ is hydrogen, methyl or ethyl, $R_7$ is hydrogen, methyl or ethyl, and $R_8$ is hydrogen, methyl or ethyl. For instance $R_5$ may be hydrogen or methyl, $R_6$ may be hydrogen or methyl, $R_7$ may be hydrogen or methyl, and $R_8$ may be hydrogen or methyl.

Typically, in the mixed-halide perovskite of the invention the organic cation of the formula $(H_2N=CH-NH_2)^+$.

In one embodiment, the mixed-halide perovskite is a perovskite compound of formula (IIa):

$$ABX_{3z}X'_{3(1-z)} \qquad (IIa)$$

wherein:

A is an organic cation of the formula $(R_5R_6N=CH-NR_7R_8)^+$, wherein:

(i) $R_5$ is hydrogen, unsubstituted or substituted $C_1$-$C_{20}$ alkyl, or unsubstituted or substituted aryl;

(ii) $R_6$ is hydrogen, unsubstituted or substituted $C_1$-$C_{20}$ alkyl, or unsubstituted or substituted aryl;

(iii) $R_7$ is hydrogen, unsubstituted or substituted $C_1$-$C_{20}$ alkyl, or unsubstituted or substituted aryl; and (iv) $R_8$ is hydrogen, unsubstituted or substituted $C_1$-$C_{20}$ alkyl, or unsubstituted or substituted aryl;

B is an metal cation selected from $Sn^{2+}$ and $Pb^{2+}$;

X is a first halide anion;

X' is a second halide anion which is different from the first halide anion; and z is greater than 0 and less than 1.

Usually, z is from 0.05 to 0.95, for instance, from 0.1 to 0.9. z may, for instance, be 0.1, 0.2, 0.3, 0.4, 0.5, 0.6, 0.7, 0.8 or 0.9, or z may be a range of from any one of these values to any other of these values (for instance from 0.2 to 0.7, or from 0.1 to 0.8).

Typically, X is iodide and X' is fluoride, bromide or chloride, for instance, X is iodide and X' is bromide.

Typically, B is $Pb^{2+}$.

Usually, the organic cation is $(R_5R_6N=CH-NR_7R_8)^+$, wherein: $R_5$, $R_6$, $R_7$ and $R_8$ are independently selected from hydrogen and unsubstituted or substituted $C_1$-$C_6$ alkyl. For instance, the organic cation may be $(H_2N=CH-NH_2)^+$.

The mixed-halide perovskite may, for instance, have the formula: $(H_2N=CHNH_2)Pb_{3z}Br_{3(1-z)}$, wherein z is greater than 0 and less than 1. Usually, z is from 0.05 to 0.95, for instance, from 0.1 to 0.9. z may, for instance, be 0.1, 0.2, 0.3, 0.4, 0.5, 0.6, 0.7, 0.8 or 0.9, or z may be a range of from any one of these values to any other of these values (for instance z may be from 0.2 to 0.7, or from 0.1 to 0.8).

Usually, the mixed-halide perovskite of the invention does not decompose when exposed to oxygen or moisture for a period of time equal to or greater than 10 minutes. Typically, the perovskite does not decompose when exposed to oxygen or moisture for a period of time equal to or greater than 24 hours.

The invention further provides the use of a mixed-anion perovskite as a sensitizer in an optoelectronic device, wherein the mixed-anion perovskite comprises two or more different anions selected from halide anions and chalcogenide anions. The perovskite is a perovskite as defined herein.

Often, in the use of the invention, the optoelectronic device is a photovoltaic device.

Alternatively, in the use of the invention, the optoelectronic device is a light-emitting device, for instance a light-emitting diode.

Usually, the optoelectronic device of the invention is a photovoltaic device, wherein the AM1.5G 100 mWcm$^{-2}$ power conversion efficiency of the device is equal to or greater than 7.3%. Typically, the AM1.5G 100 mWcm$^{-2}$ power conversion efficiency of the device is equal to or greater than 11.5%.

Typically, the optoelectronic device of the invention is a photovoltaic device, wherein the photocurrent is equal to or greater than 15 mAcm$^{-2}$. More typically, the optoelectronic device of the invention is a photovoltaic device, wherein the photocurrent is equal to or greater than 20 mAcm$^{-2}$.

The invention also provides a photosensitizing material for an optoelectronic device comprising a mixed-anion perovskite wherein the mixed-anion perovskite comprises two or more different anions selected from halide anions and chalcogenide anions. The perovskite is a perovskite as defined herein.

The optoelectronic device of the invention may further comprise encapsulated metal nanoparticles. For instance, the optoelectronic device of the invention may further comprise encapsulated metal nanoparticles disposed between the first and second electrodes.

The mixed-anion perovskites used in the devices of the invention, i.e., the perovskites which comprise two or more different anions selected from halide anions and chalcogenide anions, can be produced by a process comprising mixing:

(a) a first compound comprising (i) a first cation and (ii) a first anion; with (b) a second compound comprising (i) a second cation and (ii) a second anion, wherein:

the first and second cations are as herein defined; and the first and second anions are different anions selected from halide anions and chalcogenide anions. Typically, the first and second anions are different anions selected from halide anions.

Alternatively the process may comprising (1) treating: (a) a first compound comprising (i) a first cation and (ii) a first anion; with (b) a second compound comprising (i) a second cation and (ii) a first anion, to produce a first product, wherein: the first and second cations are as herein defined; and the first anion is selected from halide anions and chalcogenide anions; and (2) treating (a) a first compound comprising (i) a first cation and (ii) a second anion; with (b) a second compound comprising (i) a second cation and (ii) a second anion, to produce a second product, wherein: the first and second cations are as herein defined; and the second anion is selected from halide anions and chalcogenide anions. Usually, the first and second anions are different anions selected from halide anions and chalcogenide anions. Typically, the first and second anions are different anions selected from halide anions. The process usually further comprises treating a first amount of the first product with a second amount of the second product, wherein the first and second amounts may be the same or different.

The mixed-anion perovskite produced by the process may comprise further cations or further anions. For example, the mixed-anion perovskite may comprise two, three or four different cations, or two, three of four different anions. The process for producing the mixed-anion perovskite may therefore comprise mixing further compounds comprising a further cation or a further anion. Additionally or alternatively, the process for producing the mixed-anion perovskite may comprise mixing (a) and (b) with: (c) a third compound comprising (i) the first cation and (ii) the second anion; or (d) a fourth compound comprising (i) the second cation and (ii) the first anion.

Typically, in the process for producing the mixed-anion perovskite, the second cation in the mixed-anion perovskite is a metal cation. More typically, the second cation is a divalent metal cation. For instance, the first cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Y^{2+}$ and $Eu^{2+}$. Usually, the second cation is selected from $Sn^{2+}$ and $Pb^{2+}$.

Often, in the process for producing the mixed-anion perovskite, the first cation in the mixed-anion perovskite is an organic cation.

Usually, the organic cation has the formula $(R_1R_2R_3R_4N)^+$, wherein:

$R_1$ is hydrogen, unsubstituted or substituted $C_1$-$C_{20}$ alkyl, or unsubstituted or substituted aryl;

$R_2$ is hydrogen, unsubstituted or substituted $C_1$-$C_{20}$ alkyl, or unsubstituted or substituted aryl;

$R_3$ is hydrogen, unsubstituted or substituted $C_1$-$C_{20}$ alkyl, or unsubstituted or substituted aryl; and $R_4$ is hydrogen, unsubstituted or substituted $C_1$-$C_{20}$ alkyl, or unsubstituted or substituted aryl.

Mainly, in the organic cation, $R_1$ is hydrogen, methyl or ethyl, $R_2$ is hydrogen, methyl or ethyl, $R_3$ is hydrogen, methyl or ethyl, and $R_4$ is hydrogen, methyl or ethyl. For instance $R_1$ may be hydrogen or methyl, $R_2$ may be hydrogen or methyl, $R_3$ may be hydrogen or methyl, and $R_4$ may be hydrogen or methyl.

Alternatively, the organic cation may have the formula $(R_5NH_3)^+$, wherein: $R_5$ is hydrogen, or unsubstituted or substituted $C_1$-$C_{20}$ alkyl. For instance, $R_5$ may be methyl or ethyl. Typically, $R_5$ is methyl.

In another embodiment, the organic cation has the formula $(R_5R_6N=CH-NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl. The organic cation may, for instance, be $(R_5R_6N=CH-NR_7R_8)^+$, wherein: $R_5$, $R_6$, $R_7$ and $R_8$ are independently selected from hydrogen, unsubstituted or substituted $C_1$-$C_{20}$ alkyl, and unsubstituted or substituted aryl. For instance, the organic cation may be $(H_2N=CH-NH_2)^+$.

In the process for producing the mixed-anion perovskite, the perovskite is usually a mixed-halide perovskite, wherein said two or more different anions are two or more different halide anions.

Typically, in the process for producing the mixed-anion perovskite, the perovskite is a perovskite compound of the formula (I):

$$[A][B][X]_3 \qquad (I)$$

wherein:

[A] is at least one organic cation;

[B] is at least one metal cation; and

[X] is said two or more different anions; and the process comprises mixing:

(a) a first compound comprising (i) a metal cation and (ii) a first anion; with (b) a second compound comprising (i) an organic cation and (ii) a second anion, wherein:

the first and second anions are different anions selected from halide anions or chalcogenide anions.

The perovskite of the formula (I) may, for instance, comprise one, two, three or four different metal cations, typically one or two different metal cations. The perovskite of the formula (I), may, for instance, comprise one, two, three or four different organic cations, typically one or two different organic cations. The perovskite of the formula (I), may, for instance, comprise two, three or four different anions, typically two or three different anions.

The process may, therefore, comprising mixing further compounds comprising a cation and an anion.

Typically, [X] is two or more different halide anions. The first and second anions are thus typically halide anions. Alternatively, [X] may be three different halide ions. Thus the process may comprise mixing a third compound with the first and second compound, wherein the third compound comprises (i) a cation and (ii) a third halide anion, where the third anion is a different halide anion from the first and second halide anions.

Often, in the process for producing the mixed-anion perovskite, the perovskite is a perovskite compound of the formula (IA):

wherein:
A is an organic cation;
B is a metal cation; and
[X] is said two or more different anions.
the process comprises mixing:

(a) a first compound comprising (i) a metal cation and (ii) a first halide anion; with (b) a second compound comprising (i) an organic cation and (ii) a second halide anion:
wherein:
the first and second halide anions are different halide anions.

Usually, [X] is two or more different halide anions. Preferably, [X] is two or three different halide anions. More preferably, [X] is two different halide anions. In another embodiment [X] is three different halide anions.

Typically, in the process for producing the mixed-anion perovskite, the perovskite is a perovskite compound of formula (II):

wherein:
A is an organic cation;
B is a metal cation;
X is a first halide anion;
X' is a second halide anion which is different from the first halide anion; and
y is from 0.05 to 2.95; and
the process comprises mixing:

(a) a first compound comprising (i) a metal cation and (ii) X; with (b) a second compound comprising (i) an organic cation and (ii) X':
wherein X' is different from X; and
wherein the ratio of X to X' in the mixture is equal to (3-y):y.

In order to achieve said ratio of X to X' equal to (3-y):y, the process may comprise mixing a further compound with the first and second compounds. For example, the process may comprise mixing a third compound with the first and second compounds, wherein the third compound comprises (i) the metal cation and (ii) X'. Alternative, the process may comprising mixing a third compound with the first and second compounds, wherein the third compound comprises (i) the organic cation and (ii) X.

Usually, y is from 0.5 to 2.5, for instance from 0.75 to 2.25. Typically, y is from 1 to 2.

Typically, in the process for producing the mixed-anion perovskite, the first compound is $BX_2$ and the second compound is AX'.

Often the second compound is produce by reacting a compound of the formula ($R_5NH_2$), wherein: $R_5$ is hydrogen, or unsubstituted or substituted $C_1$-$C_{20}$ alkyl, with a compound of formula HX'. Typically, $R_5$ may be methyl or ethyl, often $R_5$ is methyl.

Usually, the compound of formula ($R_5NH_2$) and the compound of formula HX' are reacted in a 1:1 molar ratio. Often, the reaction takes place under nitrogen atmosphere and usually in anhydrous ethanol. Typically, the anhydrous ethanol is about 200 proof. More typically from 15 to 30 ml of the compound of formula ($R_5NH_2$) is reacted with about 15 to 15 ml of HX', usually under nitrogen atmosphere in from 50 to 150 ml anhydrous ethanol. The process may also comprise a step of recovering said mixed-anion perovskite. A rotary evaporator is often used to extract crystalline AX'.

Usually, the step of mixing the first and second compounds is a step of dissolving the first and second compounds in a solvent. The first and second compounds may be dissolved in a ratio of from 1:20 to 20:1, typically a ratio of 1:1. Typically the solvent is dimethylformamide (DMF) or water. When the metal cation is $Pb^{2+}$ the solvent is usually dimethylformamide. When the metal cation is $Sn^{2+}$ the solvent is usually water. The use of DMF or water as the solvent is advantageous as these solvents are not very volatile.

Often, in the process for producing the mixed-anion perovskite, [B] is a single metal cation which is $Pb^{2+}$, one of said two or more different halide anions is iodide or fluoride; and when [B] is a single metal cation which is $Sn^{2+}$ one of said two or more different halide anions is fluoride.

Typically, in the process for producing the mixed-anion perovskite X or X' is iodide. Alternatively, X or X' is fluoride.

Often, in the process for producing the mixed-anion perovskite, the perovskite is a perovskite selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$. Typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnICl_2$, $CH_3NH_3SnF_2I$, $CH_3NH_3SnI_2Cl$ and $CH_3NH_3SnF_2Cl$. More typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnF_2I$ and $CH_3NH_3SnF_2Cl$. Usually, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3SnF_2Br$, and $CH_3NH_3SnF_2I$.

In some embodiments, in the process for producing the mixed-anion perovskite, the perovskite is a perovskite compound of formula (IIa):

wherein:
A is an organic cation of the formula ($R_5R_6N=CH—NR_7R_8$)$^+$, wherein: (i) $R_5$ is hydrogen, unsubstituted or substituted $C_1$-$C_{20}$ alkyl, or unsubstituted or substituted aryl; (ii) $R_6$ is hydrogen, unsubstituted or substituted $C_1$-$C_{20}$ alkyl, or unsubstituted or substituted aryl; (iii) $R_7$ is hydrogen, unsubstituted or substituted $C_1$-$C_{20}$ alkyl, or unsubstituted or substituted aryl; and (iv) $R_8$ is hydrogen, unsubstituted or substituted $C_1$-$C_{20}$ alkyl, or unsubstituted or substituted aryl;

B is a metal cation selected from $Sn^{2+}$ and $Pb^{2+}$;

X is a first halide anion;

X' is a second halide anion which is different from the first halide anion; and z is greater than 0 and less than 1;

and the process comprises:

(1) treating: (a) a first compound comprising (i) the metal cation and (ii) X, with (b) a second compound comprising (i) the organic cation and (ii) X, to produce a first product;

(2) treating: (a) a first compound comprising (i) the metal cation and (ii) X', with (b) a second compound comprising (i) the organic cation and (ii) X', to produce a second product; and (3) treating a first amount of the first product with a second amount of the second product, wherein the first and second amounts may be the same or different.

Usually z is from 0.05 to 0.95. z may be as further defined hereinbefore.

In the process for producing a mixed-anion perovskite, the perovskite may, for instance, have the formula $(H_2N=CH-NH_2)PbI_{3z}Br_{3(1-z)}$, wherein z is as defined hereinabove.

The process for producing an optoelectronic device is usually a process for producing a device selected from: a photovoltaic device; a photodiode; a phototransistor; a photomultiplier; a photo resistor; a photo detector; a light-sensitive detector; solid-state triode; a battery electrode; a light-emitting device; a light-emitting diode; a transistor; a solar cell; a laser; and a diode injection laser. Typically, the optoelectronic device is a photovoltaic device.

Usually, the process for producing an optoelectronic device is usually a process for producing a photovoltaic device. More usually, the device is a solar cell.

Alternatively, process for producing an optoelectronic device may be a process for producing a light-emitting device, for instance a light-emitting diode.

The process for producing an optoelectronic device, wherein the optoelectronic device comprises:

a first electrode;

a second electrode; and, disposed between the first and second electrodes:

(a) said perovskite.

is usually a process comprising:

(i) providing a first electrode;

(ii) depositing said perovskite; and (iii) providing a second electrode.

As the skilled person will appreciate, the process for producing an optoelectronic device will vary depending on the optoelectronic device being made, and in particular depending upon the different components of the device. The process which is discusses below and exemplified is a process for producing an optoelectronic device which comprises: a first electrode; a second electrode; and, disposed between the first and second electrodes: (a) an n-type layer; (b) said perovskite; and (c) a p-type layer. However, as the skilled person will appreciate, the same process may be used to produce other devices of the invention, having different components and different layer structures. These include, for instance, optoelectronic devices of the invention which comprise: a first electrode; a second electrode; and, disposed between the first and second electrodes: (a) a thin film comprising said perovskite. Also, the process described herein can be used to produce optoelectronic devices comprising: a first electrode; a second electrode; and, disposed between the first and second electrodes: (a) a layer of a semiconductor; and (b) said perovskite, or optoelectronic devices comprising: a first electrode; a second electrode; and, disposed between the first and second electrodes: (a) an n-type layer; and (b) said perovskite, or optoelectronic devices may comprising: a first electrode; a second electrode; and, disposed between the first and second electrodes: (a) a p-type layer; and (b) said perovskite.

The process for producing an optoelectronic device, wherein the optoelectronic device comprises:

a first electrode;

a second electrode; and, disposed between the first and second electrodes:

(a) an n-type layer;

(b) said perovskite; and (c) a p-type layer;

is usually a process comprising:

(i) providing a first electrode;

(ii) depositing a layer of an n-type material;

(iii) depositing said perovskite;

(iv) depositing a layer of of p-type material; and (v) providing a second electrode.

The first and second electrodes are an anode and a cathode, one or both of which is transparent to allow the ingress of light. The choice of the first and second electrodes of the optoelectronic devices of the present invention may depend on the structure type. Typically, the n-type layer is deposited onto a tin oxide, more typically onto a fluorine-doped tin oxide (FTO) anode, which is usually a transparent or semi-transparent material. Thus, the first electrode is usually transparent or semi-transparent and typically comprises FTO. Usually, the thickness of the first electrode is from 200 nm to 600 nm, more usually, from 300 to 500 nm. For example the thickness may be 400 nm. Typically, FTO is coated onto a glass sheet. Often, the TFO coated glass sheets are etched with zinc powder and an acid to produce the required electrode pattern. Usually the acid is HCl. Often the concentration of the HCl is about 2 molar. Typically, the sheets are cleaned and then usually treated under oxygen plasma to remove any organic residues. Usually, the treatment under oxygen plasma is for less than or equal to 1 hour, typically about 5 minutes.

Usually, the second electrode comprises a high work function metal, for instance gold, silver, nickel, palladium or platinum, and typically silver. Usually, the thickness of the second electrode is from 50 nm to 250 nm, more usually from 100 nm to 200 nm. For example, the thickness of the second electrode may be 150 nm.

Usually, the n-type layer comprises a metal oxide semiconductor and the p-type layer comprises a hole transporting material. The metal oxide semiconductor and the hole transporting material are as herein defined.

Alternatively, the p-type layer comprises a metal oxide semiconductor and the n-type layer comprises an electron transporting material. For instance, the metal oxide semiconductor may comprise an oxide of nickel, molybdenum, copper or vanadium, or a mixture thereof. Often, the electron transporting material comprises a fullerene or perylene, or derivatives thereof, or P(NDI2OD-T2)). For instance, the electron transporting material may be P(NDI2OD-T2).

In one embodiment, the optoelectronic device may be a thin film device. Usually, the n-type layer will comprise a metal oxide, sulphide, selenide or telluride. Often, the metal oxide will be oxide an oxide of titanium, tin, zinc, niobium, tantalum, tungsten, indium, gallium, neodinium, palladium or cadmium, or a mixture thereof. For instance, the n-type layer may comprise $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PbO, or CdO. Often, the metal oxide is $TiO_2$. Typically, the sulphide will be a sulphide of cadmium, tin, copper, zinc or a mixture thereof. For instance, the sulphide may be $FeS_2$, CdS or $Cu_2ZnSnS_4$. Usually, the selenide will be a selenide of cadmium, zinc, indium or gallium or a mixture thereof. For instance, the selenide may be $Cu(In,Ga)Se_2$. Typically, the tellenide is a tellenide of cadmium, zinc, cadmium or tin. For instance, the tellenide may be CdTe.

The optoelectronic device may comprise a tunnel junction. For instance, the optoelectronic device may be a multi-junction solar cell or tandem cell.

In one embodiment of the process for producing the photovoltaic device, the device comprising:
  a first electrode;
  a second electrode; and, disposed between the first and second electrodes:
  (a) a porous layer of a semiconductor;
  (b) a sensitizer material comprising said perovskite; and
  (c) a charge transporting material; and
the process comprises:
  (i) providing a first electrode;
  (ii) depositing a porous layer of a semiconductor;
  (iii) depositing a sensitizer comprising said perovskite;
  (iv) depositing a charge transporting material; and
  (v) providing a second electrode.

Usually, the porous layer of a semiconductor comprises an oxide of titanium, aluminium, tin, zinc or magnesium. The porous layer may comprise a mixture of oxides of titanium, aluminium, tin, zinc or magnesium. Typically, the porous layer comprises oxide an oxide of titanium, tin, zinc, niobium, tantalum, tungsten, indium, gallium, neodinium, palladium or cadmium, or a mixture thereof. For instance, the layer may comprise $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PbO, or CdO. Typically, the porous layer of a semiconductor comprises $TiO_2$. More typically, the porous layer of a semiconductor comprises mesoporous $TiO_2$.

A metal oxide paste is typically used to produce the porous layer of metal oxide. More typically, $TiO_2$ nanoparticle paste is used. The deposition of the porous layer of a semiconductor usually comprises a step doctor-blade coating, screen printing or spin-coating the paste. The porous layer of a semiconductor is usually has a thickness of from 50 nm to 3 μm, for instance the thickness may be from 200 nm to 2 μm. Often, the thickness of the layer may be 0.6 μm. Usually, in the step of depositing a porous layer of an n-type semiconductor, the layer is heated to a first temperature of from 400 to 600° C., typically to a temperature of about 500° C. The temperature of the porous layer of a semiconductor is ramped up slowly to the first temperature, typically over a period of time of from 15 to 45 minutes, typically over about 30 minute.

Typically, the step of depositing a porous layer of a semiconductor further comprises a step of surface treating the layer of an a semiconductor. The surface treatment step may be used to improve the packing of said sensitizer of the layer of a semiconductor. Additionally or alternatively, the surface treatment step may be to provide a blocking layer between said sensitizer of the layer of a semiconductor. A self-assembled monolayer of $C_{60}$ may be used as said blocking layer. Often, the compositions used in the surface treatment step may be selected from $C_{60}$, a metal chloride, a metal oxide, a dye and CDCA. The metal oxide, may, for instance, be selected from MgO, $SiO_2$, NiO and $Al_2O_3$. Often, the metal chloride has the formula $MY_4$, wherein M is a metal cation, typically $Ti^{4+}$ and X is a halide anion, typically chloride. Usually, the layer of a semiconductor is placed in a solution of the metal chloride. Often, the solution is a solution of from 0.005 to 0.03 M of aqueous solution of $TiCl_4$. More often, the solution is a solution of about 0.015 M of aqueous solution of $TiCl_4$. Usually, the layer of an n-type semiconductor is placed in the solution for from 30 minutes to 2 hours, typically for about 1 hour. Usually, the solution is at a first temperature of from 50 to 100° C., usually about 70° C. Often, after the layer of a semiconductor has been placed in a solution of formula $MY_4$, the layer is washed, typically with deionised water. The layer of a semiconductor may then be dried in air and/or heated to a second temperature of at least 500° C., typically to a second temperature of from 500 to 600° C. For instance, the layer of a semiconductor may be heated to a second temperature of about 500° C. The layer of an n-type semiconductor may be left to dwell at the second temperature for a period of at least 30 minutes. Typically the dwell time is from 30 minutes to 2 hours, usually about 45 minutes. Often, when the layer of a semiconductor is at the second temperature, the layer is exposed to a flow of air. Usually, the layer of a semiconductor is then cooled to a third temperature of from 50 to 150° C., typically a third temperature of about 70° C. Usually, the layer of a semiconductor is then left is a dye solution for a period of from 5 hours to 24 hours, typically a period of about 12 hours.

The layer of a semiconductor is typically deposited onto a compact layer of a semiconductor. Usually, the compact layer of a semiconductor comprises an oxide of titanium, tin, zinc, niobium, tantalum, tungsten, indium, gallium, neodinium, palladium or cadmium, or a mixture thereof. For instance, the layer may comprise $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PbO, or CdO. Typically, the compact layer of a semiconductor comprises $TiO_2$. Often, the compact layer is deposited on the first electrode. The process for producing the photovoltaic device thus usually comprise a step of depositing a compact layer of a semiconductor.

The step of depositing a compact layer of a semiconductor may, for instance, comprise depositing the compact layer of a semiconductor by aerosol spray pyrolysis deposition. Typically, the aerosol spray pyrolysis deposition comprises deposition of a solution comprising titanium diisopropoxide bis(acetylacetonate), usually at a temperature of from 200 to 300° C., often at a temperature of about 250° C. Usually the solution comprises titanium diisopropoxide bis(acetylacetonate) and ethanol, typically in a ratio of from 1:5 to 1:20, more typically in a ratio of about 1:10.

Often, the step of depositing a compact layer of a semiconductor is a step of depositing a compact layer of a semiconductor of thickness from 50 nm to 200 nm, typically a thickness of about 100 nm.

In the step of depositing a sensitizer comprising said perovskite, said perovskite is a perovskite as described herein. The step of depositing a sensitizer comprising said perovskite usually comprises depositing the sensitizer on the porous layer of a semiconductor. Often, the step of depositing a sensitizer comprising said perovskite comprises spin coating said perovskite. The spin coating usually occurs in air, typically at a speed of from 1000 to 2000 rpm, more typically at a speed of about 1500 rpm and/or often for a period of from 15 to 60 seconds, usually for about 30 seconds. The sensitizer is usually placed in a solvent prior to the spin coating. Usually the solvent is DMF and typically the volume of solution used id from 1 to 200 μl, more typically from 20 to 100 μl. The concentration of the solution is often of from 1 to 50 vol % perovskite, usually from 5 to 40 vol %. The solution may be, for instance, dispensed onto the layer of a porous layer of a semiconductor prior to said spin coating and left for a period of about 5 to 50 second, typically about 20 seconds. After spin coating the sensitizer the layer of a sensitizer comprising said perovskite is typically placed at a temperature of from 75 to 125° C., more typically a temperature of about 100° C. The layer of a sensitizer comprising said perovskite is then usually left at this temperature for a period of at least 30 minutes, more usually a period of from 30 to 60 minutes. Often, the layer of a sensitizer comprising said perovskite is left at this temperature for a period of about 45 minutes. Typically, the layer of a sensitizer comprising said perovskite will change colour, for example from light yellow to dark brown. The colour change may be used to indicate the formation of the desired sensitizer layer.

Usually, the perovskite is said sensitizer does not decompose when exposed to oxygen or moisture for a period of time equal to or greater than 10 minutes. Typically, the perovskite does not decompose when exposed to oxygen or moisture for a period of time equal to or greater than 24 hours.

Often the step of depositing a sensitizer comprising said perovskite, may comprise depositing said perovskite and a single-anion perovskite, wherein said single anion perovskite comprises a first cation, a second cation and an anion selected from halide anions and chalcogenide anions; wherein the first and second cations are as herein defined for said mixed-anion perovskite. For instance, the sensitizer may comprise: $CH_3NH_3PbICl_2$ and $CH_3NH_3PbI_3$; $CH_3NH_3PbICl_2$ and $CH_3NH_3PbBr_3$; $CH_3NH_3PbBrCl_2$ and $CH_3NH_3PbI_3$; or $CH_3NH_3PbBrCl_2$ and $CH_3NH_3PbBr_3$.

Alternatively, the step of depositing a sensitizer comprising said perovskite, may comprise depositing more than one perovskite, wherein each perovskite is a mixed-anion perovskite, and wherein said mixed-anion perovskite is as herein defined. For instance, the sensitizer may comprise two or three said perovskites. The sensitizer may comprise two perovskites wherein both perovskites are mixed-anion perovskites. For instance, the sensitizer may comprise: $CH_3NH_3PbICl_2$ and $CH_3NH_3PbIBr_2$; $CH_3NH_3PbICl_2$ and $CH_3NH_3PbBrI_2$; $CH_3NH_3PbBrCl_2$ and $CH_3NH_3PbIBr_2$; or $CH_3NH_3PbBrCl_2$ and $CH_3NH_3PbIBr_2$.

As a further alternative, the step of depositing a sensitizer comprising said perovskite, may comprise depositing at least one perovskite, for instance, at least one perovskite having the formula $(H_2N=CH-NH_2)PbI_{3z}Br_{3(1-z)}$.

The step of depositing a charge transporting material usually comprises depositing a charge transporting material that is a solid state hole transporting material or a liquid electrolyte. The hole transporting material in the optoelectronic device of the invention may be any suitable n-type or electron transporting, semiconducting material, or any p-type or hole-transporting, semiconducting material.

When the charge transporting material is an electron transporting material, the charge transporting material may comprise a fullerene or perylene, or derivatives thereof, poly{[N,N0-bis(2-octyldodecyl)-naphthalene-1,4,5,8-bis(dicarboximide)-2,6-diyl]-alt-5,50-(2,20-bithiophene)} (P(NDI2OD-T2)), or an electrolyte.

When the charge transporting material is an hole transporting material, the hole transporting material in the optoelectronic device of the invention may be a small molecular or polymer-based hole conductor.

Typically, when the charge transporting material is an hole transporting material, the charge transporting material is a solid state hole transporting material or a liquid electrolyte.

Often, when the charge transporting material is an hole transporting material, the charge transporting material is a polymeric or molecular hole transporter. Typically, the hole transporting material comprises spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b: 3,4-b']dithiophene-2,6-diyl]]), PVK (poly (N-vinylcarbazole)), HTM-TFSI (1-hexyl-3-methylimidazolium bis(trifluoromethylsulfonyl)imide), Li-TFSI (lithium bis(trifluoromethanesulfonyl)imide) or tBP (tert-butylpyridine). Usually, the hole transporting material is selected from spiro-OMeTAD, P3HT, PCPDTBT and PVK. Preferable, the hole transporting material is spiro-OMeTAD.

When the charge transporting material is an hole transporting material, the charge transporting material may, for instance, be a molecular hole transporter, or a polymer or copolymers. Often, the charge transporting material is a molecular hole transporting material, a polymer or copolymer comprises one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl.

Alternatively, when the charge transporting material is an hole transporting material, the charge transporting material may be an inorganic hole transporter, for instance, CuI, CuBr, CuSCN, $Cu_2O$, CuO or CIS.

Prior to the step of depositing a charge transporting material, the charge transporting material is often dissolved in a solvent, typically chlorobenzene. Usually the concentration of cholorbenzene is from 150 to 225 mg/ml, more usually the concentration is about 180 mg/ml.

Typically, the charge transporting material is dissolved in the solvent at a temperature of from 75 to 125° C., more typically at a temperature of about 100° C. Usually the charge transporting material is dissolved for a period of from 25 minutes to 60 minutes, more usually a period of about 30 minutes. An additive may be added to the charge transporting material. The additive may be, for instance, tBP, Li-TFSi, an ionic liquid or an ionic liquid with a mixed halide(s).

Usually, the charge transporting material is spiro-OMeTAD. Often, tBP is also added to the charge transporting material prior to the step of depositing a charge transporting material. For instance, tBP may be added in a volume to mass ratio of from 1:20 to 1:30 μl/mg tBP:spiro-OMeTAD. Typically, tBP may be added in a volume to mass ratio of 1:26 μl/mg tBP:spiro-OMeTAD. Additionally or alternatively, Li-TFSi may be added to the hole transporting material prior to the step of depositing a charge transporting material. For instance, Li-TFSi may be added at a ratio of from 1:5 to 1:20 μl/mg Li-TFSi:spiro-OMeTAD. Usually Li-TFSi may be added at a ratio of 1:12 μl/mg Li-TFSi:spiro-OMeTAD.

The step of depositing a charge transporting material often comprises spin coating a solution comprising the charge transporting material onto the sensitizer material comprising said perovskite. Usually, prior to spin coating, a small quantity of the solution comprising the charge transporting material is deposited onto the sensitizer comprising said perovskite. The small quantity is usually from 5 to 100 µl, more usually from 20 to 70 µl. The solution comprising the charge transporting material is typically left for a period of at least 5 seconds, more typically a period of from 5 to 60 seconds, prior to spin coating. For instance, the solution comprising the charge transporting material be left for a period of about 20 seconds prior to spin coating. The spin coating of the charge transporting material is usually carried out at from 500 to 3000 rpm, typically at about 1500 rpm. The spin coating is often carried our for from 10 to 40 seconds in air, more often for about 25 seconds.

The step of producing a second electrode usually comprises a step of depositing the second electrode on to the charge transporting material. Typically, the second electrode is an electrode comprising silver. Often, the step of producing a second electrode comprises placing a film comprising the charge transporting material in a thermal evaporator. Usually, the step of producing a second electrode comprises deposition of the second electrode through a shadow mask under a high vacuum. Typically, the vacuum is about $10^{-6}$ mBar. The second electrode may, for example, be an electrode of a thickness from 100 to 300 nm. Typically, the second electrode is an electrode of a thickness from 200 nm.

Typically, the distance between the second electrode and the porous layer of a semiconductor is from 50 nm to 400 nm, more typically from 150 nm to 250 nm. Often, the distance between the second electrode and the porous layer of a semiconductor is around 200 nm.

Often, the process for producing an the optoelectronic device of the invention is a process for producing a photovoltaic device, wherein the AM1.5G 100 mWcm$^{-2}$ power conversion efficiency of the photovoltaic device is equal to or greater than 7.3%. Typically, the AM1.5G 100 mWcm$^{-2}$ power conversion efficiency is equal to or greater than 11.5%.

Typically, the process for producing an the optoelectronic device of the invention is a process for producing a photovoltaic device, wherein the photocurrent of the photovoltaic device is equal to or greater than 15 mAcm$^{-2}$. More typically, the photocurrent is equal to or greater than 20 mAcm$^{-2}$.

The invention will be described further in the Examples which follow.

EXAMPLES

Experimental Description

1. Synthesis of Organometal Halide Perovskites:
1.1. Preparation of Methylammonium Iodide Precursor Methylamine ($CH_3NH_2$) solution 33 wt. % in absolute ethanol (Sigma-Aldrich) was reacted with hydriodic acid 57 wt. % in water (Sigma-Aldrich) at 1:1 molar ratio under nitrogen atmosphere in anhydrous ethanol 200 proof (Sigma-Aldrich). Typical quantities were 24 ml methylamine, 10 ml hydroiodic acid and 100 ml ethanol. Crystallisation of methylammonium iodide ($CHNH_3I$) was achieved using a rotary evaporator a white coloured precipitate was formed indicating successful crystallisation.

The methylamine can be substituted for other amines, such as ethylamine, n-butylamine, tert-butylamine, octylamine etc. in order to alter the subsequent perovskite properties. In addition, the hydriodic acid can be substituted with other acids to form different perovskites, such as hydrochloric acid.

1.2. Preparation of Methylammonium Iodide Lead (II) Chloride ($CH_3NH_3PbCl_2I$) Perovskite Solution Methylammonium iodide ($CHNH_3I$) precipitate and lead (II) chloride (Sigma-Aldrich) was dissolved in dimethylformamide ($C_3H_7NO$) (Sigma-Aldrich) at 1:1 molar ratio at 20 vol. %.

For making different perovskites, different precursors, such as different lead(II)halides or indeed different metals halides all together, such as Sn iodide.

1.3. Generalising the Organometal Halide Perovskite Structure

The perovskite structure is defined as $ABX_3$, where A=cation (0,0,0)—ammonium ion, B=cation (½, ½, ½)—divalent metal ion, and X=anion (½, ½, 0)—halogen ion. The table below indicates possible mixed-anion perovskites. Fixing: [A]=Methylammonium, [B]=Pb, Varying [X]=any Halogen

| Perovskite | Methylammonium-[X] | Lead halide (Pb[X]$_2$) |
|---|---|---|
| $CH_3NH_3PbBr_3$ | $CH_3NH_3Br$ | $PbBr_2$ |
| $CH_3NH_3PbBrI_2$ | $CH_3NH_3Br$ | $PbI_2$ |
| $CH_3NH_3PbBrCl_2$ | $CH_3NH_3Br$ | $PbCl_2$ |
| $CH_3NH_3PbIBr_2$ | $CH_3NH_3I$ | $PbBr_2$ |
| $CH_3NH_3PbI_3$ | $CH_3NH_3I$ | $PbI_2$ |
| $CH_3NH_3PbICl_2$ | $CH_3NH_3I$ | $PbCl_2$ |
| $CH_3NH_3PbClBr_2$ | $CH_3NH_3Cl$ | $PbBr_2$ |
| $CH_3NH_3PbI_2Cl$ | $CH_3NH_3Cl$ | $PbI_2$ |
| $CH_3NH_3PbCl_3$ | $CH_3NH_3Cl$ | $PbCl_2$ |

Fixing: [A]=Methylammonium, [B]=Sn, Varying [X]=any Halogen

| Perovskite | Methylammonium-[X] | Tin halide (Sn[X]$_2$) |
|---|---|---|
| $CH_3NH_3SnBr_3$ | $CH_3NH_3Br$ | $SnBr_2$ |
| $CH_3NH_3SnBrI_2$ | $CH_3NH_3Br$ | $SnI_2$ |
| $CH_3NH_3SnBrCl_2$ | $CH_3NH_3Br$ | $SnCl_2$ |
| $CH_3NH_3SnF_2Br$ | $CH_3NH_3Br$ | $SnF_2$ |
| $CH_3NH_3SnIBr_2$ | $CH_3NH_3I$ | $SnBr_2$ |
| $CH_3NH_3SnI_3$ | $CH_3NH_3I$ | $SnI_2$ |
| $CH_3NH_3ISnICl_2$ | $CH_3NH_3I$ | $SnCl_2$ |
| $CH_3NH_3SnF2I$ | $CH_3NH_31$ | $SnF_2$ |
| $CH_3NH_3SnClBr_2$ | $CH_3NH_3Cl$ | $SnBr_2$ |
| $CH_3NH_3SnI_2Cl$ | $CH_3NH_3Cl$ | $SnI_2$ |
| $CH_3NH_3SnCl_3$ | $CH_3NH_3Cl$ | $SnCl_2$ |
| $CH_3NH_3SnF_2Cl$ | $CH_3NH_3Cl$ | $SnF_2$ |

[A] may be varied using different organic elements, for example as in Liang et al., U.S. Pat. No. 5,882,548, (1999) and Mitzi et al., U.S. Pat. No. 6,429,318, (2002).

1.4 Blended Perovskites

| Perovksite 1 | Perovskite 2 | Outcome |
|---|---|---|
| $CH_3NH_3PbICl_2$ | $CH_3NH_3PbIBr_2$ | Red |
| $CH_3NH_3PbICl_2$ | $CH_3NH_3PbBrI_2$ | Yellow |
| $CH_3NH_3PbICl_2$ | $CH_3NH_3PbI_3$ | Dark brown |
| $CH_3NH_3PbICl_2$ | $CH_3NH_3PbBr_3$ | Yellow |
| $CH_3NH_3PbBrCl_2$ | $CH_3NH_3PbIBr_2$ | Yellow |
| $CH_3NH_3PbBrCl_2$ | $CH_3NH_3PbBrI_2$ | Yellow |
| $CH_3NH_3PbBrCl_2$ | $CH_3NH_3PbI_3$ | Brown |
| $CH_3NH_3PbBrCl_2$ | $CH_3NH_3PbBr_3$ | Yellow |

1.5 Stability of Mixed-Halide Perovskites Against Single-Halide Perovskites

The inventors have found that photovoltaic devices comprising a mixed-halide perovskite do absorb light and operate as solar cells. When fabricating films from the single halide perovskites in ambient conditions. The perovskites form, but quickly bleach in colour. This bleaching is likely to be due to the adsorption of water on to the perovskite surface, which is know to bleach the materials. When the complete solar cells are constructed in ambient conditions using these single hailde perovskites, they perform very poorly with full sun light power conversion efficiencies of under 1%. In contrast, the mixed halide perovskites can be processed in air, and show negligible colour bleaching during the device fabrication process. The complete solar cell incorporating the mixed halide perovskites perform exceptionally well in ambient conditions, with full sun power conversion efficiency of over 10%.

1.6 Preparation of Perovskites Comprising a Formamidinium Cation

Formamidinium iodide (FOI) and formamidinium bromide (FOBr) were synthesised by reacting a 0.5M molar solution of formamidinium acetate in ethanol with a 3× molar excess of hydroiodic acid (for FOI) or hydrobromic acid (for FOBr). The acid was added dropwise whilst stirring at room temperature, then left stirring for another 10 minutes. Upon drying at 100° C., a yellow-white powder is formed, which is then dried overnight in a vacuum oven before use. To form FOPbI$_3$ and FOPbBr$_3$ precursor solutions, FOI and PbI$_2$ or FOBr and PbBr$_2$ were dissolved in anhydrous N,N-dimethylformamide in a 1:1 molar ratio, 0.88 millimoles of each per ml, to give 0.88M perovskite solutions. To form the FOPbI$_{3z}$Br$_{3(1-z)}$ perovskite precursors, mixtures were made of the FOPbI$_3$ and FOPbBr$_3$ 0.88M solutions in the required ratios, where z ranges from 0 to 1.

Films for characterisation or device fabrication were spin-coated in a nitrogen-filled glovebox, and annealed at 170° C. for 25 minutes in the nitrogen atmosphere.

2. Cleaning and Etching of the Electrodes:

The perovskite solar cells used and presented in these examples were fabricated as follows: Fluorine doped tin oxide (F:SnO$_2$/FTO) coated glass sheets (TEC 15, 15 Ω/square, Pilkington USA) were etched with zinc powder and HCl (2 M) to give the required electrode pattern. The sheets were subsequently cleaned with soap (2% Hellemanex in water), distilled water, acetone, ethanol and finally treated under oxygen plasma for 5 minutes to remove any organic residues.

3. Deposition of the Compact TiO$_2$ Layer:

The patterned FTO sheets were then coated with a compact layer of TiO$_2$ (100 nm) by aerosol spray pyrolysis deposition of a titanium diisopropoxide bis(acetylacetonatc) ethanol solution (1:10 titanium diisopropoxide bis(acetylacetonate) to ethanol volume ratio) at 250° C. using air as the carrier gas (see Kavan, L. and Gratzel, M., Highly efficient semiconducting TiO$_2$ photoelectrodes prepared by aerosol pyrolysis, Electrochim. Acta 40, 643 (1995); Snaith, H. J. and Gratzel, M., The Role of a "Schottky Barrier" at an Electron-Collection Electrode in Solid-State Dye-Sensitized Solar Cells. Adv. Mater. 18, 1910 (2006)).

4. Deposition of the Mesoporous TiO$_2$ Film:

A standard TiO$_2$ nanoparticle paste, such as commercially available dyesol 18NR-T, was doctor-blade coated, screen printed or spin-coated onto the compact TiO$_2$ to give a dry film thickness between 200 nm and 2 µm, governed by the height of the doctor blade. These sheets were then slowly heated to 500° C. (ramped over 30 minutes) and baked at this temperature for 30 minutes under an oxygen flow. After cooling, the sheets were cut into slides of the required size and stored in the dark until further use.

Prior to fabrication of each set of devices, the nanoporous films were soaked in a 0.015 M aqueous solution of TiCl$_4$ for 1 hours at 70° C. This procedure was applied to grow a thin shell of TiO$_2$ upon the mesoporous TiO$_2$. Following the TiCl$_4$ treatment the films were rinsed with deionised water, dried in air, and baked once more at 500° C. for 45 minutes under air flow. Once cooled to 70° C. they were placed in a dye solution overnight.

5. Deposition of the Perovskite Precursor Solution and Formation of the Mesoporous Perovskite Semiconducting Electrode:

A small volume, between 20 to 100 µl of the solution of the perovskite precursor solution in DMF (methylammonium iodide lead (II) chloride (CH$_3$NH$_3$PbCl$_2$I)) at a volume concentration of between 5 to 40 vol % was dispensed onto each preprepared mesoporous electrode film and left for 20 s before spin-coating at 1500 rpm for 30 s in air. The coated films were then placed on a hot plate set at 100 degrees Celsius and left for 45 minutes at this temperature in air, prior to cooling. During the drying procedure at 100 degrees, the coated electrode changed colour from light yellow to dark brown, indicating the formation of the desired perovskite film with the semiconducting properties.

6. Hole-Transporter Deposition and Device Assembly:

The hole transporting material used was spiro-OMeTAD (Lumtec, Taiwan), which was dissolved in chlorobenzene at a typical concentration of 180 mg/ml. After fully dissolving the spiro-OMeTAD at 100° C. for 30 minutes the solution was cooled and tertbutyl pyridine (tBP) was added directly to the solution with a volume to mass ratio of 1:26 µl/mg tBP:spiro-MeOTAD. Lithium bis(trifluoromethylsulfonyl) amine salt (Li-TFSI) ionic dopant was pre-dissolved in acetonitrile at 170 mg/ml, then added to the hole-transporter solution at 1:12 µl/mg of Li-TFSI solution:spiro-MeOTAD. A small quantity (20 to 70 µl) of the spiro-OMeTAD solution was dispensed onto each perovskite coated mesoporous film and left for 20 s before spin-coating at 1500 rpm for 30 s in air. The films were then placed in a thermal evaporator where 200 nm thick silver electrodes were deposited through a shadow mask under high vacuum (10$^{-6}$ mBar).

7. Fabrication of Devices Comprising FOPbI$_{3z}$Br$_{3(1-z)}$

Devices were fabricated on fluorine-doped tin oxide coated glass substrates. These were cleaned sequentially in hallmanex, acetone, propan-2-ol and oxygen plasma. A compact layer of TiO$_2$ was deposited by spin-coating a mildly acidic solution of titanium isopropoxide in ethanol. This was dried at 150° C. for 10 minutes. The TiO$_2$ mesoporous layer was deposited by spin-coating at 2000 rpm a 1:7 dilution by weight of Dyesol 18NR-T paste in ethanol, forming a layer of ~150 nm. The layers were then sintered in air at 500° C. for 30 minutes. Upon cooling, perovskite precursors were spin-coated at 2000 rpm in a nitrogen-filled glovebox, followed by annealing at 170° C. for 25 minutes in the nitrogen atmosphere. The hole-transport layer was deposited by spin-coating an 8 wt. % 2,2',7,7'-tetrakis-(N, N-di-pmethoxyphenylamine)9,9'-spirobifluorene (spiro-OMeTAD) in chlorobenzene solution with added tert-butylpyridine (tBP) and lithium bis(trifluoromethanesulfonyl)imide (Li-TFSI). Devices were completed by evaporation of 60 nm Au contacts.

Experimental Results

Figure 3:
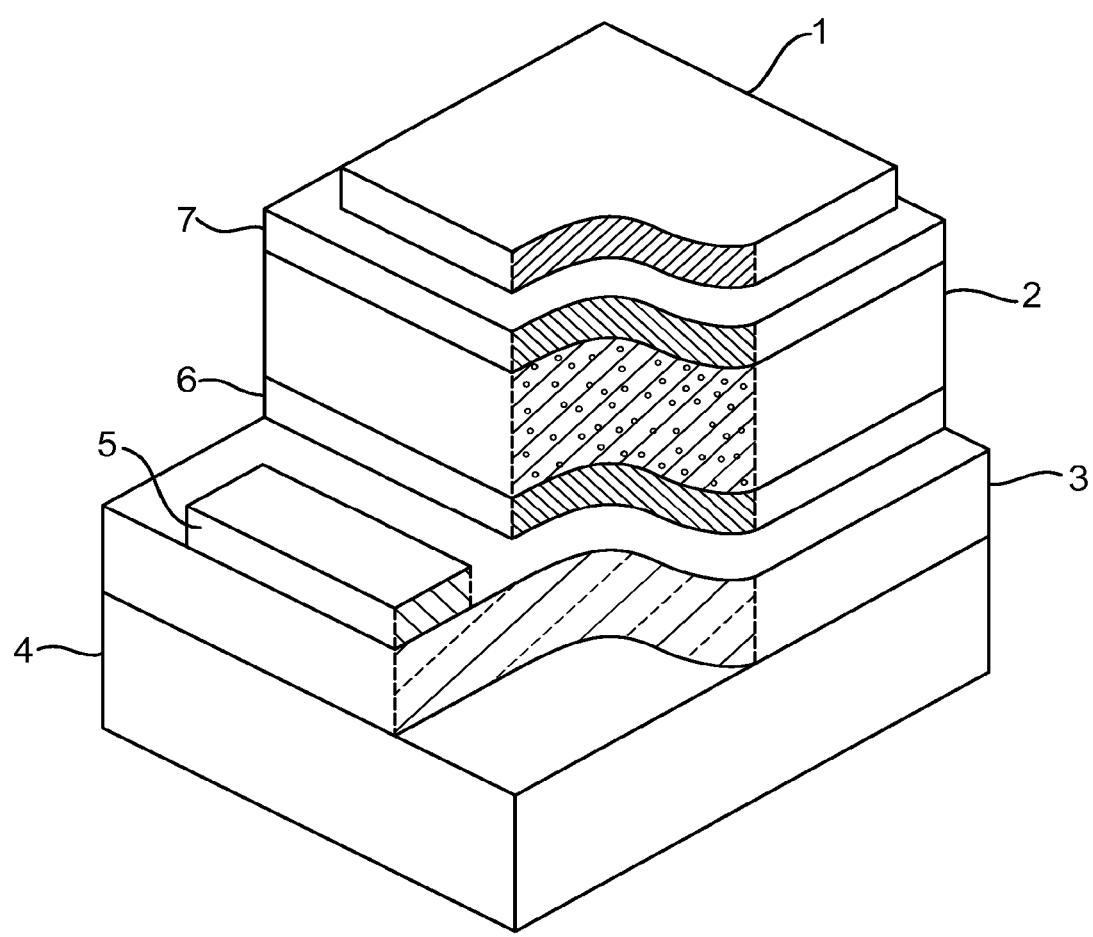
FIG. 3 is an isometric cross-section drawing of a generic nanostructured solar cell: (1) metal cathode, (2) hole-conducting material, nanostructured mesoporous metal oxide with absorber and hole-conducting material (see FIG. 4 for clarification), (3) transparent conducting metal oxide (anode), (4) transparent substrate, (5) metal anode, (6) compact metal oxide.
Figure 4:
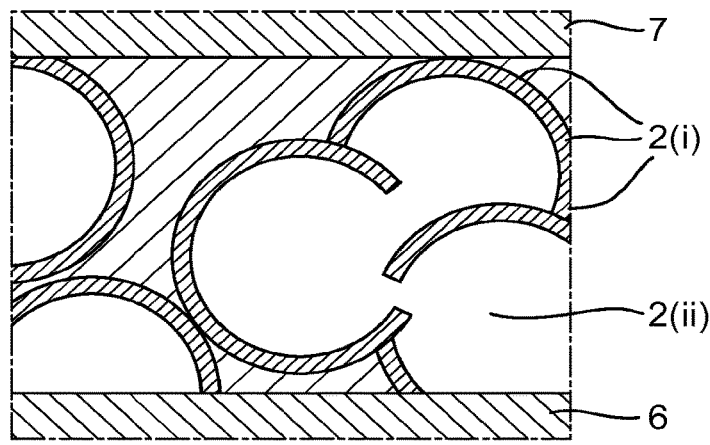
FIG. 4 is a schematic showing cross-section of the 'active layer' of a generic nanostructured solar cell: (2(i)) light sensitive absorber, (2(ii)) metal oxide, metal cathode, (6) compact metal oxide, (7) hole-conducting material.

In FIG. 1 a schematic illustration of a cross section of a solid-state perovskite sensitized solar cell is shown. Light is incident from the bottom side. The device comprises a flat film of fluorene doped tin oxide (FTO) coated upon a glass substrate. The FTO is the anode in the presented configuration. On top of the FTO a thin (~50 nm thick) layer of compact TiO$_2$ functions as a hole-blocking and electron collection interlayer, which ensures selective collection of electrons at this anode. Upon the compact TiO$_2$, a mesoporous film of TiO$_2$ is coated, serves to function as a high surface area n-type anode. This mesoporous TiO$_2$ is coated with the perovskite material which functions as the sensitizer. The role of the sensitizer is to absorb sun light and transfer photoexcited electrons into the TiO$_2$ and transfer holes into the hole-transporter. The pores in the perovskite sensitized mesoporous TiO$_2$ film are predominantly filled with a hole-transporter. The role of the hole-transporter is to accept the photo-generated holes from the valance band of the perovskite sensitizer and transport these holes out of the device to the external circuit. The device is capped with a metal electrode to complete the solar cell. Further illustrations of the structure of the solar cells and the composition of the components are given in FIG. 3 and FIG. 4.

Figure 2A:
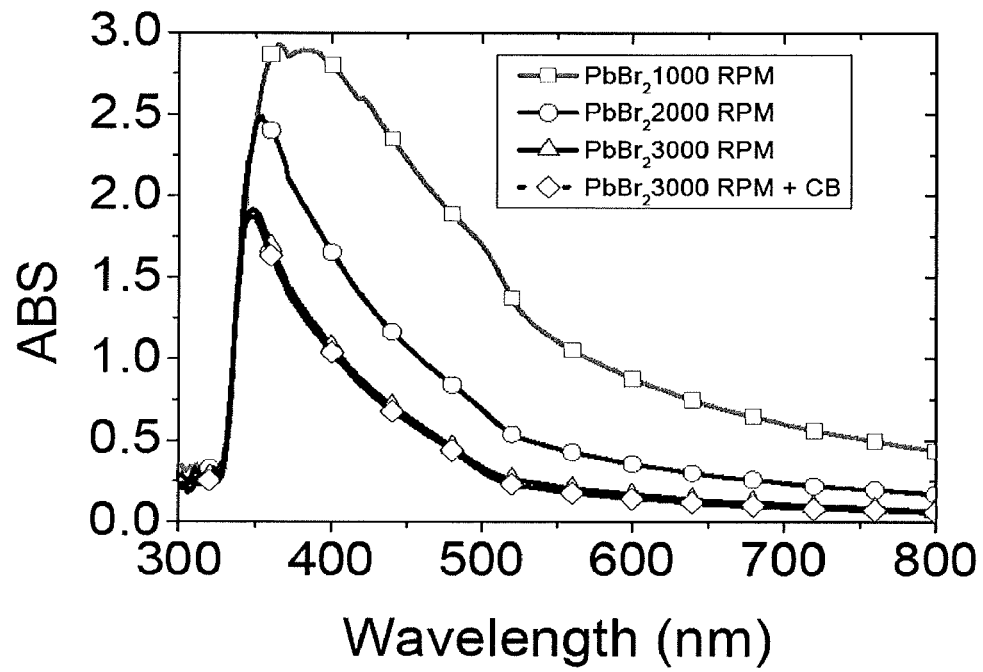
FIG. 2(a) is a UV-Vis absorbance spectra of perovskite $CH_3NH_3PbBr_3$, prepared on $TiO_2$. On the graph wavelength in nm is plotted on the x-axis and absorbance in arbitrary units is plotted on the y-axis.
Figure 2B:
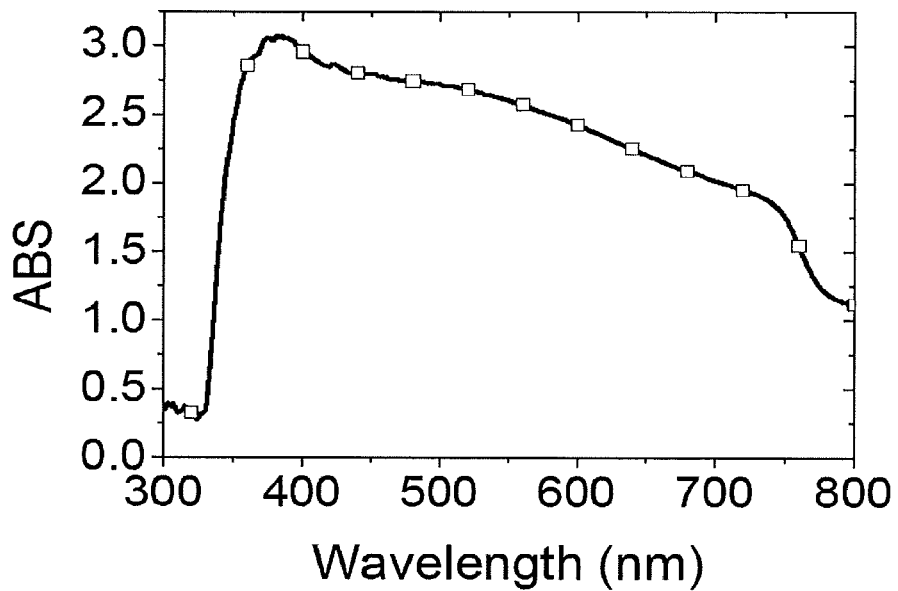
FIG. 2(b) is a UV-Vis absorbance spectra of perovskite $CH_3NH_3PbI_3$, prepared on $TiO_2$. On the graph wavelength in nm is plotted on the x-axis and the absorbance in arbitrary units is plotted on the y-axis.

In FIG. 2 the UV-Vis absorption spectra are shown for the single halide perovskites. In FIG. 2a the lead bromide perovskite (CH$_3$NH$_3$PbBr$_3$). Is show, which appears yellow to the eye. In FIG. 2b the UV-Vis-NIR lead Iodide perovskite (CH$_3$NH$_3$PbI$_3$) is show which appears dark brown to the eye. The lead iodide perovskite has a very good absorption spectrum with respect to potential use in a solar cell. However, due to the material instability it does not work well when employed as a sensitizer in a solid-state perovskite sensitized solar cell.

Figure 5:
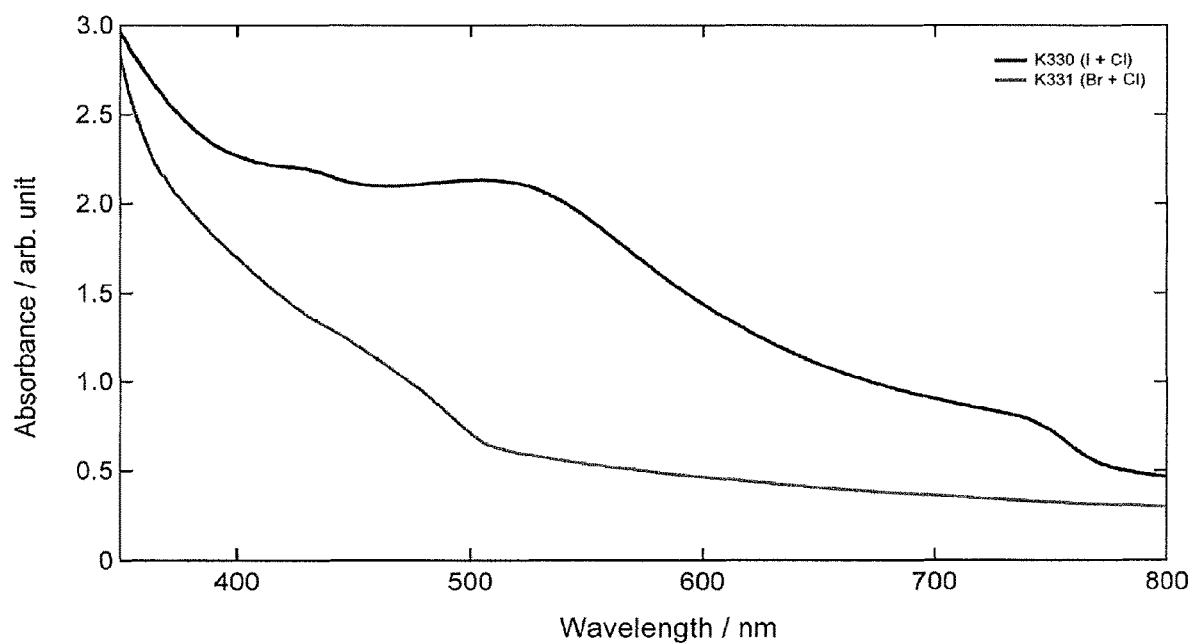
FIG. 5 is a UV-Vis absorbance spectra of organometal mixed-halide layered perovskites: K330 ($CH_3NH_3PbCl_2I$) and K331 ($CH_3NH_3PbCl_2Br$), prepared on $TiO_2$ at 20 vol %. On the graph the wavelength in nm is plotted on the x-axis and the absorbance in arbitrary units is plotted on the y-axis. The dark trace is K330 and the light trace is K331.

In FIG. 5, the UV-Vis-NIR absorption spectra for mixed halide perovskites are shown. The lead iodide chloride perovskite (CH$_3$NH$_3$PbCl$_2$I) appears dark brown to the eye and is shown with the dark line, and the lead bromide chloride perovskite (CH$_3$NH$_3$PbCl$_2$Br) appears red to the eye and is shown with the light line. We term the CH$_3$NH$_3$PbCl$_2$I perovskite, K330 and CH$_3$NH$_3$PbCl$_2$Br, K331. The lead iodide chloride perovskite is particularly promising since it absorbs very strongly over the entire visible to near infrared region of the solar spectrum.

Figure 6:
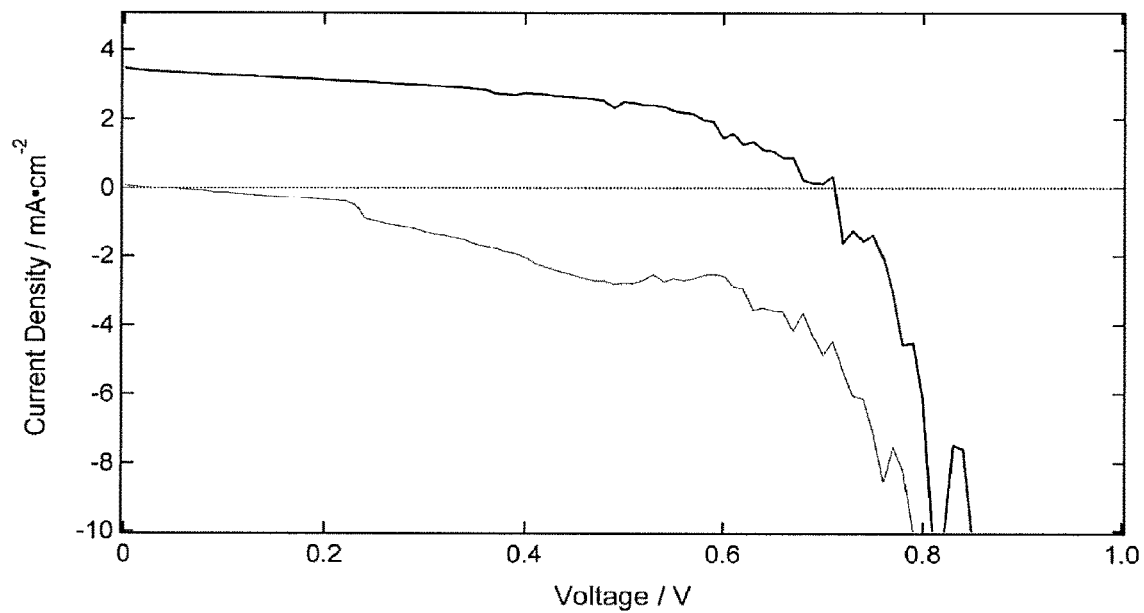
FIG. 6 shows the current-voltage characteristics under simulated AM1.5G illumination of 100 mWcm$^{-2}$ (top curve) and in the dark (bottom curve) of a device assembled in bilayer structure: F:SnO$_2$/Compact TiO$_2$/K330/Spiro OMeTAD/Ag. On the graph the voltage in volts is plotted on the x-axis and the current density in mAcm$^{-2}$ is plotted on the y-axis.

In order to first test the photovoltaic of the perovskite absorbers, flat layer solar cells were constructed. In FIG. 6, the current voltage curve for a flat layer K330 solar cells is show. The photocurrent of 3.5 mAcm$^{-2}$ is reasonably high for a flat layer sensitized solar cell.

Figure 7:
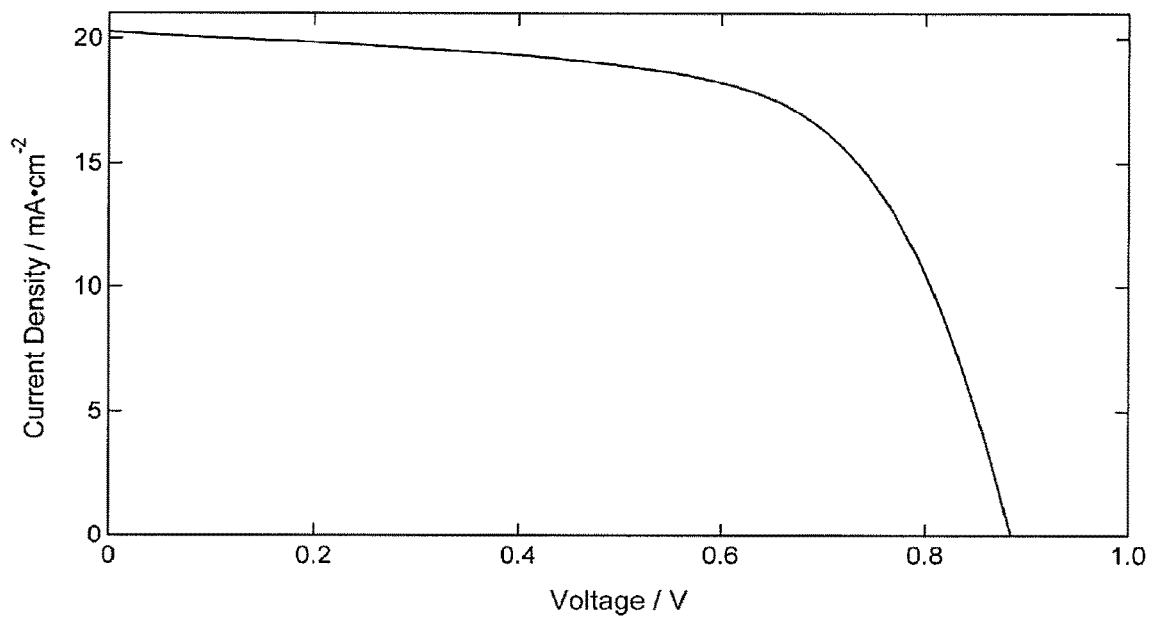
FIG. 7 shows the current-voltage characteristics under simulated AM1.5G illumination of a device assembled in absorber-sensitised structure with hole-conductor: F:SnO$_2$/Compact TiO$_2$/Mesoporous TiO$_2$/K330/Spiro OMeTAD/Ag. On the graph the voltage in volts is plotted on the x-axis and the current density in mAcm$^{-2}$ is plotted on the y-axis.

A current voltage curve measured under AM1.5 simulated sun light of 100 mWcm$^{-2}$ irradiance for a complete solar cell as described and illustrated in FIG. 1 employing spiro-OMeTAD as the hole-transporter and CH$_3$NH$_3$PbCl$_2$I as the perovskite absorber, is shown in FIG. 7. The photocurrent is over 20 mAcm$^{-2}$ and the overall power conversion efficiency is 11.5%. This level of performance is exceptionally high for a solid-state sensitized solar cell and represents an absolute breakthrough in performance for this technology. In comparison, the highest reported efficiency for solid-state dye-sensitized solar cells is just over 7%, and the highest verified efficiency for liquid electrolyte dye-sensitized solar cells is 11.4%.

Figure 8:
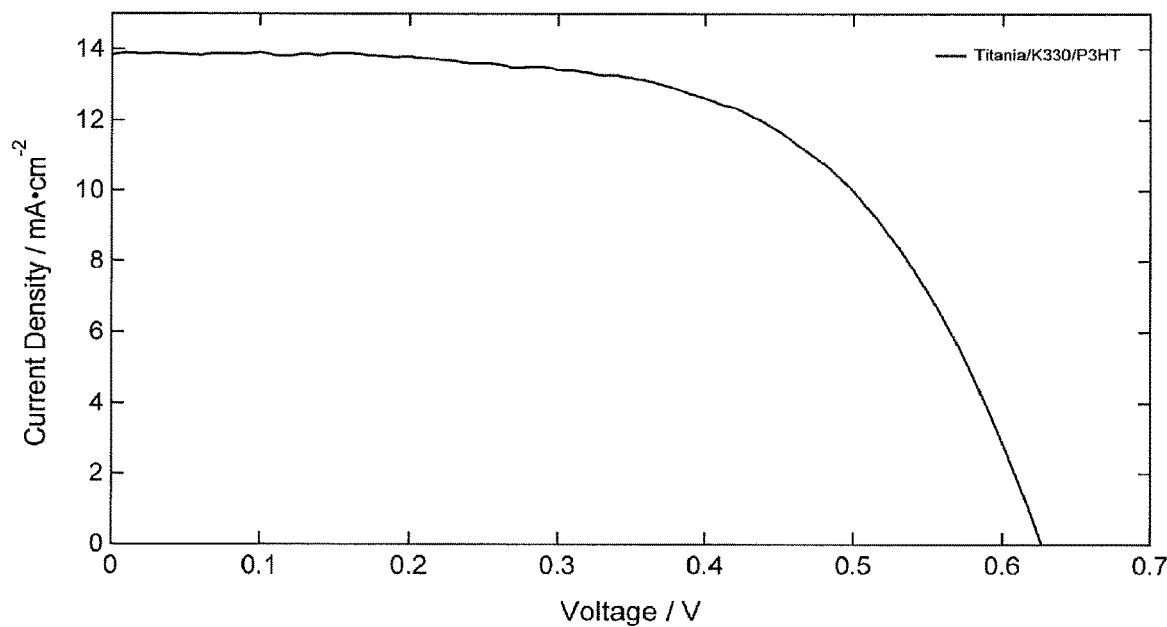
FIG. 8 shows the current-voltage characteristics under simulated AM1.5G illumination of a device assembled in absorber-sensitised structure with hole-conductor: F:SnO$_2$/Compact TiO$_2$/Mesoporous TiO$_2$/K330/P3HT/Ag. On the graph the voltage in volts is plotted on the x-axis and the current density in mAcm$^{-2}$ is plotted on the y-axis.

In FIG. 8, a current voltage curve measured under AM1.5 simulated sun light of 100 mWcm$^{-2}$ irradiance for a complete solar cell as described and illustrated in FIG. 1 employing P3HT as the hole-transporter and CH$_3$NH$_3$PbCl$_2$I as the perovskite absorber is shown. This device also performs well, although not as well as the device employing spiro-OMeTAD as the hole-transporter.

Figure 9:
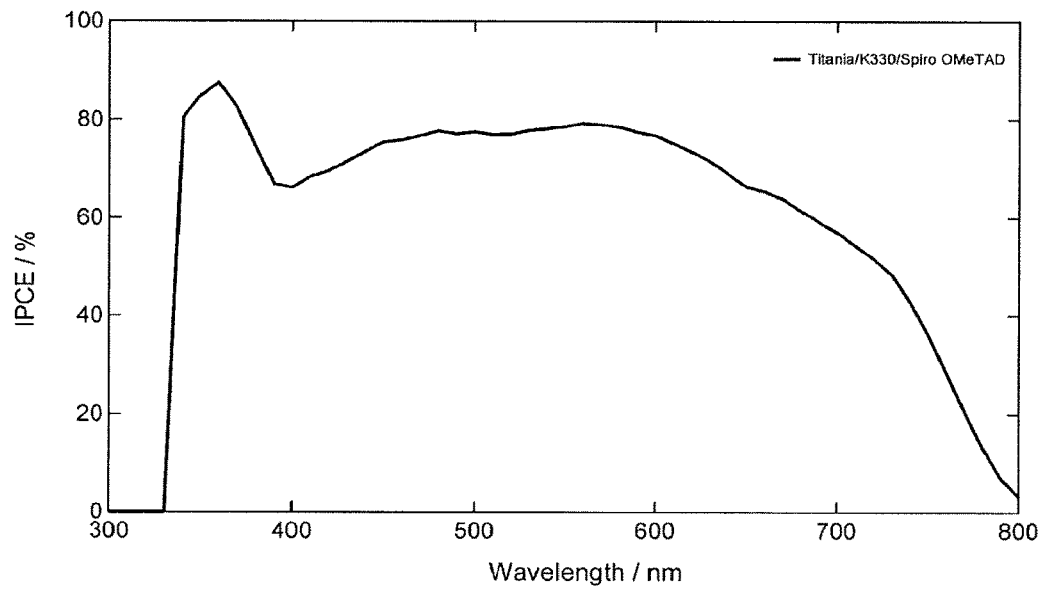
FIG. 9 shows the Incident Photon-to-Electron Conversion Efficiency (IPCE) action spectra of a device assembled in mesoporous absorber structure with hole-conductor: F:SnO$_2$/Compact TiO$_2$/Mesoporous TiO$_2$/K330/Spiro OMeTAD/Ag. On the graph the wavelength in nm is plotted on the x-axis and the IPCE in plotted on the y-axis.

In FIG. 9 the external quantum efficiency (EQE) action spectrum is show for a K330 sensitized solar cell employing spiro-OMeTAD as the hole-transporter. The exceptionally high EQE of 80% at peak and broadly functioning over the entire absorbing range justifies the high photocurrent measured under simulated sun light.

Figure 10:
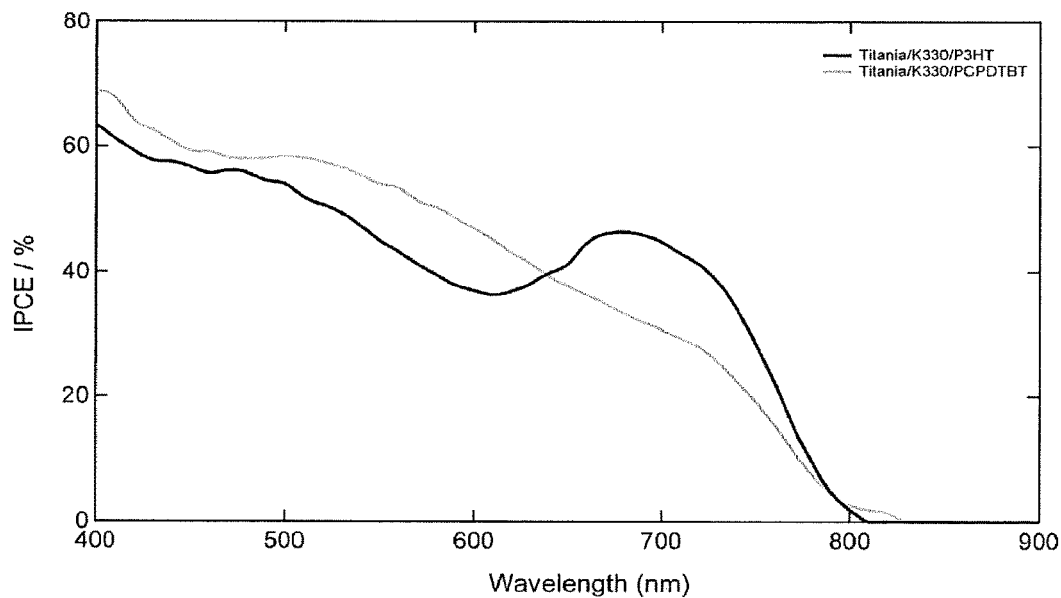
FIG. 10 shows the Incident Photon-to-Electron Conversion Efficiency (IPCE) action spectra of a device assembled in absorber-sensitised structure with hole-conductor: F:SnO$_2$/Compact TiO$_2$/Mesoporous TiO$_2$/K330/P3HT (dark trace) or PCPDTBT (light trace)/Ag. On the graph the wavelength in nm is plotted on the x-axis and the IPCE in plotted on the y-axis.

In FIG. 10 the external quantum efficiency action spectrum is show for a K330 sensitized solar cell employing semiconducting polymers, P3HT and PCPDTBT as the hole-transporters. The EQE spectra has dips where the polymers absorb light, with the P3HT absorption maximum being between 500 to 600 nm, and the PCPDTBT absorption maximum being at 700 nm. These dips in the EQE spectrum, illustrate that the polymer is in fact absorbing light which would have otherwise been absorbed in the perovskite sensitizer. Once the light is absorbed in the polymer, it does not appear to generate charge very effectively. This "light filtering effect" justifies why the photocurrent is lower for the perovskite sensitized solar cell employing the polymer hole-conductor P3HT, than the small molecular wide band gap hole-conductor spiro-OMeTAD.

Figure 11:
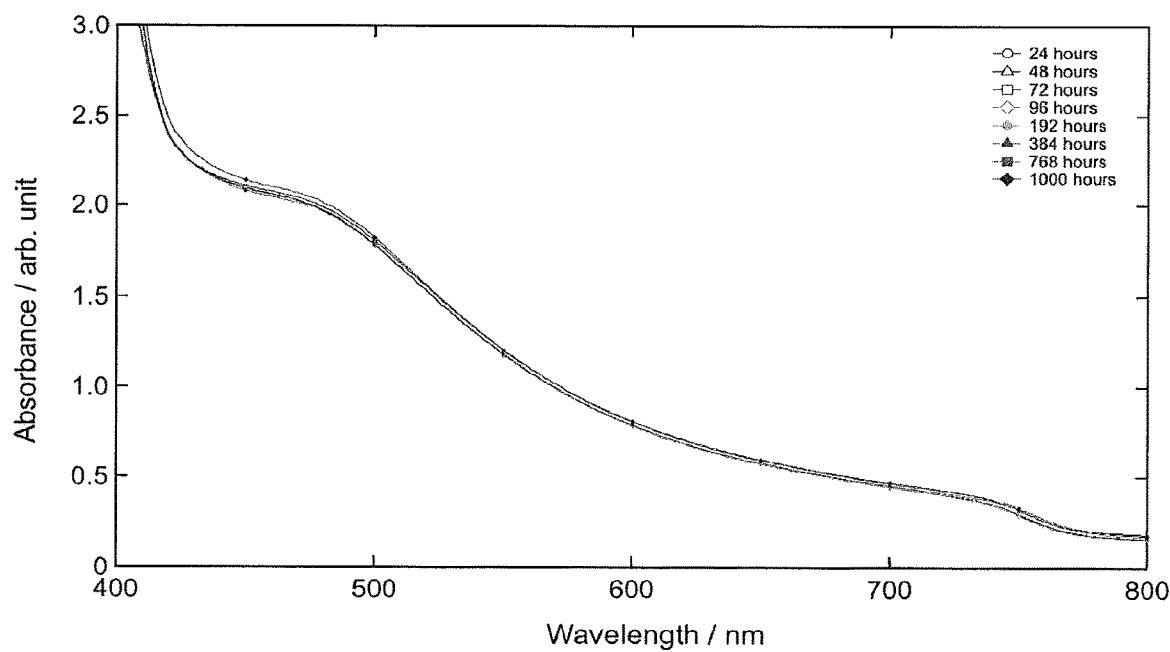
FIG. 11 shows the UV-Vis absorbance spectra for a device assembled in absorber-sensitised structure with hole-conductor: F:SnO$_2$/Compact TiO$_2$/mesoporous oxide/K330/Spiro OMeTAD sealed using surlyn and epoxy with light soaking under simulated AM1.5G illumination over time. On the graph wavelength in nm is plotted on the x-axis and the absorbance in arbitrary units is plotted on the y-axis.

FIG. 11 shows the UV-Vis-NIR absorption spectra for the complete photoactive of a solar cell comprised of K330 and spiro-OMeTAD. The films are sealed in nitrogen. There is negligible change in the absorption spectra over 1000 hrs constant illumination from AM1.5 sun light at 100 mWcm$^{-2}$ irradiance. This indicates that the perovskite is stable in the photoactive layer of the solar cell.

Figure 12:
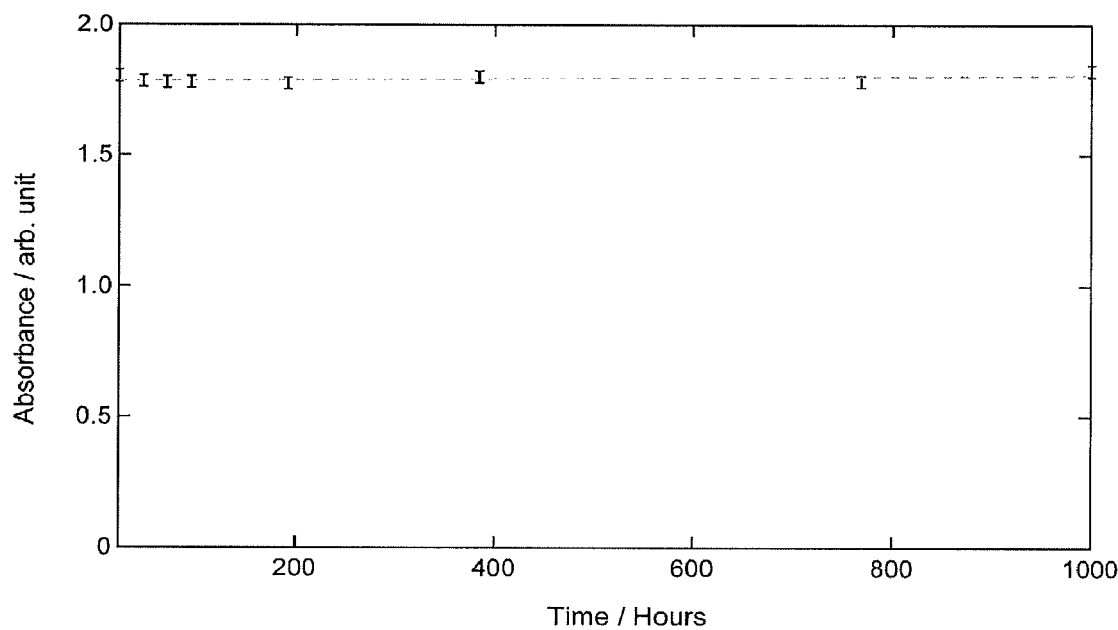
FIG. 12 shows the UV-Vis absorbance spectra taken at 500 nm of light soaking under simulated AM1.5G illumination over time for device assembled in absorber-sensitised structure with hole-conductor: F:SnO$_2$/Compact TiO$_2$/Mesoporous TiO$_2$/K330/Spiro OMeTAD sealed using surlyn and epoxy. On the graph time in hours is plotted on the x-axis and the absorbance in arbitrary units is plotted on the y-axis.

FIG. 12 shows the optical density at 500 nm as a function of time under Am1.5 illumination, extracted from the data in FIG. 11.

Figure 13:
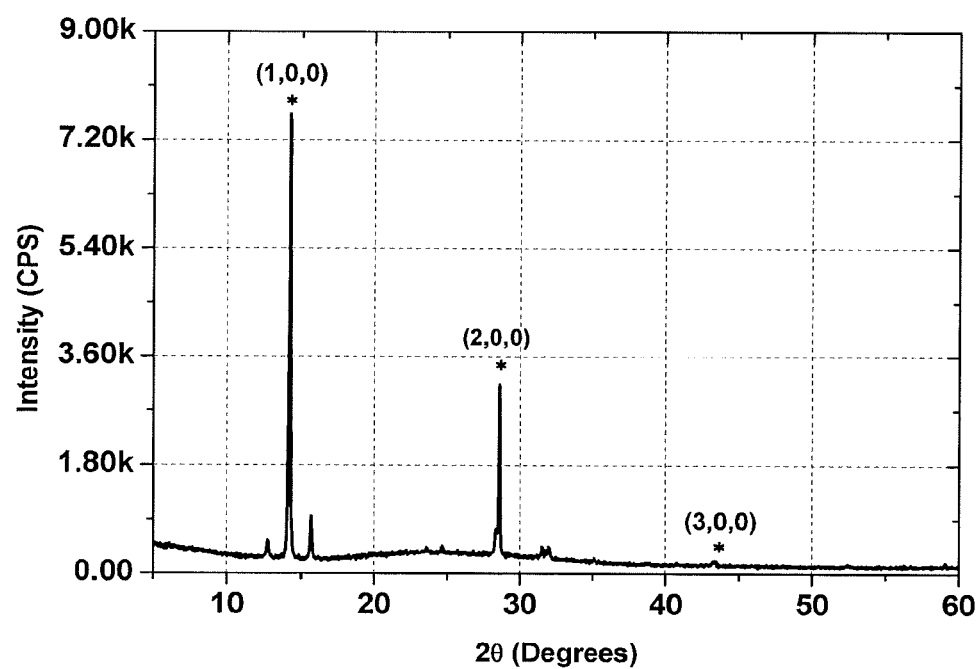
FIG. 13 shows the X-Ray Diffraction (XRD) spectra of K330 at 35 vol % on glass. Degrees in 2-theta are plotted on the x-axis and the number of counts in arbitrary units is plotted on the y-axis.

The X-ray diffraction pattern, shown in FIG. 13 was extracted at room temperature from CH$_3$NH$_3$PbCl$_2$I thin film coated onto glass slide by using X'pert Pro X-ray Diffractometer.

FIG. 13 shows the typical X-ray diffraction pattern of the (Methylammonium Dichloromonoiodo plumbate(II); CH$_3$NH$_3$PbCl$_2$I film on glass substrate. X-ray diffraction pattern confirms the ABX$_3$ type of cubic (a=b=c=90) perovskite structure (Pm3m). CH$_3$NH$_3$PbCl$_2$I gave diffraction peaks at 14.20, 28.58, and 43.27°, assigned as the (100), (200), and (300) planes, respectively of a cubic perovskite structure with lattice parameter a) 8.835 Å, b) 8.835 and c) 11.24 Å. A sharp diffraction peaks at (h 00; where h=1-3) suggest that the films fabricated on glass substrate were predominantly single phase and were highly oriented with the a-axis self-assembly ["*Organometal Halide Perovskites as Visible-Light Sensitizers for Photovoltaic Cells*" Akihiro Kojima, Kenjiro Teshima, Yasuo Shirai and Tsutomu Miyasaka, *J Am. Chem. Soc.* 2009, 131, 6050].

CH$_3$NH$_3$$^+$ cation cannot be assigned in the X ray given its dynamic orientation, CH$_3$NH$_3$$^+$ is incompatible with the molecular symmetry, and hence the cation is still disordered in this phase at room temperature. And thus, the effective contribution of the C and N atoms to the total diffracted intensity is very small relative to the contributions from Pb and X (Cl and I) ["*Alkylammonium lead halides. Part 2. CH$_3$NH$_3$PbX$_3$ (X=Cl, Br, I) perovskites: cuboctahedral halide cages with isotropic cation reorientation*", Osvaldkn O P and Rodericke Wasylishenm et al. *Can. J. Chem.* 1990, 68, 412.].

The peak positions for the synthesised mixed CH$_3$NH$_3$PbCl$_2$I at (h,0,0) were observed to be shifted towards lower 2Θ and were positioned in between the pure methylammonium trihalogen plumbate i.e. CH$_3$NH$_3$PbI$_3$ and CH$_3$NH$_3$PbCl$_3$ ["*Dynamic disorder in methylammoniumtrihalogenoplumbates (II) observed by millimeter-wave spectroscopy*", A. Poglitsch and D. Weber, *J. Chem. Phys.* 1987, 87, 6373.] respectively, and also the increased lattice parameter (a=8.835 Å) of the CH$_3$NH$_3$PbCl$_2$I film as compared to pure "Cl" based perovskite i.e. CH$_3$NH$_3$PbCl$_3$ (a=5.67 Å) with the addition of "I" content gives an evidence of the formation of mixed halide perovskite ["*Optical*

*properties of CH3NH3PbX3 (X=halogen) and their mixed-halide crystals*", N. Kitazawa, Y. Watanabe and Y Nakamura, *J. Mat Sci.* 2002, 37, 3585.].

The diffraction pattern of the product contained a few unidentified peaks, they can attributed to the various factors including the presence of some impurity (e.g. Pb(OH)Cl, CH$_3$NH$_3$X; X=Cl and/or I, or a related compounds that may generate during the synthesis even if slightly excess of reactants are used, and also to the hygroscopic nature of the compound which can resultantly form unwanted impurity ["*Alkylammonium lead halides. Part 2. CH$_3$NH$_3$PbX$_3$ (X=Cl, Br, I) perovskites: cuboctahedral halide cages with isotropic cation reorientation*", Osvaldkn O P and Rodericke Wasylishenm et al. *Can. J. Chem.* 1990, 68, 412.] Additionally, "I" ion present in the lattice may split some of the peaks at room temperature given the fact that the pure "I" based perovskite (CH$_3$NH$_3$PbI$_3$) forms tetragonal structure ["*Alkylammonium lead halides. Part 1. Isolated~b 16 i~on-s in (CH3NH3)4Pb16-2H2O*" Beverlyr Vincent K, Robertsont, Stanlecya merona, N Dosvaldk, *Can. J Chem.* 1987, 65, 1042; "*Organometal Halide Perovskites as Visible-Light Sensitizers for Photovoltaic Cells*" Akihiro Kojima, Kenjiro Teshima, Yasuo Shirai and Tsutomu Miyasaka, *J. Am. Chem. Soc.* 2009, 131, 6050].

Figure 14:
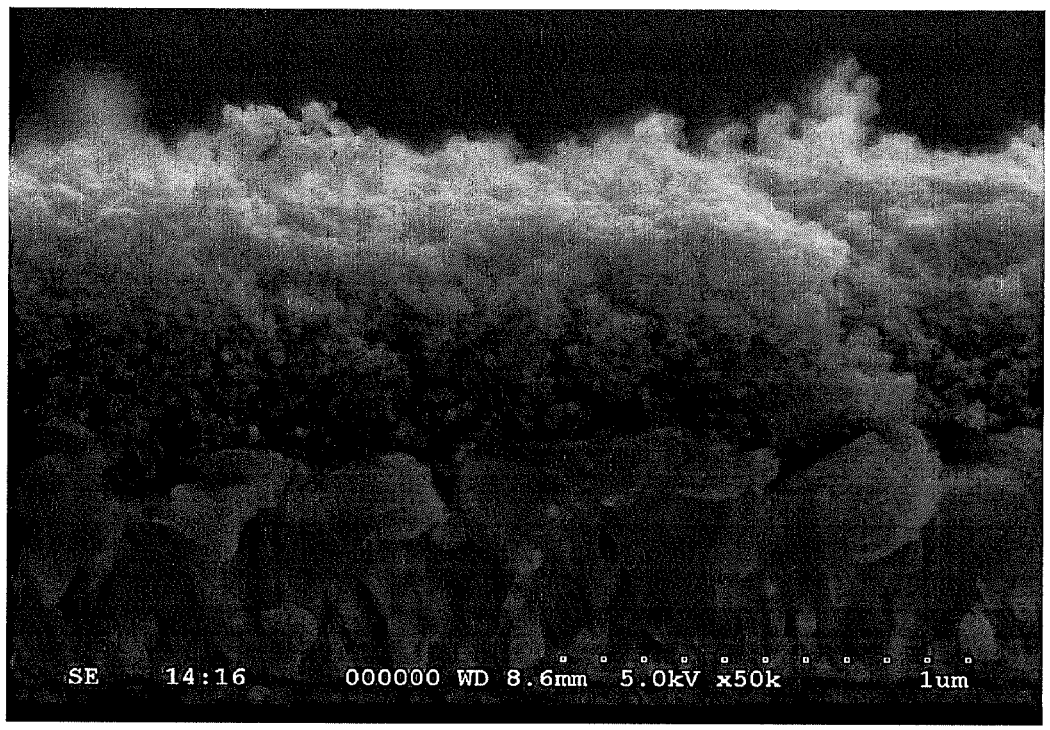
FIG. 14 shows the Scanning Electron Microscope (SEM) image cross-section of mesoporous $TiO_2$.
Figure 15:
FIG. 15 shows the Scanning Electron Microscope (SEM) image cross-section of mesoporous $TiO_2$/K330.
Figure 16:
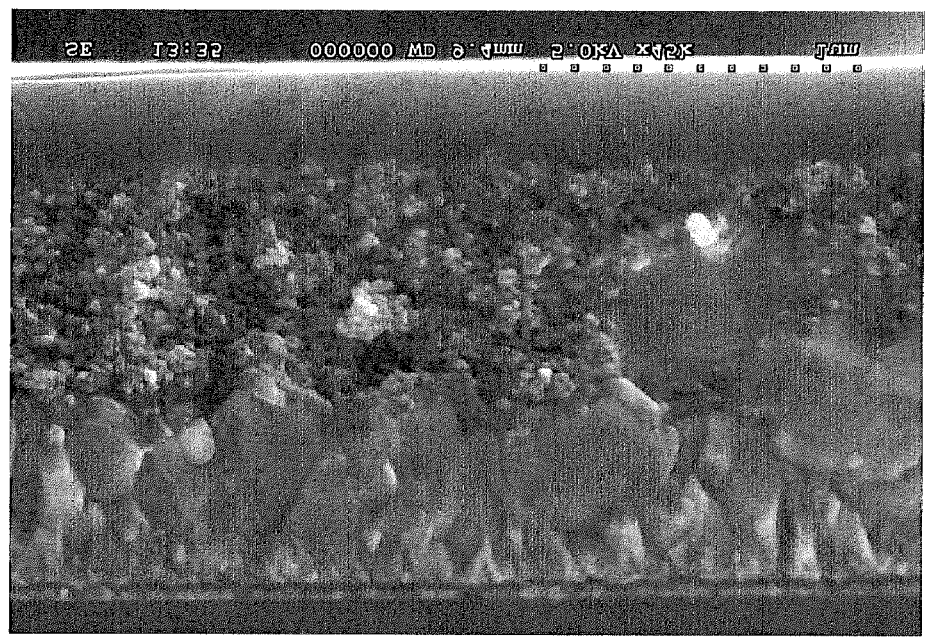
FIG. 16 shows the Scanning Electron Microscope (SEM) image cross-section of mesoporous $TiO_2$/K330/Spiro OMeTAD.

In FIG. 14, a scanning electron microscopy (SEM) cross-sectional image of a mesoporous TiO$_2$ film coated upon an FTO electrode is shown. The perovskite precursor solution is coated within the porous TiO$_2$ film via spin-coating. To elaborate upon this coating process, there has been extensive previous work investigating how solution-cast materials infiltrate into mesoporous oxides (H. J. Snaith et al., Nanotechnology 19, 424003-424015(2008); T. Leijtens et al., *ACS Nano* 6, 1455-1462 (2012); J. Melas-Kyriazi et al., *Adv. Energy. Mater.* 1, 407-414 (2011); I- K. Ding et al., *Adv. Funct. Mater.* 19, 2431-2436 (2009); A. Abrusci et al., *Energy Environ. Sci.* 4, 3051-3058 (2011)). If the concentration of the solution is low enough, and the solubility of the cast material high enough, the material will completely penetrate the pores as the solvent evaporates. The usual result is that the material forms a "wetting" layer upon the internal surface of the mesoporous film, and uniformly, but not completely, fills the pores throughout the thickness of the electrode. The degree of "pore-filling" is controlled by varying the solution concentration. If the concentration of the casting solution is high, a "capping layer" will be formed on top of the mesoporous oxide in addition to a high degree of pore-filling. In FIG. 15, a cross-sectional SEM image of a mesoporous TiO$_2$ film coated with the perovskite absorber is shown. There is no appearance of a capping layer, which implies that the perovskite is predominantly within the mesoporous film. To complete the photoactive layer, the hole-transporter, spiro-OMeTAD, is spin-coated on top of the perovskite coated electrode. In FIG. 16 a cross-sectional SEM image of the complete photoactive film is shown, where it is now apparent that the spiro-OMeTAD has formed a capping layer.

Figure 17A:
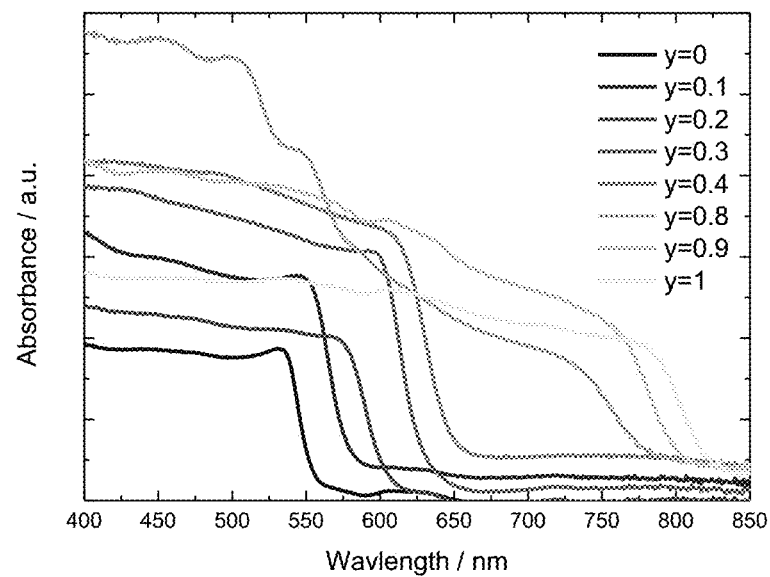
FIG. 17(a) shows UV-vis absorption spectra of the range of $FOPbI_{3y}Br_{3(1-y)}$ perovskites and FIG. 17(b) shows steady-state photoluminescence spectra of the same samples.
Figure 17B:
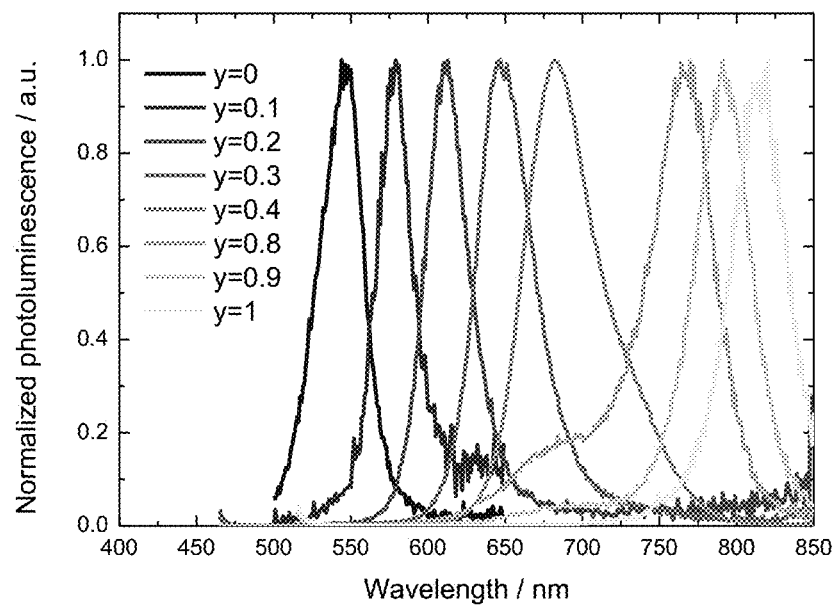
Figure 18D:
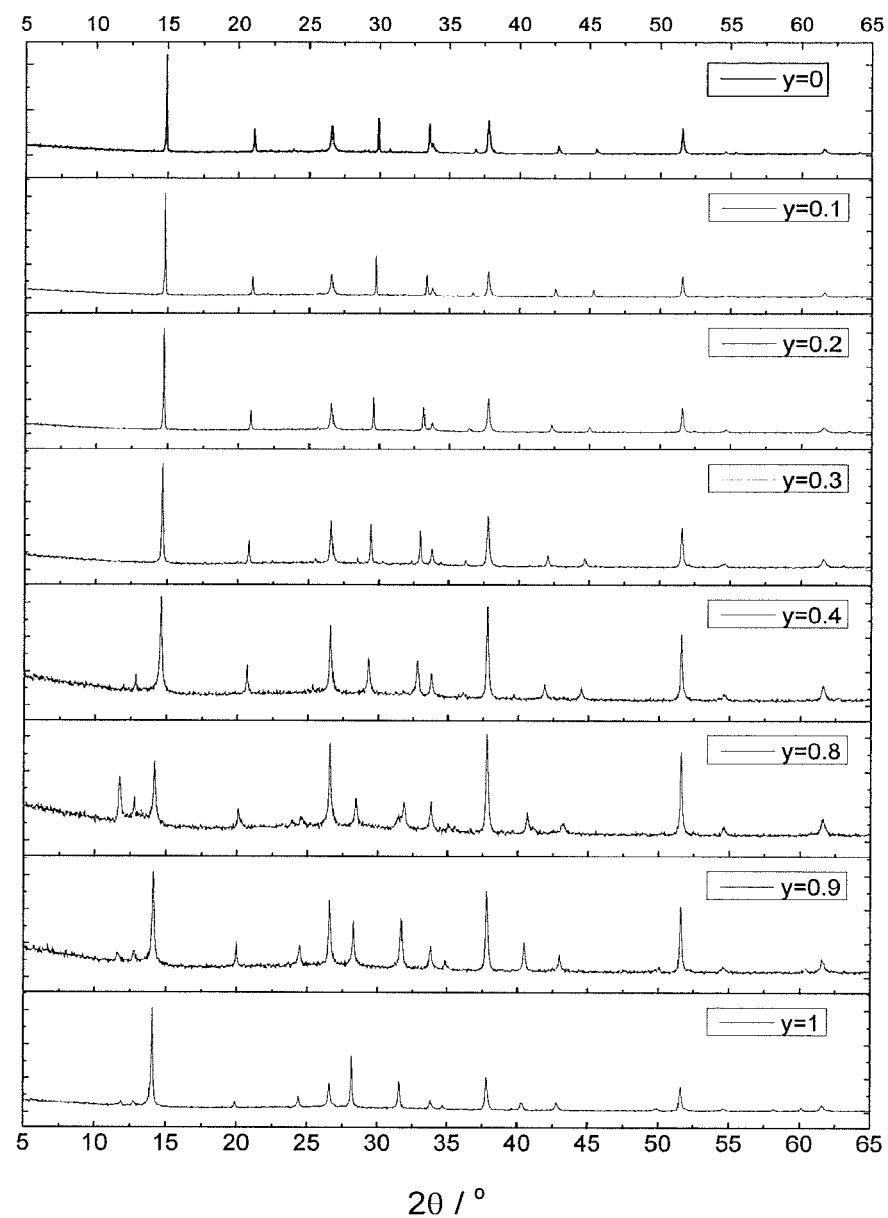
FIG. 18(d) shows X-ray diffraction data for the $FOPbI_{3y}Br_{3(1-y)}$ perovskites for various values of y ranging from 0 to 1.
Figure 18E:
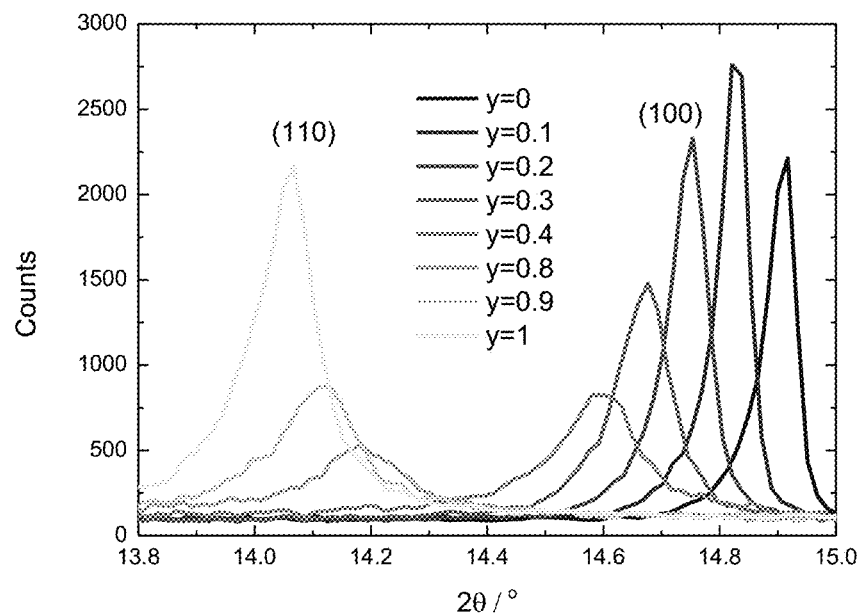
FIG. 18(e) shows a magnification of the transition between the (100) cubic peak and the (110) tetragonal peak, corresponding to the (100) pseudocubic peak, as the system moves from bromide to iodide.
Figure 18F:
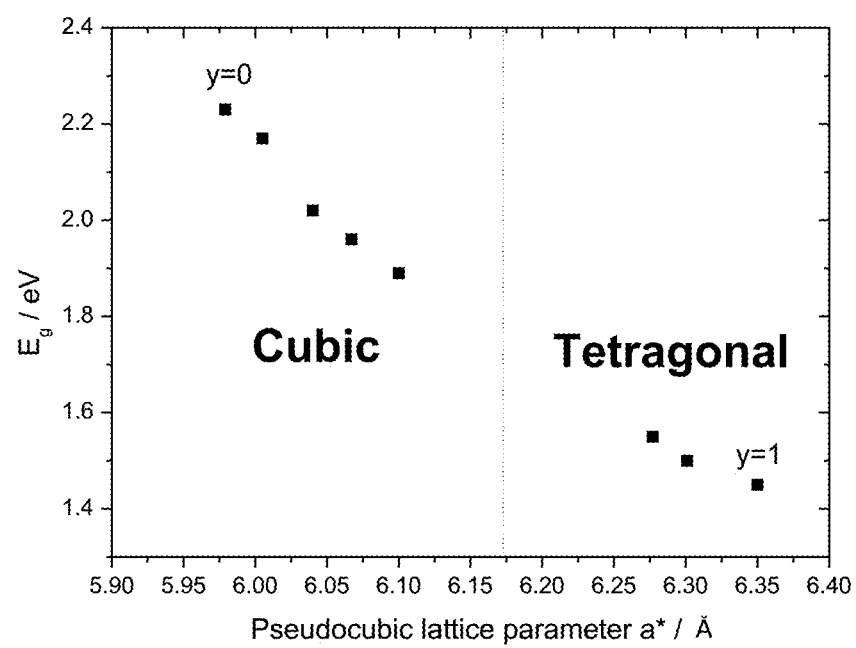
FIG. 18(f) shows a plot of bandgap against calculated pseudocubic lattice parameter.
Figure 19A:
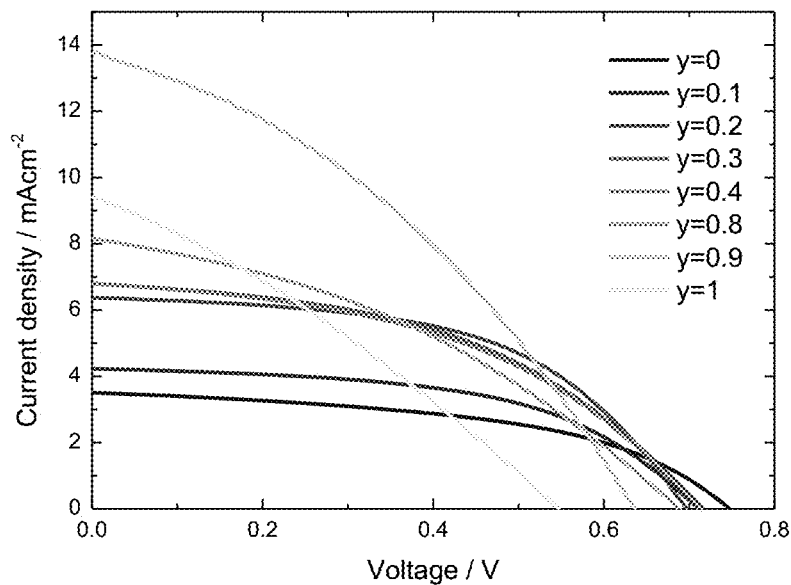
FIG. 19(a) shows average current-voltage characteristics for a batch of solar cells comprising $FOPbI_{3y}Br_{3(1-y)}$ perovskites sensitizing mesoporous titania, with spiro-OMeTAD as the hole transporter, measured under simulated AM1.5 sunlight.
Figure 19B:
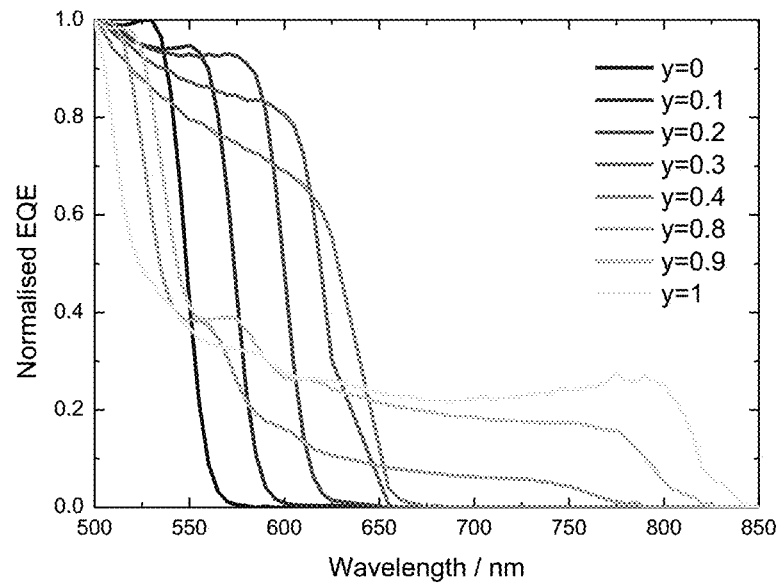
FIG. 19(b) shows a normalised external quantum efficiency for representative cells.
Figure 19C:
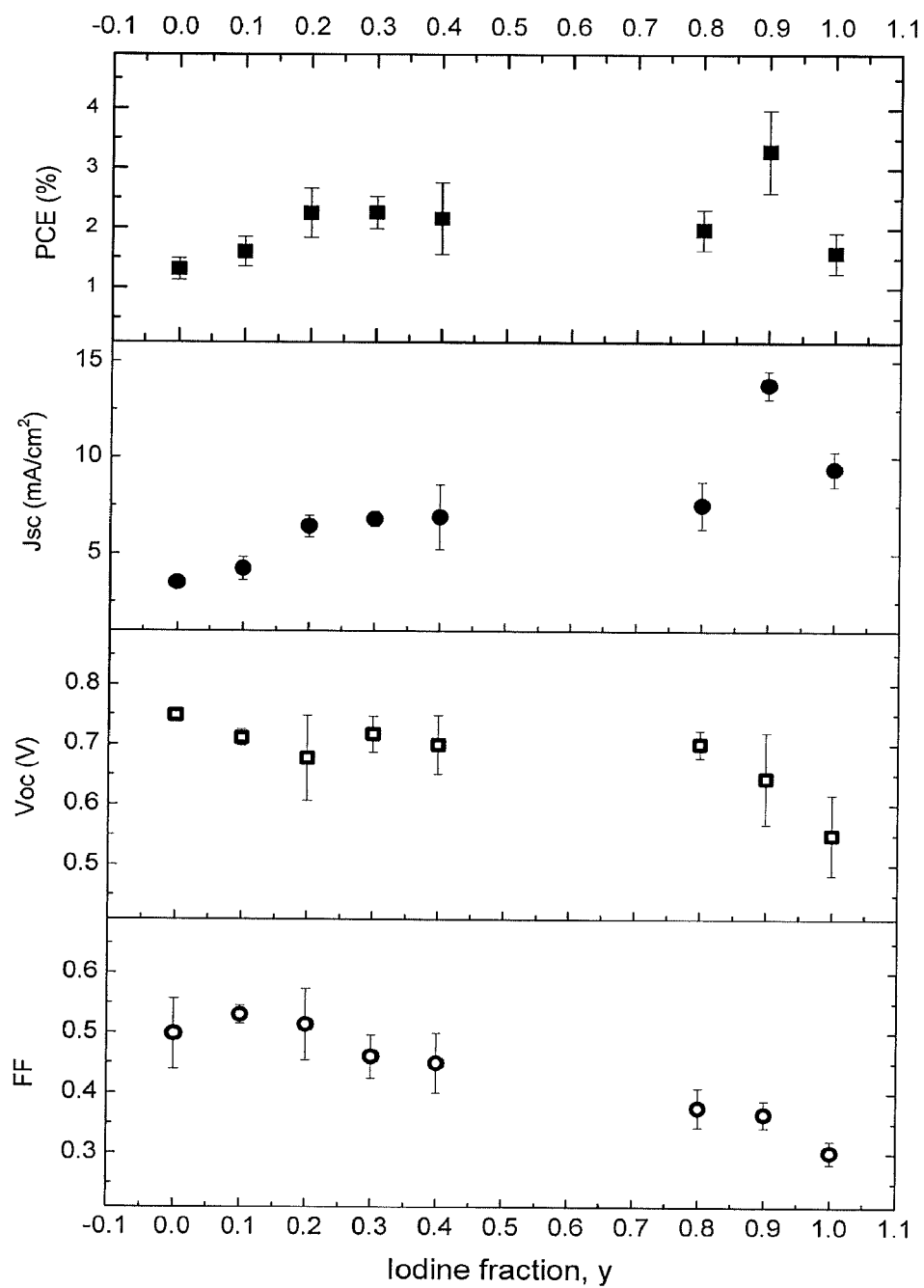
FIG. 19(c) shows a plot of the device parameters of merit for the batch, as a function of the iodine fraction, y, in the $FOPbI_{3y}Br_{3(1-y)}$ perovskite.

FIGS. 17 to 19 relate to perovskites comprising a formamidinium cation and devices comprising FOPbI$_{3y}$Br$_{3(1-y)}$. In general, it is considered to be advantageous to retain a 3D crystal structure in the perovskite, as opposed to creating layered perovskites which will inevitably have larger exciton binding energies (Journal of Luminescence 60&61 (1994) 269 274). It is also advantageous to be able to tune the band gap of the perovskite. The band gap can be changed by either changing the metal cations or halides, which directly influence both the electronic orbitals and the crystal structure. Alternatively, by changing the organic cation (for example from a methylammonium cation to a formamidinium cation), the crystal structure can be altered. However, in order to fit within the perovskite crystal, the following geometric condition must be met: $(R_A+R_X)=t\sqrt{2}(R_B+R_X)$ wherein $R_{A,B,\&X}$ are the ionic radii of ABX ions. The inventor have unexpectedly found that formamidinium cation (FO) does indeed form the perovskite structure in a the cubic structure in a FOPbBr$_3$ or FOPbI$_3$ perovskite, and mixed halide perovskites thereof.

The invention claimed is:

1. A photovoltaic device comprising:
   a first electrode;
   a second electrode; and, disposed between the first and second electrodes:
   a sensitizer material which is capable of performing photoinduced charge generation within the photovoltaic device, wherein the sensitizer material is a mixed-halide perovskite of the formula (I)

[A][B][X]$_3$ (I)

wherein:
   [A] is at least one cation, comprising at least one organic cation of the formula $(R_5R_6N=CH-NR_7R_8)^+$, wherein:
   (i) $R_5$ is hydrogen, unsubstituted or substituted $C_1$-$C_{20}$ alkyl, or unsubstituted or substituted aryl;
   (ii) $R_6$ is hydrogen, unsubstituted or substituted $C_1$-$C_{20}$ alkyl, or unsubstituted or substituted aryl;
   (iii) $R_7$ is hydrogen, unsubstituted or substituted $C_1$-$C_{20}$ alkyl, or unsubstituted or substituted aryl; and
   (iv) $R_8$ is hydrogen, unsubstituted or substituted $C_1$-$C_{20}$ alkyl, or unsubstituted or substituted aryl:
   [B] is at least one divalent metal cation, wherein [B] comprises Pb$^{2+}$; and
   [X] is two or more different halide anions, wherein one of said two or more different halide anions is iodide, and
   a p-type layer which comprises a solid-state hole-transporting material which is not said perovskite.

2. A photovoltaic device according to claim 1 wherein the at least one organic cation of the formula $(R_5R_6N=CH-NR_7R_8)^+$ is an organic cation of the formula $(H_2N=CH-NH_2)^+$.

3. A photovoltaic device according to claim 1 wherein [B] is Pb$^{2+}$.

4. A photovoltaic device according to claim 1 wherein one of said two or more different halide anions is iodide and another of said two or more different halide anions is bromide.

5. A photovoltaic device according to claim 1, wherein [X] is two or three different halide anions selected from fluoride, chloride, bromide or iodide.

6. A photovoltaic device according to claim 5, wherein [X] is two different halide anions which are bromide and iodide.

7. A photovoltaic device according to claim 1 wherein the perovskite is a perovskite compound of formula (IIa):

ABX$_{3z}$X'$_{3(1-z)}$ (IIa)

wherein:
   A is an organic cation of the formula $(R_5R_6N=CH-NR_7R_8)^+$, wherein:
   (i) $R_5$ is hydrogen, unsubstituted or substituted $C_1$-$C_{20}$ alkyl, or unsubstituted or substituted aryl;
   (ii) $R_6$ is hydrogen, unsubstituted or substituted $C_1$-$C_{20}$ alkyl, or unsubstituted or substituted aryl;
   (iii) $R_7$ is hydrogen, unsubstituted or substituted $C_1$-$C_{20}$ alkyl, or unsubstituted or substituted aryl; and (iv) $R_8$ is hydrogen, unsubstituted or substituted $C_1$-$C_{20}$ alkyl, or unsubstituted or substituted aryl;

B is $Pb^{2+}$;

X is a first halide anion wherein the first halide anion is iodide;

X' is a second halide anion which is different from the first halide anion; and z is greater than 0 and less than 1.

8. A photovoltaic device according to claim 7, wherein X is iodide and X' is bromide.

9. A photovoltaic device according to claim 7 wherein z is from 0.05 to 0.95.

10. A photovoltaic device according to claim 7 wherein the organic cation has the formula $(H_2N\!\!=\!\!CH\!\!-\!\!NH_2)^+$.

11. A photovoltaic device according to claim 7 wherein the perovskite has the formula $(H_2N\!\!=\!\!CH\!\!-\!\!NH_2)PbI_{3z}Br_{3(1-z)}$ wherein z is greater than 0 and less than 1.

12. A photovoltaic device according to claim 11 wherein z is from 0.05 to 0.95.

13. A photovoltaic device according to claim 1 wherein the solid-state hole transporting material is a polymeric or molecular hole transporter.

14. A photovoltaic device comprising:

a first electrode;

a second electrode; and, disposed between the first and second electrodes:

(a) a p-type layer which comprises a solid-state hole transporting material, wherein the solid-state hole transporting material is a polymeric or molecular hole transporter which is not said perovskite; and (b) a sensitizer material which is capable of performing photoinduced charge generation within the photovoltaic device, wherein the sensitizer material is a perovskite of the formula (I)

$$[A][B][X]_3 \qquad (I)$$

wherein:

[A] is at least one cation, comprising at least one organic cation of the formula $(H_2N\!\!=\!\!CH\!\!-\!\!NH_2)^+$;

[B] is at least one divalent metal cation, wherein [B] comprises $Pb^{2+}$; and

[X] is iodide, or [X] is two or more different halide anions, wherein one of said two or more different halide anions is iodide.

* * * * *